(12) United States Patent
Lee

(10) Patent No.: US 11,600,309 B2
(45) Date of Patent: Mar. 7, 2023

(54) 3D MEMORY WITH 3D SENSE AMPLIFIER

(71) Applicant: Sang-Yun Lee, Hillsboro, OR (US)

(72) Inventor: Sang-Yun Lee, Hillsboro, OR (US)

(73) Assignee: BESANG, INC., Hillsboro, OR (US)

( * ) Notice: Subject to any disclaimer, the term of this patent is extended or adjusted under 35 U.S.C. 154(b) by 0 days.

(21) Appl. No.: 17/122,173

(22) Filed: Dec. 15, 2020

(65) Prior Publication Data

US 2022/0189515 A1 Jun. 16, 2022

(51) Int. Cl.
*G11C 7/10* (2006.01)
*G11C 7/06* (2006.01)
*H01L 27/092* (2006.01)
*H01L 29/786* (2006.01)
*H01L 23/528* (2006.01)
*G11C 7/12* (2006.01)
*G11C 8/10* (2006.01)

(52) U.S. Cl.
CPC ............... *G11C 7/065* (2013.01); *G11C 7/12* (2013.01); *G11C 8/10* (2013.01); *H01L 23/528* (2013.01); *H01L 27/092* (2013.01); *H01L 29/78618* (2013.01); *H01L 29/78642* (2013.01); *G11C 2207/12* (2013.01)

(58) Field of Classification Search
CPC .. G11C 7/065; G11C 7/12; G11C 8/10; G11C 2207/12; H01L 23/528; H01L 27/092; H01L 29/78618; H01L 29/78642
USPC .................................................... 365/189.02
See application file for complete search history.

(56) References Cited

U.S. PATENT DOCUMENTS

| | | | | |
|---|---|---|---|---|
| 4,810,906 A * | 3/1989 | Shah | ...................... | H01L 27/092 257/334 |
| 5,612,563 A * | 3/1997 | Fitch | .................. | H01L 21/76897 257/E29.267 |
| 6,137,129 A | 10/2000 | Bertin | ...................... | H01L 27/11 257/302 |
| 6,194,765 B1 * | 2/2001 | Reisinger | ................ | H01L 27/11 257/334 |
| 6,297,531 B2 * | 10/2001 | Armacost | ....... | H01L 21/823885 257/334 |
| 7,332,780 B2 * | 2/2008 | Matsuda | .......... | H03K 19/00338 365/207 |
| 7,709,827 B2 * | 5/2010 | Graham | ................ | H01L 29/775 257/24 |
| 9,680,473 B1 * | 6/2017 | Anderson | ............. | H01L 23/528 |
| 9,876,015 B1 * | 1/2018 | Balakrishnan | .... | H01L 29/66545 |

(Continued)

*Primary Examiner* — Viet Q Nguyen
(74) *Attorney, Agent, or Firm* — Jeong Y. Choi

(57) ABSTRACT

Structures for 3D sense amplifiers for 3D memories are disclosed. A first embodiment uses one type of vertical transistors in constructing 3D sense amplifiers. A second embodiment uses both n- and p-type transistors for 3D sense amplifiers. Either or both of n- and p-type transistors are vertical transistors. The n- and p-type transistors may reside on different levels, or on the same level above a substrate if both are vertical transistors. In any embodiment, different options are available for gate contact formation. In any embodiments and options or alternatives thereof, one or more sense-enable circuits may be used. Sense amplifiers for several bit lines may be staggered on one or both sides of a memory array. Column multiplexers may be used to couple particular bit lines to data outputs. Bit-line multiplexers may be used to couple certain bit lines to shared 3D sense amplifiers.

154 Claims, 16 Drawing Sheets

(56) References Cited

U.S. PATENT DOCUMENTS

| | | | |
|---|---|---|---|
| 10,217,674 B1 * | 2/2019 | Hook | H01L 24/29 |
| 10,944,012 B2 * | 3/2021 | Reznicek | H01L 29/78642 |
| 11,094,819 B2 * | 8/2021 | Balakrishnan | H01L 21/823885 |
| 11,302,695 B2 * | 4/2022 | Peng | H01L 23/53295 |

* cited by examiner

3D MEMORY WITH 3D SENSE AMPLIFIER

TECHNICAL FIELD

The present disclosure relates generally to the technical field of a semiconductor memory device, more specifically structures for three-dimensional memory devices.

BACKGROUND

One of the driving forces of scaling down semiconductor manufacturing technology is the ever increasing demand for higher density memory devices. Technology scaling has indeed satisfied needs for high density memories of certain applications. However, certain other applications require extremely high density memories which technology scaling alone could not satisfy without resorting to multi-chip solutions. Three-dimensional (3D) memories, particularly those constructed with vertical transistors over an underlying memory control logic, has expanded the memory density that can be integrated on a single chip in efforts to address those certain other applications.

Vertical transistors used in virtually (if not completely) all 3D products are vertically oriented MOSFET's (metal-oxide-semiconductor field-effect transistors). For this reason, throughout the present disclosure, the terms "vertical transistor," "n-type vertical MOSFET," and "p-type vertical MOSFET" are used interchangeably with "vertical MOSFET," "vertical n-MOSFET," and "vertical p-MOSFET," respectively.

3D memory products, whether in the marketplace or under development, have so far employed vertical transistors in their memory cells and planar transistors in their memory control logic including sense amplifiers. Since vertical transistors are built over memory control logic, memory cells and sense amplifiers reside at different levels. In such arrangements, sense amplifiers can be optimally designed to minimize the effects of the manufacturing fluctuations on mismatch and thus to maximize the operating margin of the memory product. Usually mirror imaging of circuit elements used in designing sense amplifiers is avoided because misalignment during photolithography steps of certain critical layers would shift characteristics of mirror-imaged elements in opposite directions, frequently leading to failure of sense amplifiers.

In memory products, particularly in virtually all DRAM or flash products, the signal developed on a bit line by a memory cell during a read operation is a fraction of the voltage powering the memory cell. That signal, called bit-line swing, is often as low as or around 100 mV. That small signal must travel through a long 3D routing from a bit line down to a sense amplifier. Substantial loss of the small signal is inevitable along the path. The signal might even be lost in the middle of the long 3D routing. Mitigation or prevention of such undesirable consequences usually requires very large and complex 3D routing and sense amplifiers for each bit line, compared to those used in conventional memory products constructed only with planar transistors. Sense timing is a critical factor, because the small signal may be lost after a relatively long wait but the small signal may have not arrived before a relatively short wait. Due to a longer time required to travel a long 3D path, the timing window for sensing is much narrower in a memory of vertical transistors than that in a memory of planar transistors. The signal delay associated with the long 3D path, if the bit-line swing must reasonably develop at sense amplifiers before a successful sensing is guaranteed, entails an increase in the complexity of design and in chip size.

An alternative to the complexity and size of memory logic circuit in resolving such issues of signal loss and timing delay may be the design and construction of memory cells for a much larger bit-line swing so that even the arrival of a fraction of a fully developed bit-line swing can successfully excite the sense amplifier. This is particularly true for high performance and/or high throughput products. Such an alternative would, however, require much wider vertical transistors, and may severely undermine the very advantages of 3D memories built with vertical transistors. The logic circuitry on the substrate and the memory cells above the substrate may have to increase in size significantly.

SUMMARY

Structures of 3D sense amplifiers for 3D memories are disclosed. 3D sense amplifiers are placed at the same level as the vertical transistors used in 3D memory cells. This reduces the routing between the memory and sense amplifiers, and thereby improve the performance, reliability, and efficiency of the 3D memory. For the sake of simplification of several drawings, 3D inverters, which are basic building blocks for certain sense amplifiers, are used to illustrate the concept of constructing 3D sense amplifiers with vertical transistors.

Vertical transistors of the present disclosure are built from a semiconductor layer disposed on a conductive layer. The semiconductor layer may come from a donor wafer which is bonded to the substrate on which the conductive layer is disposed. A partial removal of the donor wafer substrate, usually through a process known as cleaving, leaves the thin semiconductor layer on the conductive layer. The semiconductor layer is patterned twice to form semiconductor pillars that constitute the bodies of vertical transistors. In a first step of patterning the semiconductor layer, the conductive layer is also patterned and transformed into conductor lines, most of which are bit lines and bit-line bars. Some of the conductor lines may be used as local interconnects.

A first embodiment uses one type of vertical transistors in constructing 3D sense amplifiers. Different options may be used for gate contact formation such as modified vertical transistors, extended gate regions, and gates merged between closely spaced vertical transistors. Gate contacts formed thereon may be shared between vertical transistors whose gates are coupled together. The sharing of gate contacts may be through merger of gates between closely spaced vertical transistors, whether a gate contact is placed on one side of or between the common-gate vertical transistors. Strapping contacts may be used with any option of gate contact formation. One circuitry need not use only one option of gate contact formation exclusively. But rather two or more options may be mixed in a chip.

In a 3D sense amplifier of the first embodiment comprising a pair of cross-coupled inverters, the gates of pull-up transistors may be coupled to a voltage higher than the drains of the pull-ups so as to overcome the effect of threshold voltage of the pull-ups and thereby to ensure a full-range swing of the sense amplifier outputs.

Routings for coupling various nodes of a 3D sense amplifier may be through a top metal above the 3D sense amplifier, interconnect metal lines below the 3D sense amplifier, or above-mentioned conductor lines. Vertical transistors may be arranged in different ways as long as the routings are properly configured to preserve the functionality of the 3D sense amplifier. Within one arrangement of vertical transistors, the roles of top and bottom doping regions of semiconductor pillars as sources and drains may be interchanged, provided routings are properly altered to maintain the same couplings between various nodes of the 3D sense amplifier.

In a second embodiment of the present disclosure, 3D sense amplifiers are based on CMOS (complementary MOS), i.e. comprise both n- and p-type transistors, either or both of which are vertical transistors. The n- and p-type transistors may reside on different levels, or on the same level above a substrate if both are vertical transistors. Planar transistors forming a part of a 3D CMOS sense amplifier may be built on the substrate or above vertical transistors of the 3D CMOS sense amplifier. When residing above vertical transistors, those planar transistors may be formed of polysilicon or amorphous silicon.

In any of the embodiments and options or alternatives thereof, one or more sense-enable circuits may be used. A sense-enable circuit may comprise a single vertical transistor whose gate voltage controls the enabling and disabling of the sense amplifier. Particularly for a 3D sense amplifier comprising only n-type vertical transistors, a sense-enable circuit comprising one n-type vertical transistor may be used between a local or system ground and a node that would be otherwise coupled to the ground. For a 3D CMOS sense amplifier, a p-type transistor may be used as a sense-enable circuit between a first node coupled to a power supply or regulator and a second node that would be otherwise coupled directly to the first node.

An equalizer may be used to force each pair of a bit line and a bit-line bar to the same voltage before pre-charging them to a desired level. This is particularly true for a memory (such as DRAM) that pre-charges bit lines (and bit-line bars). An equalizer may comprise a single transistor controlled by an equalize signal Sense amplifiers for several bit lines may be staggered on one or both sides of a memory array in bit-line direction. Column multiplexers may be used to select and couple sense amplifier outputs to data outputs. Each column multiplexer may comprise a single transistor controlled by a column select. For a memory which does not require refresh on read, bit-line multiplexers may be used to selectively connect bit lines to sense amplifiers shared among the bit lines serving as inputs to the bit-line multiplexers. For a double-ended memory, a pair of transistors, controlled by one bit-line select, may be used as a bit-line multiplexer to select and couple a particular pair of bit line and bit-line bar to inputs of a sense amplifier.

BRIEF DESCRIPTION OF THE DRAWINGS

Example embodiments are illustrated by way of example and not limitation in the figures of the accompanying drawings, in which like references indicate similar elements. Elements bearing no label or alphabetical labels should be understood as being referenced by the numerical labels for those at the same vertical positions with the same fill patterns. A numerical label may have a trailing alphabet, and an alphabetical label may have a trailing digit or subscript. When elements shown in the same fill patterns have different numerical labels with straight horizontal lead lines, their relative heights but not widths should be used to apply their labels to elements bearing no label or alphabetical labels. Labels with slanted or curved lead lines are associated with particular elements pointed to by those lead lines. This convention is used in the present disclosure in order to avoid overcrowding of drawings with repeated uses of the same labels for similar elements.

Figure 1A:
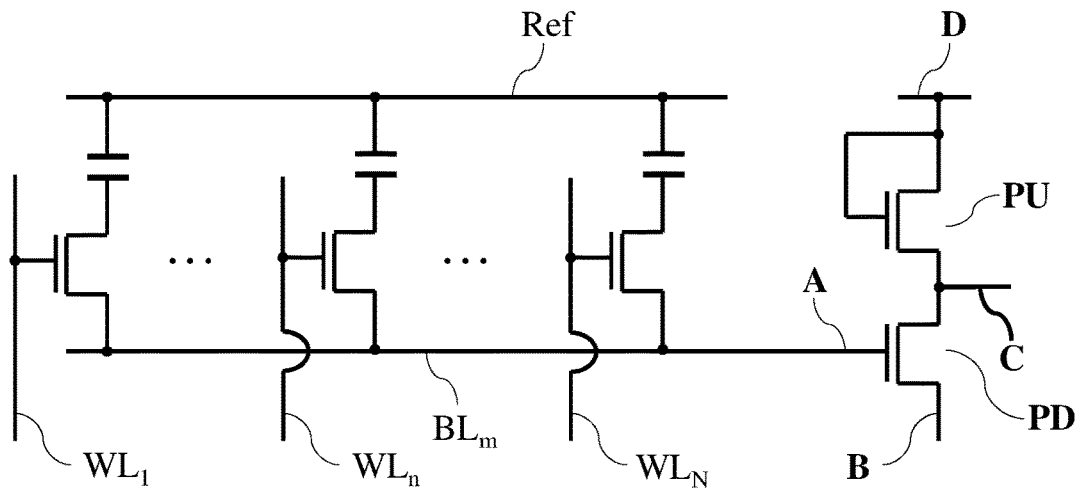
FIG. 1A is a circuit diagram representing an array of 3D DRAM cells along a bit line with a 3D inverter coupled to the bit line of the array, in which the 3D inverter is made with only one type of vertical transistors. Specifically in this illustration, it is an NMOS (n-type MOS) inverter made only with n-type vertical MOSFET's. Circuit diagrams in the present disclosure comprise vertical transistors, although not evident in the diagrams themselves.

The drawings referred to in this description should be understood as not being drawn to scale, except if specifically noted, in order to show more clearly the details of the present disclosure Like reference numbers in the drawings indicate like elements throughout the several views Like fill patterns in the drawings indicate like elements throughout the drawings, in the absence of like reference numbers. Other features and advantages of the present disclosure will be apparent from accompanying drawings and from the detailed description that follows.

DETAILED DESCRIPTION

Structures for novel 3D sense amplifiers for 3D memory are disclosed. This improves the performance and reliability of 3D memories. It will also increase cell efficiency and reduce die cost. In the following description, for the purposes of explanation, numerous specific details are set forth in order to provide a thorough understanding of the various embodiments and alternatives or options thereof. However, it will be evident that one skilled in the art may practice various embodiments within the scope of this disclosure without these specific details.

A first embodiment of the present disclosure is to construct 3D sense amplifiers with one type of transistors, which are vertical transistors. The routing between 3D memory cells and 3D sense amplifiers will be shortened, compared to the conventional construction of sense amplifiers with planar devices built on a substrate below a 3D memory. By placing the sense amplifiers at the same level as the memory cells themselves, the present disclosure would be advantageous in maintaining the integrity of the bit-line swing for stable and fast dynamic operations, as would be for planar memories with planar sense amplifiers.

Before jumping into a discussion of 3D sense amplifiers, we start with a 3D inverter to illustrate the construction of a circuit with vertical transistors. In FIG. 1A, a 3D inverter 100 comprising vertical MOSFET's is illustrated as connected to an array of 3D DRAM cells along a bit line $BL_m$. Each cell along that bit line is one of the cells along a word line $WL_n$. Lowercase subscripts such as "m" and "n" represent one arbitrary element in a series (1 through "M" and "N," respectively) and may be omitted in some other figures. Uppercase subscripts such as "M" and "N" represent the last element of, and the total number of elements in, a series. The subscript "N−1" designates an element second to last of the series. Although no sense amplifier in reality consists only of one inverter, this construction is used to facilitate, with the aid of less-crowded simpler drawings, the understanding of various structures that can be used to construct 3D sense amplifiers in conjunction with 3D memories.

Although all vertical transistors including those of the 3D memory cells and the 3D inverter are n-type in FIG. 1A, construction of 3D memory cells and 3D inverters or sense amplifiers entirely with vertical p-MOSFET's are possible, provided a proper modification of connections or couplings between circuit elements unique to the use of p-MOSFET's is made. Although DRAM cells are exclusively used in the illustrations of the present disclosure, the concepts and principles for constructing 3D sense amplifiers as illustrated in the present disclosure are applicable to other types of memory such as SRAM (static random access memory) and flash.

As in an inverter built with planar transistors, a 3D inverter consists of a pull-down transistor ("PD") and a pull-up transistor ("PU"), with the gate of PD serving as the inverter input (node "A") and with the point of connection between PD drain and PU source serving as the inverter output (node "C"). The PD source is coupled to a first common node (node "B"), which is in turn coupled to a local or system ground or to a regulator output. The PU drain is coupled to a second common node (node "D"), which is in turn coupled to a power supply voltage or to another regulator output. In some cases, the first common node and/or the second common node may be switched "on" or "off" by an enable circuit. Node "Ref" in FIG. 1A is where "external" electrodes of all memory cell capacitors belonging to a memory block or module are coupled to. The other electrode, often called "internal" electrode, of the cell capacitor in a DRAM cell is coupled to one of the transistor terminals and forms a "storage" node of the cell.

Figure 1B:
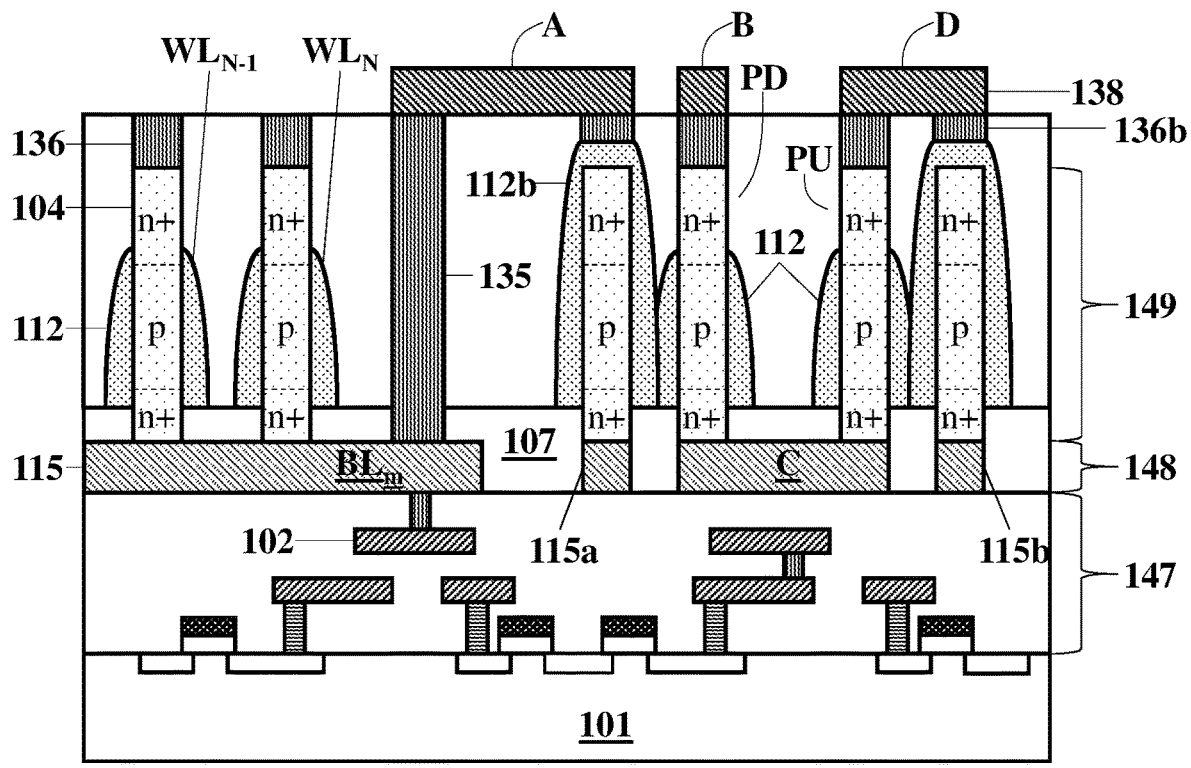
FIG. 1B is a cross-sectional view illustrating how the 3D inverter of FIG. 1A may be constructed with vertical transistors. It uses a first option of forming gate contacts for vertical transistors. For all cross-sectional drawings in the present disclosure, the gate dielectric of vertical MOSFET is not shown, though present, for simplicity.

FIG. 1B is a cross-sectional view of structure 100 illustrating a 3D construction of the 3D circuit shown in FIG. 1A. It shows only the cells of last two word lines on one bit line along with a 3D inverter. Planar transistors and interconnects therefor (in region 147 in FIG. 1B) residing on substrate 101 below the vertical transistors are meaningful only to the extent of demonstrating the 3D nature of the present disclosure. Otherwise, the specific details of such planar transistors and interconnects therefor will vary significantly for different types of applications or designs. In the present disclosure, different sets of planar transistors and interconnects therefor are used in various illustrations to imply the diversity of 3D nature of the present disclosure.

Unlike a memory built with planar transistors, vertical transistors used to build a 3D memory in the present disclosure rest on conductor lines 115 which serve as local bit lines for the 3D memory and as local interconnects for other 3D elements such as 3D sense amplifiers. We have described structures and methods for such vertical transistors in U.S. Pat. No. 17,084,420 "Novel Three-Dimensional DRAM Structures," which is incorporated herein by reference in its entirety. Region 148 in FIG. 1B is usually a conductive layer (not shown) disposed on the structure of region 147. A semiconductor layer (not shown) of region 149 is then disposed. The semiconductor layer may be a layer of polysilicon, amorphous silicon, or single crystalline disposed on the conductive layer. Or, a donor wafer which contributes the semiconductor layer may be bonded blindly. After bonding, the donor wafer is partly removed, usually either by polishing or by a process known as cleaving, to leave the semiconductor layer in region 149. Semiconductor pillars 104 are formed out of the semiconductor layer. The label "104" in this and other cross-sectional views points to the tall pillar consisting of three doped regions rather than one doped region or its doping designation which the label's lead line appears to be pointing to. Conductor lines 115 (including 115a and 115b) are formed out of the above-mentioned conductive layer during the patterning of the semiconductor layer in a first step of forming the semiconductor pillars. Conductor lines 115 serve as bit lines (such as $BL_m$) and as local interconnects (such as for node C).

The semiconductor pillars may be doped in situ during disposition or prior to bonding but may be doped after forming the semiconductor pillars. In FIG. 1B and other cross-sectional views of the present disclosure, the doping of the semiconductor pillars for memory cells and pull-down transistors is for vertical n-MOSFET's (as indicated by "n+" for top and bottom regions and by "p" for channel regions). The boundaries for the channel region with respect to top and bottom regions within each semiconductor pillar are indicated by horizontal dashed lines. Top regions function as drain for some transistors with bottom regions functioning as source. For some other transistors, top regions would function as source with bottom regions functioning as drain. For instance, in FIG. 1B, for PD, the top region is its source and the bottom region is its drain, while for PU, the top region is its drain and the bottom region is its source. However, the respective roles of top and bottom regions of PD and/or PU may reverse with proper changes on underlying interconnect 102, conductor lines 115, and top metal 138.

Subsequent to forming the semiconductor pillars, dielectric layer 107 and a gate dielectric (not shown though present) are disposed, usually in that order. Then, gates 112 and 112b are formed. The label "112" points to all gates including those referred to as "$WL_{N-1}$" and "$WL_N$" for word lines. In the particular instance of FIG. 1B, gates 112b of "modified" vertical transistors are used to serve as landing pads during the formation of gate contacts 136b. The label "112b" refers to gates of both modified vertical transistors placed next to the pull-down and pull-up transistors. Structures of gate contact formation are described in Ser. No. 17/083,026 "Structures of Gate Contact Formation for Vertical Transistors," which is incorporated herein by reference in its entirety. A mask (not shown) is used to protect gate 112b of modified vertical transistors while patterning gate 112 with an anisotropic etch. As described later in the present disclosure, other structures of gate contact formation that were disclosed in Ser. No. 17/083,026 may also be used in place of modified vertical transistors.

Each of conductor pieces 115a and 115b under the modified vertical transistors may be floating without connection to any other node or joined to, i.e. not patterned separately of, one of adjacent conductor lines 115 because the gate dielectric (not shown) will isolate gate contacts 136b from the semiconductor pillars of the modified vertical transistors. For example, conductor piece 115b under the modified vertical transistor associated with PU may extend from local connect for node C. Conductor piece 115a under the modified vertical transistor whose gate 112b is merged with that of PD in FIG. 1B may be an extension of either node C or bit line $BL_m$ but not both. However, it is best to leave conductor pieces 115a and 115b floating, as in FIG. 1B (and in other cross-sectional views of the present disclosure), so as to not subject the gate dielectric of modified vertical transistors to any electrical stress during operation.

Before continuing the description of FIG. 1B, we explain a labeling convention in the present disclosure, which is used to minimize overcrowding of drawings. Straight horizontal lead lines are used to refer with the same labels to elements of like fill patterns, like heights, and like vertical positions. For example, the label "112" whose horizontal lead line leads to the gate (also a word line $WL_{N-1}$) of a memory cell should be understood to refer to the gates of vertical transistors PD and PU, even in the absence of the second label "112" and its slanted lead lines placed between the two transistors. Likewise, the label "136" refers to the contacts for the top regions of vertical transistors used as PD, PU, and cell transistors. In contrast, slanted or curved lead lines or underlined labels are used to uniquely identify only the elements touched by the lead lines or embedding the underlined labels. For example, labels A, B, and D refer to the corresponding nodes of FIG. 1A, although they are parts of the same top metal in FIG. 1B that bears one label "138" on the right side of the element which is also referred to by label D. Slanted or curved lines leading from multiple-used alphabetical labels are also used to indicate coupling between elements of the same labels at different vertical and/or horizontal positions. Such a use appears first in FIG. 2B.

Top contacts 136 for semiconductor pillars may be formed simultaneously with gate contacts 136b. Bit-line contacts 135 may also be formed simultaneously with top contacts 136 and gate contacts 136b, provided the etch selectivity of contact etch is sufficiently good against gates 112b and top regions of semiconductor pillars. When erosion of the gates and semiconductor pillars during the simultaneous contact etch is concerning, bit-line contacts may be formed separately of gate contacts and top contacts, although all of them may be filled with a conducting material at the same time. Incidentally, FIG. 1B illustrates a potential use of at least one underlying interconnect layer (such as interconnect 102 formed in region 147) for the benefit of the 3D memory. Such use will be made later in the present disclosure. Not shown in FIGS. 1B and 1n other figures of the present disclosure are top metal 138 coupling cell transistors to cell capacitors for the formation of 3D DRAM cells. Nodes in FIG. 1B and other figures that are unconnected in the cross-sectional views are in fact coupled to nodes of the same designations, in other vertical planes, either front or back of the vertical plane of the cross section.

As disclosed in Ser. No. 17/083,026, vertical transistors that are closely spaced (such as at the minimum feature size of the technology) have their gates merged between immediate neighbors when a gate material is disposed, and remain merged after the gate material is subject to anisotropic etch. The spacing between immediate neighbors along word-line direction in an array of 3D memory cells is sufficiently narrow such that the merger of gates along word-line direction leads to the formation of word lines by the gate. However, the spacing between vertical transistors along bit-line direction is sufficiently wide such that the transistors are separated at their gates along bit-line direction. Thus, gates 112 form word lines, e.g. $WL_{N-1}$ and $WL_N$, in the direction perpendicular to the plane of cross section in FIG. 1B.

There are issues with the circuit of FIG. 1A related to the construction of the circuit with only one type of transistors. Virtually (if not entirely) all 3D memory products use n-channel vertical MOSFET's. If sense amplifiers are constructed only with n-MOSFET's or only with p-MOSFET's, the current through the sense amplifier, particularly during the sensing of logical 1 (one) or logical 0 (zero), would be high and so would the active power consumption. Logical 1 and logical 0 as used herein correspond to distinctively high and low voltages, respectively.

There are additional problems if sense amplifiers are hypothetically made of one inverter. As apparent to one skilled in the art, the inverter output may not develop sufficient voltages for a subsequent amplifier stage to respond or amplify properly. Because of a small bit-line swing which may be as small as 0.1V, the input voltage of the inverter is only slightly different from the threshold voltage of pull-down transistor PD at or near which the bit line is most likely pre-charged. The output voltage at node C may not be much different from the threshold voltage of transistors employed in the subsequent amplifier stage. Another problem inherent with a sense amplifier consisting of one inverter, which is fatal to a DRAM or other memory requiring refresh on read, is the inability to couple the output to the bit line for the purpose of restoring the charges during a read operation due to charge sharing between a capacitor cell and the bit line. As noted above, a 3D inverter is used only to illustrate the use of vertical transistors in building a 3D sense amplifier. There is no other purpose in using an inverter in the present disclosure.

Figure 1C:
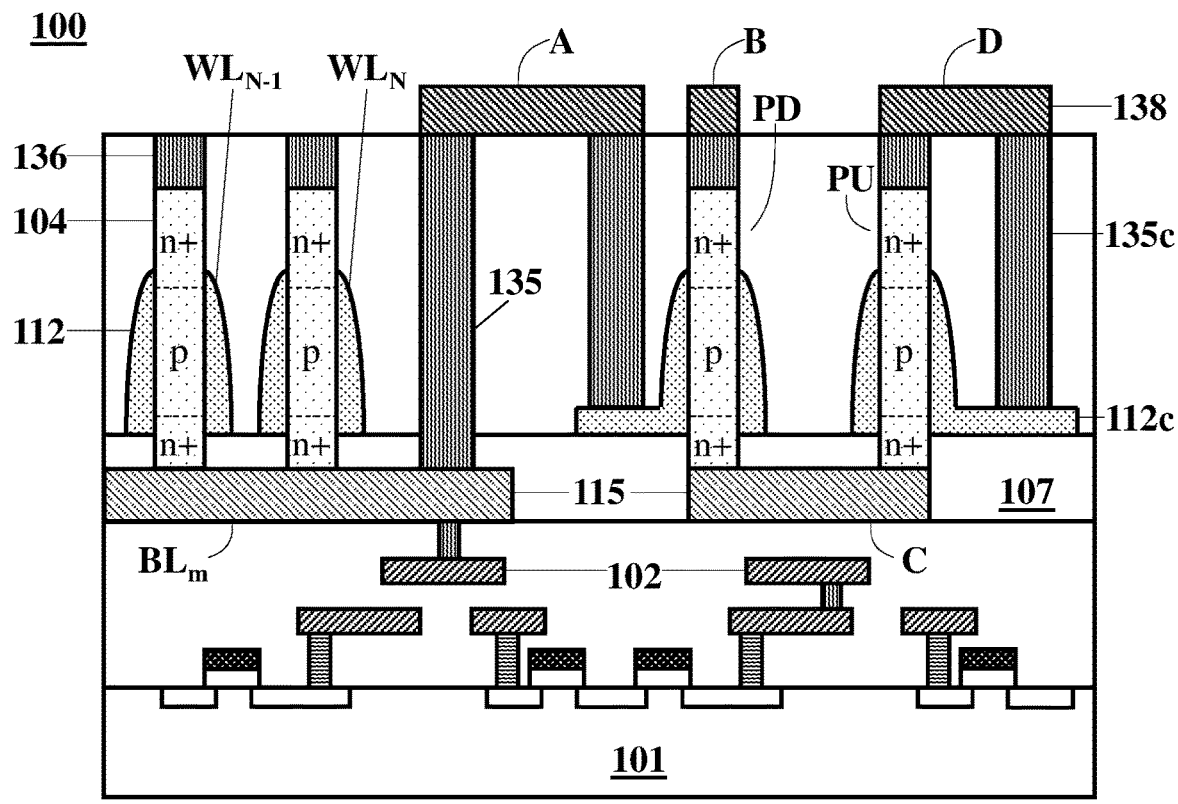
FIG. 1C illustrates a second option of forming gate contacts for vertical transistors used for the 3D inverter in FIG. 1A.

We now describe use of other options of gate contact formation for vertical MOSFET's. FIG. 1C illustrates a second option that uses an extended gate region that is patterned at a bottom edge of, and is continuous with, the gate of a vertical transistor. Extended gate regions 112c are formed next to the gates of pull-down and pull-up transistors, and gate contacts 135c are formed on the extended gate regions. The extended gate region for pull-down transistor is coupled to the bit-line of interest, while that for pull-up is connected to the top region (i.e. "drain") of pull-up, in accordance with the circuit diagram of FIG. 1A.

Figure 1D:
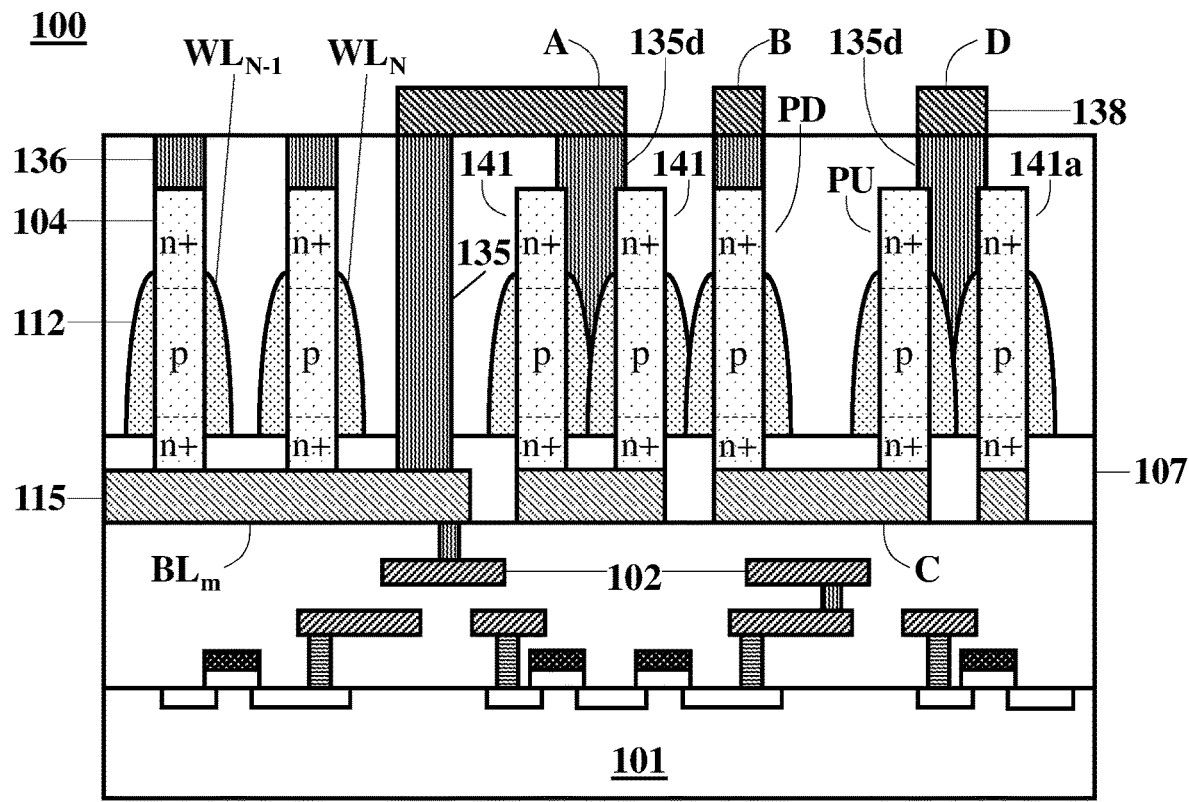
FIG. 1D illustrates a third option of forming gate contacts for vertical transistors used for the 3D inverter in FIG. 1A.

As described in Ser. No. 17/083,026, a third option of facilitating formation of gate contacts for vertical transistors is the use of gate merged between a pair of (sacrificial) vertical transistors. Such pair of sacrificial vertical transistors are placed closely next to the vertical transistor whose gate needs a connection to certain other nodes. In FIG. 1D, a use of the third option is illustrated. A pair of sacrificial vertical transistors 141 are placed closely on a side of pull-down transistor while only one sacrificial vertical transistor 141a is added to a side of pull-up. The merger of gates in spaces between immediate neighbors provides a good place to form gate contacts 135d. Without an etch-stop layer surrounding top regions of semiconductor pillars, the gate of the pull-up is shorted to its drain, which is needed as shown in FIG. 1A.

A comparison of FIG. 1D against FIG. 1B or FIG. 1C would indicate that the use of merged gates for gate contact formation would increase the chip size of a 3D sense amplifier over the use of modified vertical transistors or extended gate regions. However, the use of sacrificial vertical transistors saves a gate mask (not shown) that is required in the other options to form modified vertical transistors or extended gate regions. Moreover, the process of patterning a mask for modified vertical transistors or extended gate regions would likely involve additional process steps for prior planarization to overcome the topography created by semiconductor pillars which are very tall. The overall cost per chip can be lower with the use of merged gates than with the use of modified vertical transistors or extended gate regions.

Although only one type of gate contact formation is used for all vertical transistors in an illustration, different types may be used for different transistors in the same circuit. For example, one may opt to use extended gate region for pull-down and modified vertical transistor for pull-up, and vice versa. One such mixed use is illustrated later in FIG. 3G. Mixed uses of different types of gate contact formation in the same chip may however entail additional process steps, especially when extended gate regions or modified vertical transistors are used in addition to merged gates between sacrificial vertical transistors.

Figure 1E:
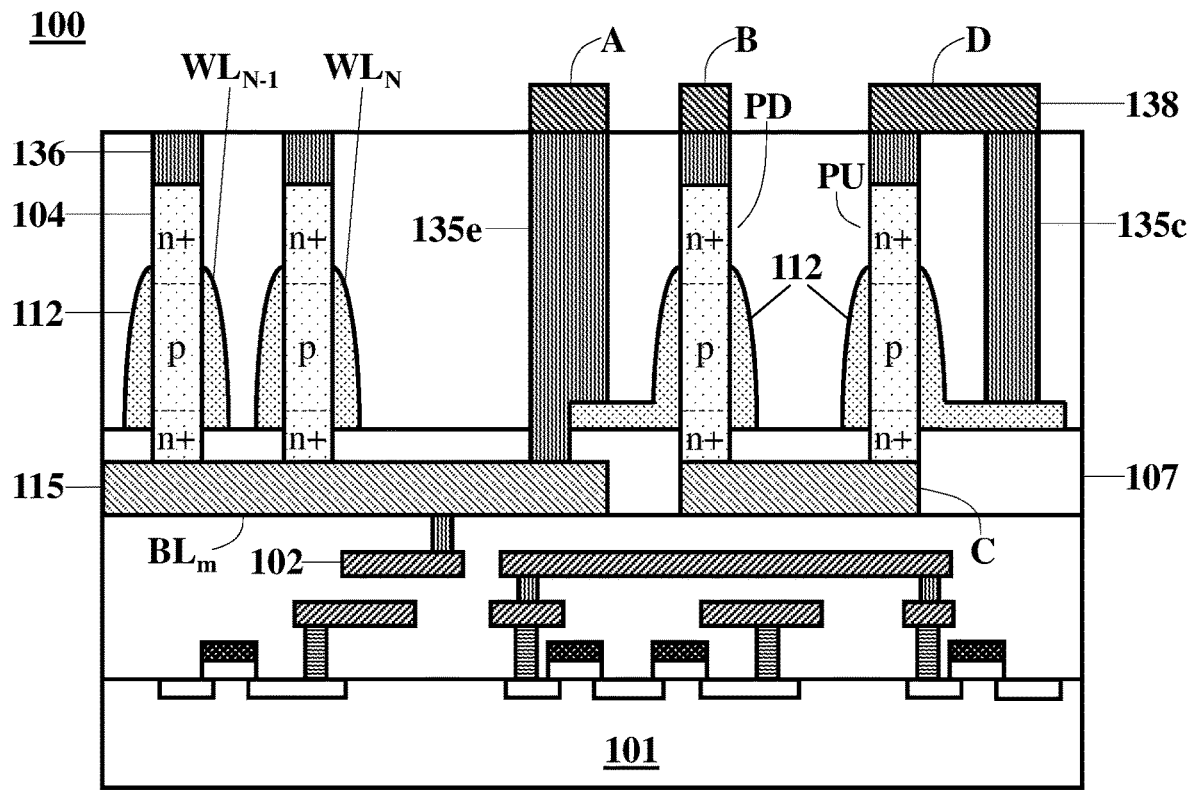
FIG. 1E illustrates a use of strapping contacts for the second option shown in FIG. 1C.
Figure 1F:
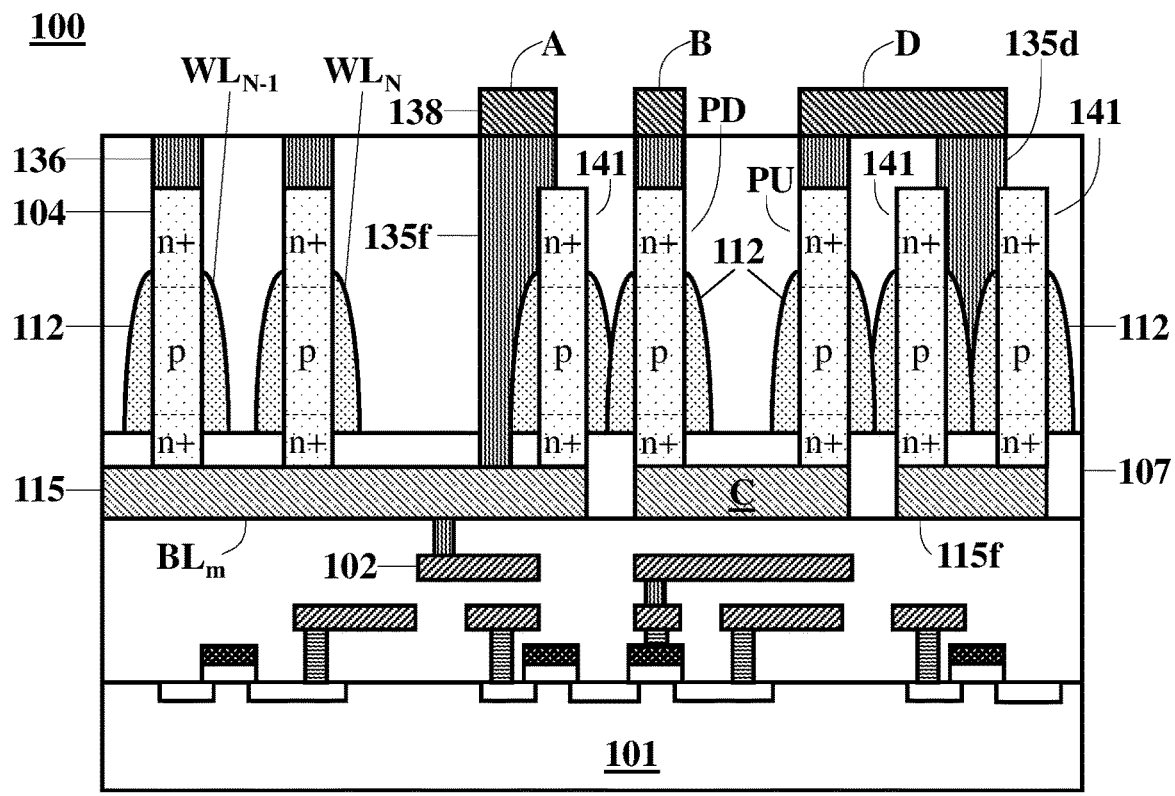
FIG. 1F illustrates a use of strapping contacts for the third option shown in FIG. 1D.

FIG. 1E and FIG. 1F are variations of FIG. 1C and FIG. 1D, respectively. In these figures, strapping contacts are used to connect gates to bit lines. In FIG. 1E, one strapping contact 135e connects the gate of pull-down to the bit line. There is no change from FIG. 1C for the connection between the gate of the pull-up to its top region (although a strapping contact may also be used for that connection), thus illustrating a mixed use of strapping contacts and ordinary contacts.

In FIG. 1F, a strapping contact 135f connects the bit line to the gate of pull-down via the gate of a sacrificial vertical transistor 141 merged with that of pull-down. There is an additional sacrificial vertical transistor for pull-up, added for the purpose of illustrating a conservatively safe approach. This is one way to address a potential concern that can be raised when contacts 135d and 135f are patterned simultaneously. Contact 135d, if unchanged from that in FIG. 1D, might be shorted to conductor piece C at a place in front or back of the plane of cross section when contact 135f in FIG. 1F or 135 in FIG. 1D reaches conductor piece $BL_m$. With the additional sacrificial vertical transistor for pull-up as in FIG. 1F, even if contact 135d touches conductor pieces 115f, there is no harm to the functioning of the circuit because conductor piece 115f is floating. Another way of addressing the above-mentioned concern is to pattern contacts 135f and 135d separately.

Note that a strapping contact may replace not only two contacts but also one of the sacrificial vertical transistors. Although FIGS. 1E-F leave empty the space that was occupied by one extra contact and one extra sacrificial vertical transistors, that extra space may be eliminated or narrowed to achieve a smaller chip size. Although use of strapping contacts is illustrated only for the cases of extended gate regions (FIG. 1E) and sacrificial vertical transistors (FIG. 1F), the same scheme may be applied in the case of modified vertical transistors, in which case, the structure resembles FIG. 1F (for the pull-down) except that the gates of sacrificial vertical transistors extend upward to cover top regions of the vertical transistors as in FIG. 1B.

Having illustrated circuit construction with vertical transistors, we now turn to examples of 3D sense amplifiers for use with 3D memories. Only a few simple sense amplifiers are used as examples in the present disclosure to demonstrate the concept of 3D construction thereof. One skilled in the art would readily recognize that other types and designs of sense amplifiers which are not illustrated in the present disclosure can be used with 3D memories. Such other types and designs of sense amplifiers are deemed to lie within the scope and principles of the present disclosure.

Figure 2A:
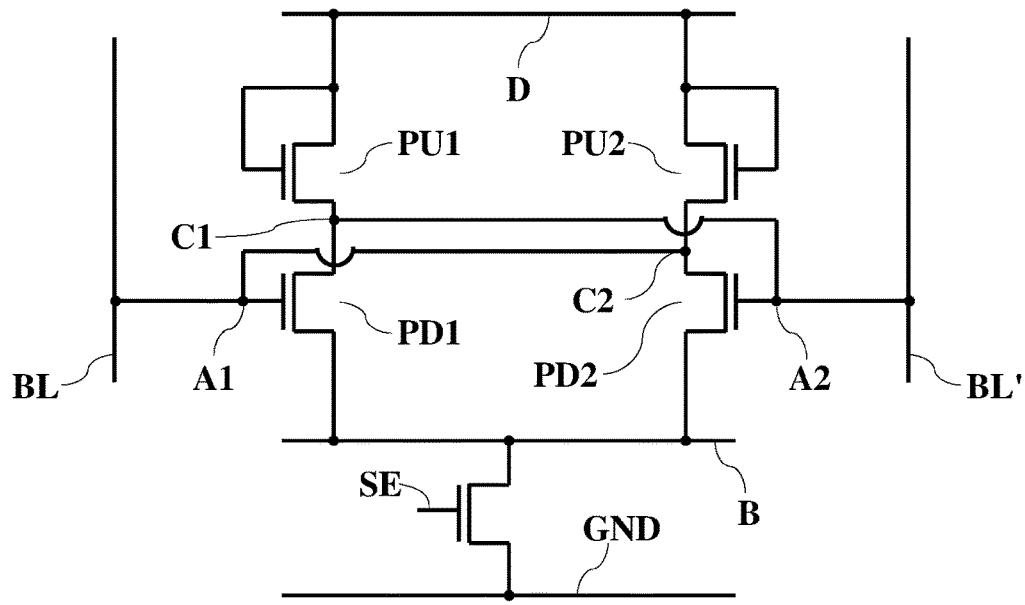
FIG. 2A is a circuit diagram of a 3D sense amplifier that can be used in 3D memory products. The sense amplifier shown in this diagram is essentially two cross-coupled 3D inverters shown in FIG. 1A plus an optional sense-enable circuit

In FIG. 2A, a 3D sense amplifier 200 is illustrated with a pair of cross-coupled inverters. An optional sense-enable circuit is included to demonstrate a way of lowering power consumption by the 3D sense amplifier. The sense-enable circuit in the example at hand consists of one vertical MOSFET with its gate (input) coupled to a sense-enable signal SE, its source coupled to a local or system ground GND, and its drain (output) coupled to a first common node (node B) of the sense amplifier. Unlike the placement of the sense-enable circuit in FIG. 2A, a sense-enable circuit may optionally be placed between node D and a power supply voltage rather than or in addition to between node B and a ground. There are numerous ways of designing and placing a sense-enable circuit for the same purpose. Various designs and placements of a sense-enable circuit and 3D construction thereof with vertical transistors, although not specifically illustrated in the present disclosure, are considered to be within the scope of the present disclosure.

Although double-ended sense amplifiers are shown in FIG. 2A and other figures of the present disclosure, single-ended sense amplifiers may be used, especially for memory cells comprising one transistor in each cell such as in DRAM or flash. Various single-ended sense amplifiers comprising vertical transistors are considered to fall within the scope of the present disclosure. A double-ended sense amplifier such as those illustrated in the present disclosure may be used for DRAM or flash with one input coupled to a bit line and the other coupled to a dummy bit-line bar. A dummy bit-line bar is coupled to either no cell or none of selected cells, but may be pre-charged to the same voltage as bit line at the beginning of a read operation.

The first inverter in FIG. 2A consisting of a pull-down PD1 and a pull-up PU1 has an input A1 coupled to a bit line BL. The second inverter consists likewise of a pull-down PD2 and a pull-up PU2 with an input A2 coupled to a bit-line bar BL'. Bit-line bar BL' may be a logical complement of bit line BL or may be a dummy line. A single apostrophe is used to mean "bar" or logical complement in the present disclosure. Both BL and BL' may be pre-charged to a bit-line pre-charge level during an initial phase of a read or refresh operation. Input A1 of the first inverter is coupled to an output C2 of the second inverter, and input A2 of the second is coupled to an output C1 of the first. Ordinarily, second inverter's output C2 is coupled also to a data line, usually through a mux, of the memory block to which the sense amplifier belongs, while first inverter's output C1 is coupled to a data-bar line.

Figure 2B:
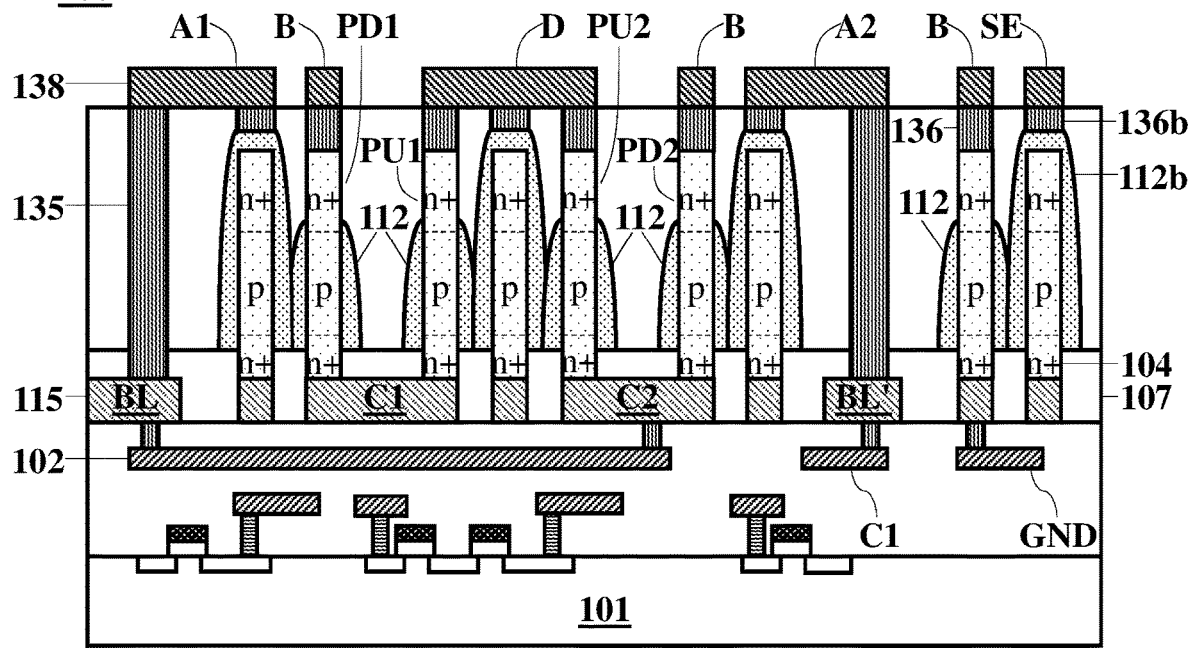
FIG. 2B is a cross-sectional view illustrating how the 3D sense amplifier shown in FIG. 2A may be constructed with vertical transistors.

The inverters in FIG. 2A are arranged and oriented so as to enable a quick association with FIG. 2B, which illustrates a cross-sectional view of the 3D sense amplifier constructed with vertical transistors. In this cross-sectional view, the pair of transistors PD1 and PU1 are placed next to and on the right of bit line BL, and the other pair of transistors PD2 and PU2 are placed next to and on the left of bit-line bar BL', in the same arrangement as in FIG. 2A. The sense-enable circuit with input at node SE and output at node B is shown at the far right. Modified vertical transistors with gates 112b are used for the formation of gate contacts 136b. The coupling between nodes A1 and C2 is made through a top metal 138 lying over the vertical transistors, a conductor line 115 (an extension of BL), and an interconnect line 102 lying under the vertical transistors. Likewise, the coupling between node C1 (underlined within a piece of conductor line 115) and bit-line bar BL' is made through a piece of interconnect 102 (labeled with C1 and a curved lead line), the routing of which continues to the bottom regions of PD1 and PU1 on a plane either behind or in front of the plane of cross section. Node B for the first common nodes for PD1 and PD2 as well as for the sense-enable output are connected with a top metal 138 routed on a different plane than that of cross section. The contacts reaching the top regions for PD1, PD2, and sense-enable circuit lie actually in the planes in which various pieces of metal line 138 are routed to complete the required connections.

Figure 2C:
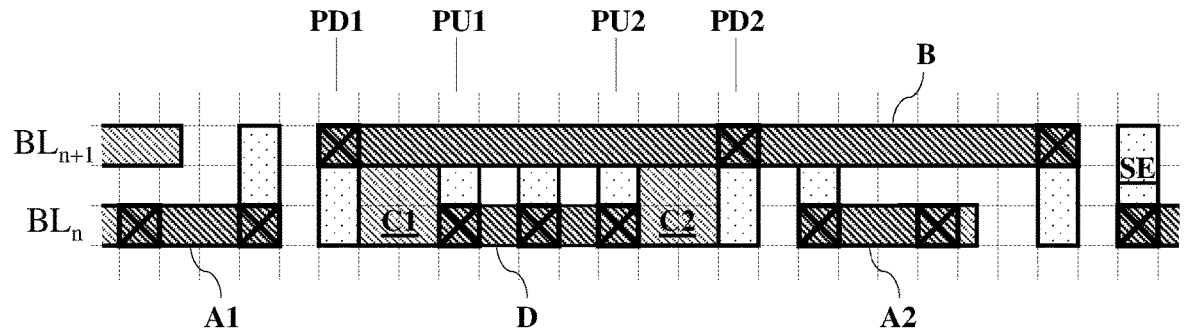
FIG. 2C illustrates how the 3D sense amplifier shown in FIG. 2A may be laid out. This composite layout is shown only with certain key layers (whether actual or hypothetical).
Figure 2D:
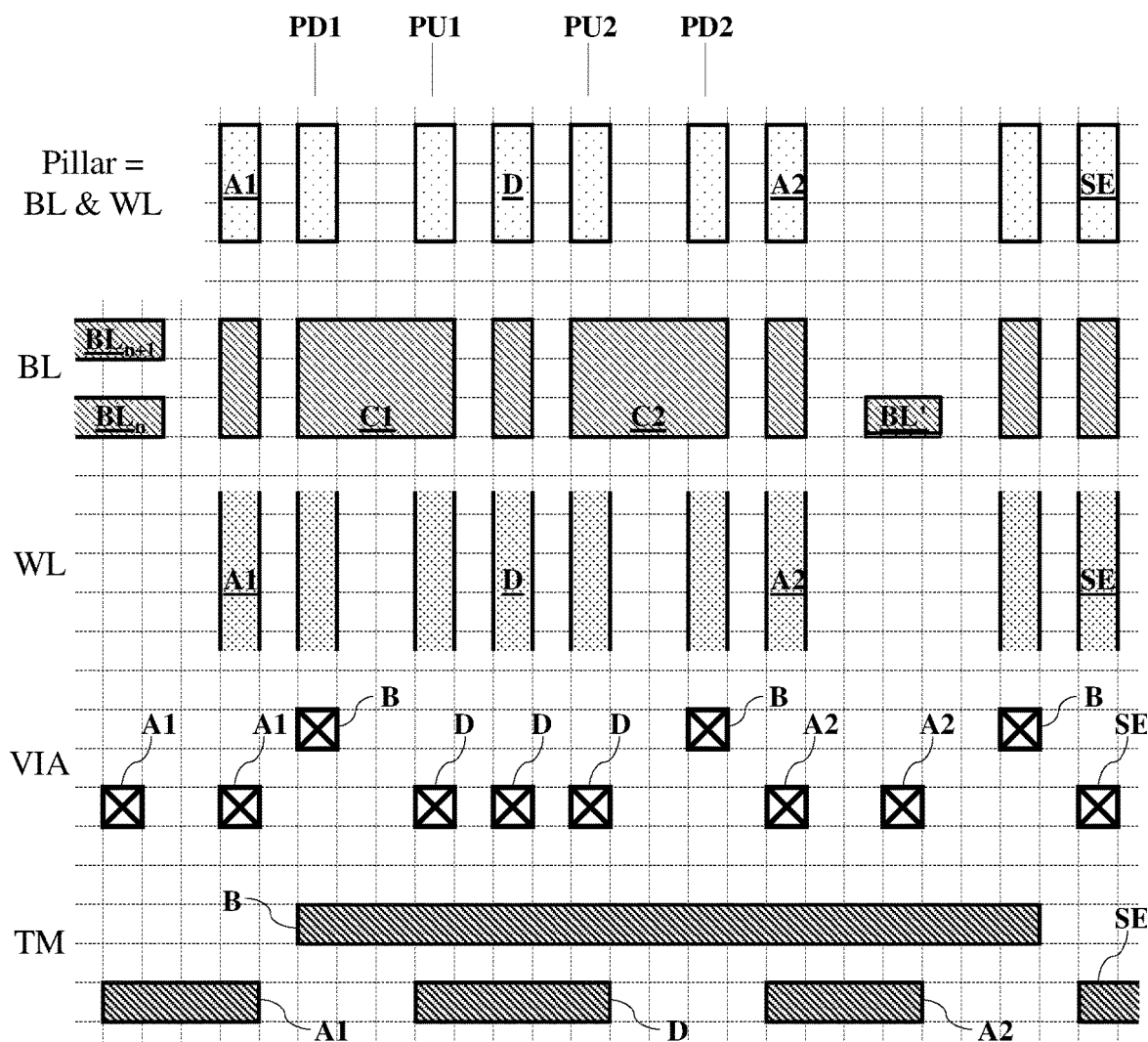
FIG. 2D shows a layer-by-layer drawing of the composite layout shown in FIG. 2C.

FIG. 2C is a simplified layout view of the 3D sense amplifier whose cross section is shown in FIG. 2B. FIG. 2D is a layer-by-layer view for the layers used in FIG. 2C, and clearly shows how layers look like while the composite layout of FIG. 2C may create some illusion as to their shapes when obscured by overlying layers. Layers hidden in the layout views include interconnect 102 and a mask for forming modified vertical transistors with gates 112b. Labels with straight vertical lead lines in FIG. 2C and FIG. 2D, e.g. those descending from "PD1" and the like, refer to elements of different materials that are related to particular transistors. For example, the label PD1 with a straight vertical lead line in FIG. 2D refers along a vertical extension of the lead line to layers for Pillar, BL, WL, VIA, and TM that are associated with or belong to pull-down transistor PD1 of FIG. 2A.

"Pillar" layer in FIG. 2D which is for semiconductor pillars 104 in FIG. 2B is not a drawn layer. Nor is it used to make an actual mask, but included to show pillar shapes on a hypothetical mask and that semiconductor pillars are formed by intersection of two layers: bit-line layer BL and word-line layer WL. Due to the effects of photolithography and etching in the state-of-the-art technologies, semiconductor pillars take a circular or rounded shape in top view upon patterning when the intersection of BL and WL layers yields squares. A mask generated from bit-line layer BL is not only used to partly pattern semiconductor pillars but also to form local interconnects. The latter is accomplished when BL is not intersected with WL. Word-line layer WL is not used to form extended gate regions 112b but rather to complete the formation of semiconductor pillars that are incompletely patterned with a mask generated only from bit-line layer BL. Note that in the composite layout view of FIG. 2C, word-line layer WL is excluded in favor of pillar layer.

Layer VIA is used for contacts 135, 136, and 136b. In some technology, contacts 135 may be formed with a separate mask than contacts 136 and 136b. Top-metal layer TM (for 138 in cross-sectional views) is used to make various connections in conjunction with bit-line layer BL (115 in cross sections) and/or an interconnect (102 in cross sections) lying under the vertical transistors. Underlying interconnect 102 and the contacts (not labeled) between it and BL shown in FIG. 2B are not listed in FIG. 2D, though present and used for coupling certain nodes of 3D sense amplifiers.

Figure 2E:
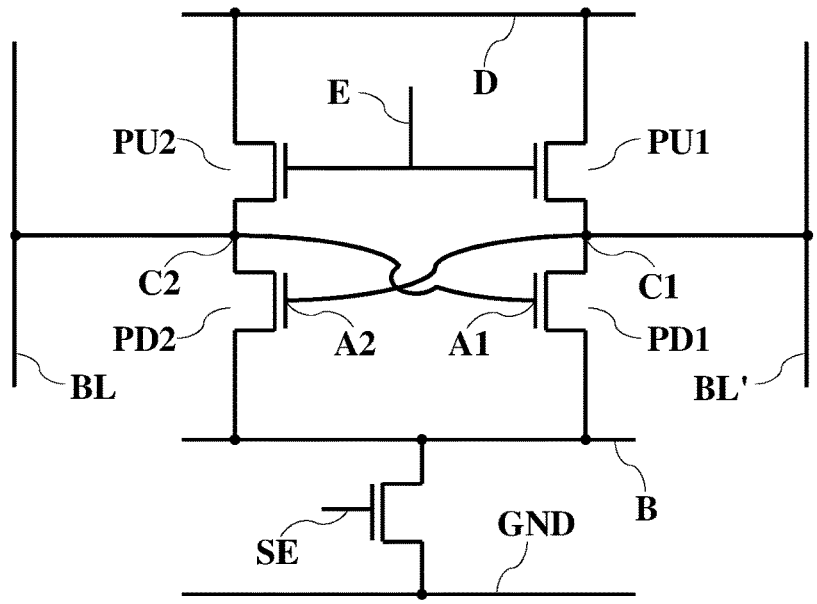
FIG. 2E is a circuit diagram with an alternative arrangement of transistors for the same 3D sense amplifier shown in FIG. 2A.
Figure 2F:
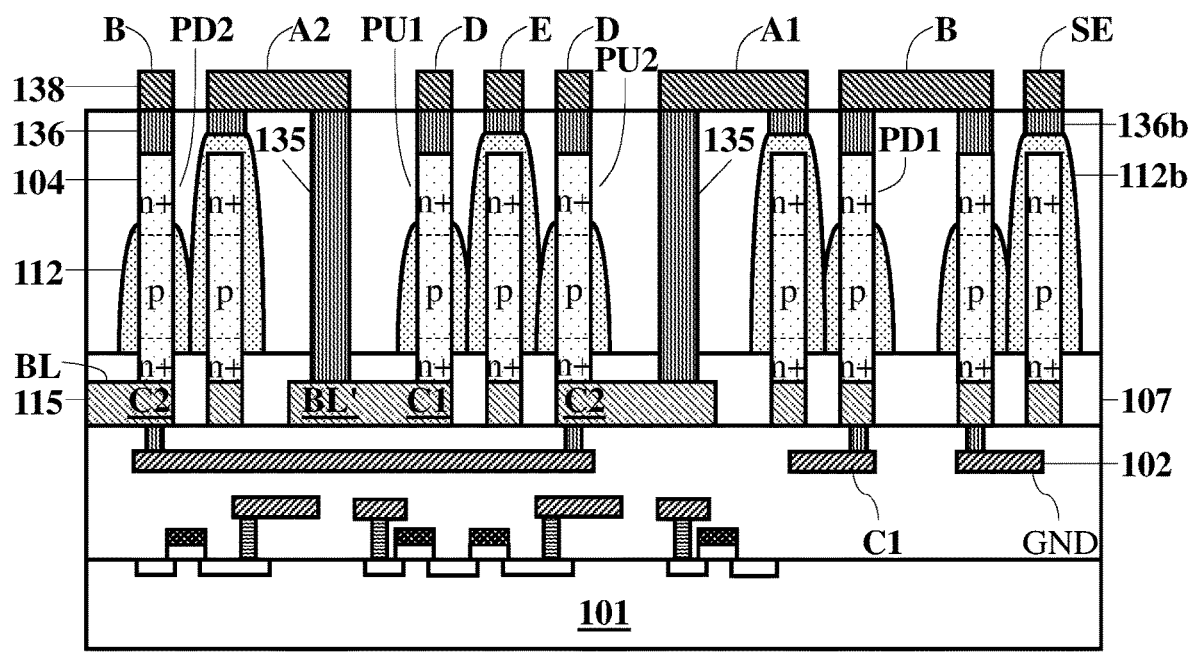
FIG. 2F illustrates an alternative arrangement of vertical transistors in accordance with FIG. 2E for the same 3D sense amplifier shown in FIG. 2B. The first option of gate contact formation is used.

FIG. 2E is a circuit diagram for a 3D sense amplifier 200A similar to that shown in FIG. 2A but with the inverters arranged and oriented differently and a cross-sectional view is shown in FIG. 2F. In fact, FIG. 2E and FIG. 2A are identical except the gates of pull-ups are coupled to a third common node (node "E") rather than the second common node (node D) to which the drains of pull-ups are coupled. Node E may be coupled to a voltage higher than node D by at least the threshold voltage of the pull-up in order to ensure a full-range swing of the sense-amplifier (i.e. between GND and node D voltage). The circuit diagram in FIG. 2E appears to have the first and second inverters of FIG. 2A swapped but the connections among various nodes are identical in the two diagrams if nodes D and E are coupled to the same voltage. FIG. 2F likewise has the vertical transistors of FIG. 2B shuffled around but couplings are kept intact with different routings of top metal 138, conductor lines 115, and underlying interconnect 102.

Figure 2G:
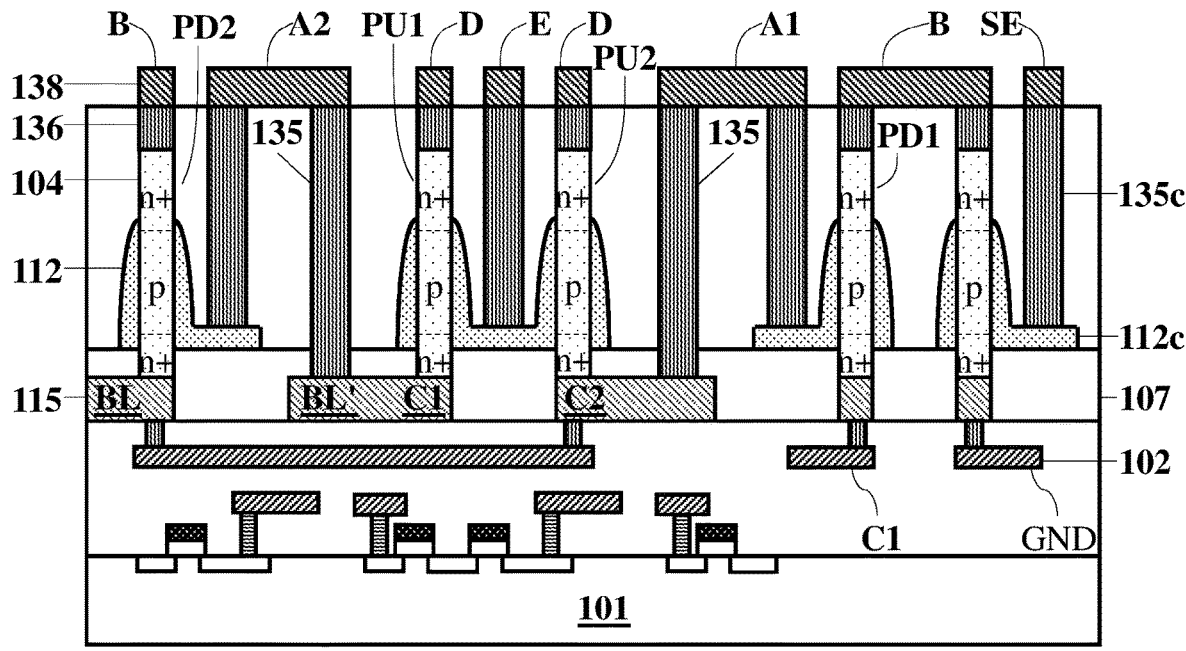
FIG. 2G illustrates a use of the second option of gate contact formation for constructing the 3D sense amplifier shown in FIG. 2E.
Figure 2H:
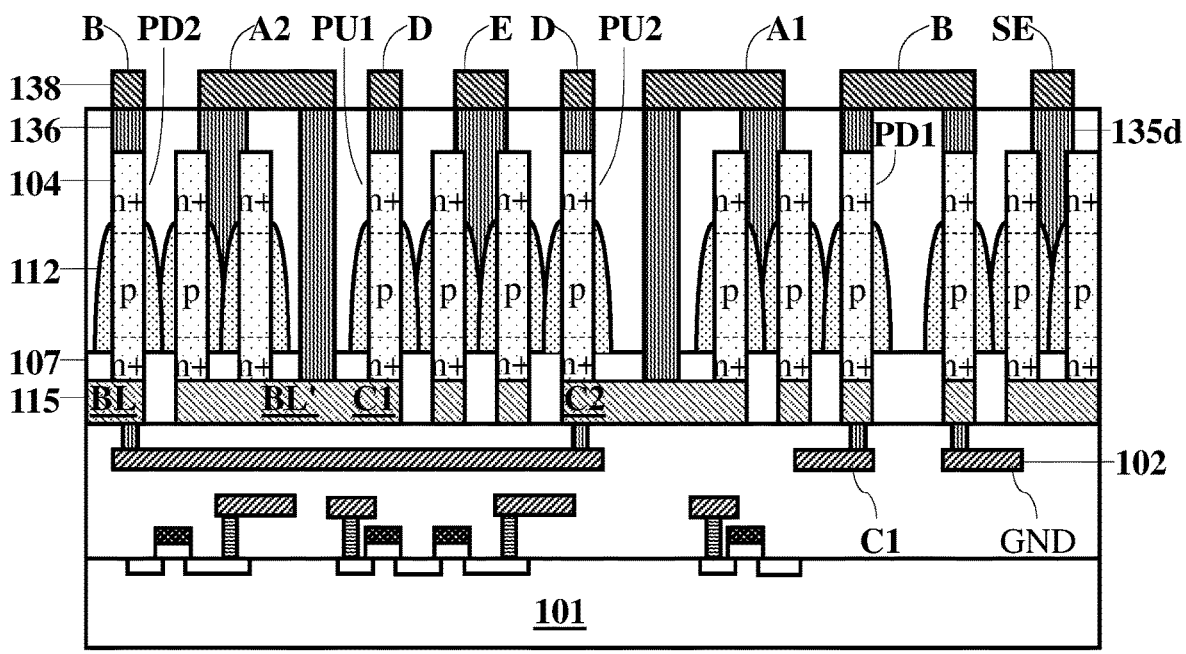
FIG. 2H illustrates a use of the third option of gate contact formation for constructing the 3D sense amplifier shown in FIG. 2E.

The structure shown in FIG. 2F becomes that of FIG. 2G when extended gate regions 112c which were illustrated in FIG. 1C are used. One extended gate region is shared between the two pull-ups, exploiting the common connection of their gates to the third common node (node E). The structure of FIG. 2F becomes that of FIG. 2H for the use of merged gates between closely spaced vertical transistors which were illustrated in FIG. 1D. Due to limited space, FIG. 2H omitted labels for sacrificial transistors (141 and 141a as used in FIG. 1D) abutting pull-downs, pull-ups, and sense-enable circuit. The strapping contacts illustrated in FIGS. 1E-F are also applicable in the structures of FIGS. 2G-H, replacing each pair of bit-line via 135 and gate contact 135c or 135d with one strapping contact 135e or 135f. The resulting structures are not illustrated in the present disclosure but are considered within the scope of the present disclosure as being obvious.

A second embodiment of the present disclosure is about CMOS-based 3D sense amplifiers. For a variety of reasons, sense amplifiers used in memory products built with planar MOSFET's have so far been based on CMOS, i.e. have used both n- and p-type MOSFET's. Advantages of CMOS-based sense amplifiers include lower power consumption and improved dynamic operation. For simplicity, most illustrations of 3D CMOS sense amplifiers will be made with a 3D CMOS inverter, as with the case of using 3D NMOS inverter in FIGS. 1A-F before delving into the discussion of 3D NMOS sense amplifiers in FIGS. 2A-2H.

Figure 3A:
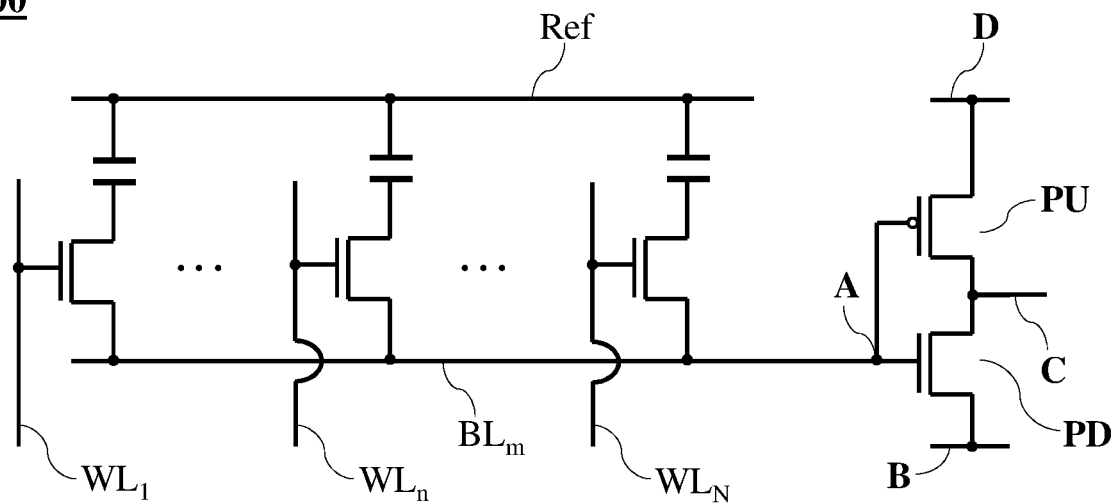
FIG. 3A is a circuit diagram representing an array of 3D DRAM cells along a bit line with a 3D CMOS inverter coupled to that bit line of the array, where the 3D inverter is made with both n- and p-MOSFET's. Either or both of n- and p-type transistors are vertical transistors.

FIG. 3A is a CMOS representation 300 of FIG. 1A, by replacing a p-MOSFET for the n-MOSFET pull-up. The gate of the p-MOSFET pull-up is coupled not to the second common node (node D) but to that of the n-MOSFET pull-down. Together, the gates are coupled to a bit line and act as the input of the 3D inverter. Otherwise, all the other connections in FIG. 3A are identical as those in FIG. 1A. We will explore a few exemplary options for implementing a p-MOSFET for pull-up function. Various alterations to those illustrated exemplarily herein are possible to achieve the same purpose and are considered within the scope of the present disclosure.

Figure 3B:
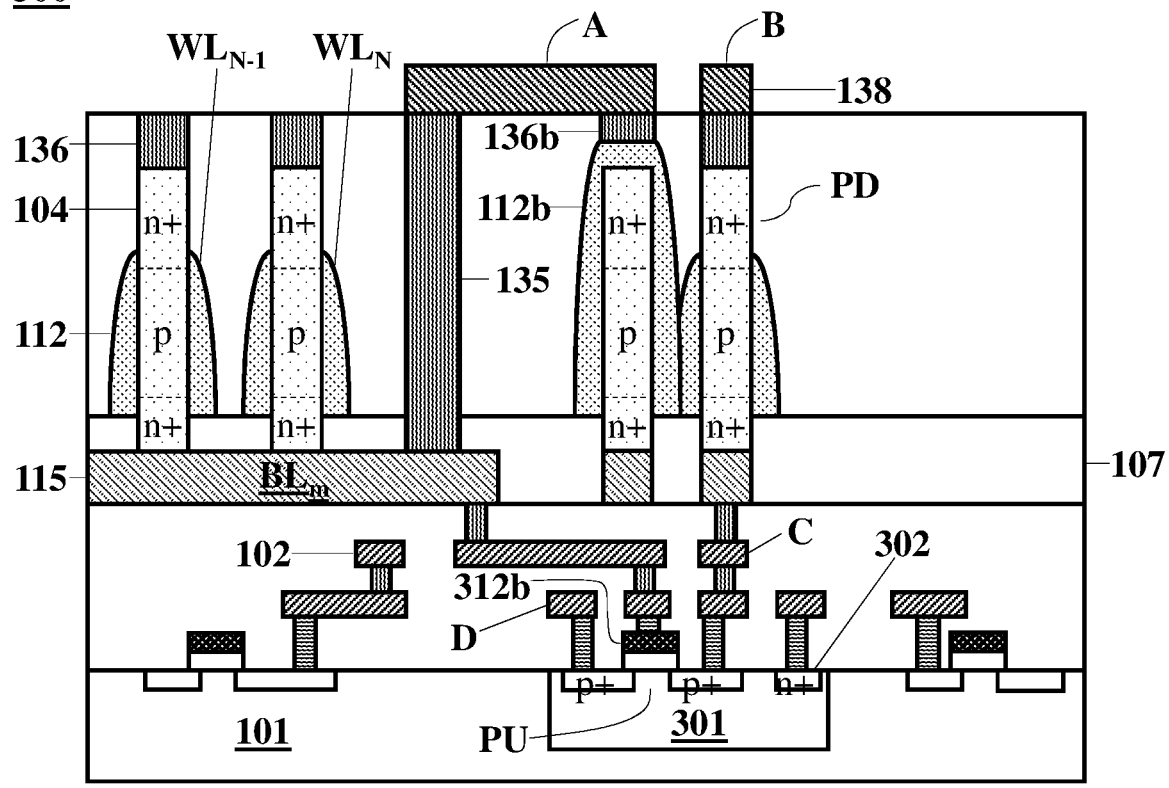
FIG. 3B is a cross-sectional view illustrating how the circuit of FIG. 3A may be constructed with a vertical n-MOSFET above a substrate and a planar p-MOSFET on the substrate.

A first option for implementing a 3D CMOS sense amplifier is to use planar p-MOSFET's formed below the sense amplifier, as shown in FIG. 3B. The bit line $BL_m$ for the particular sense amplifier couples to gate 112 of the vertical n-MOSFET (PD) through gate 112b of the modified vertical transistor and to gate 312b of the planar p-MOSFET (PU) through a piece of underlying interconnect 102. A doping region 302 for making a contact to n-well 301 of the planar p-MOSFET is usually coupled to a voltage equal to or higher than that at node D. In this figure, substrate 101 is assumed to be p-type, which is the predominant type of wafers used in the industry. However, an n-type wafer may also be used with p-wells formed for planar n-MOSFET's. A drawback of this first option is the requirement of 3D routing between planar p-MOSFET pull-up and vertical n-MOSFET pull-down. The 3D routing will somewhat undermine the improvement in dynamic operation of a CMOS sense amplifier. However, the advantage of lower power consumption inherent with a CMOS circuitry can be ensured.

Figure 3C:
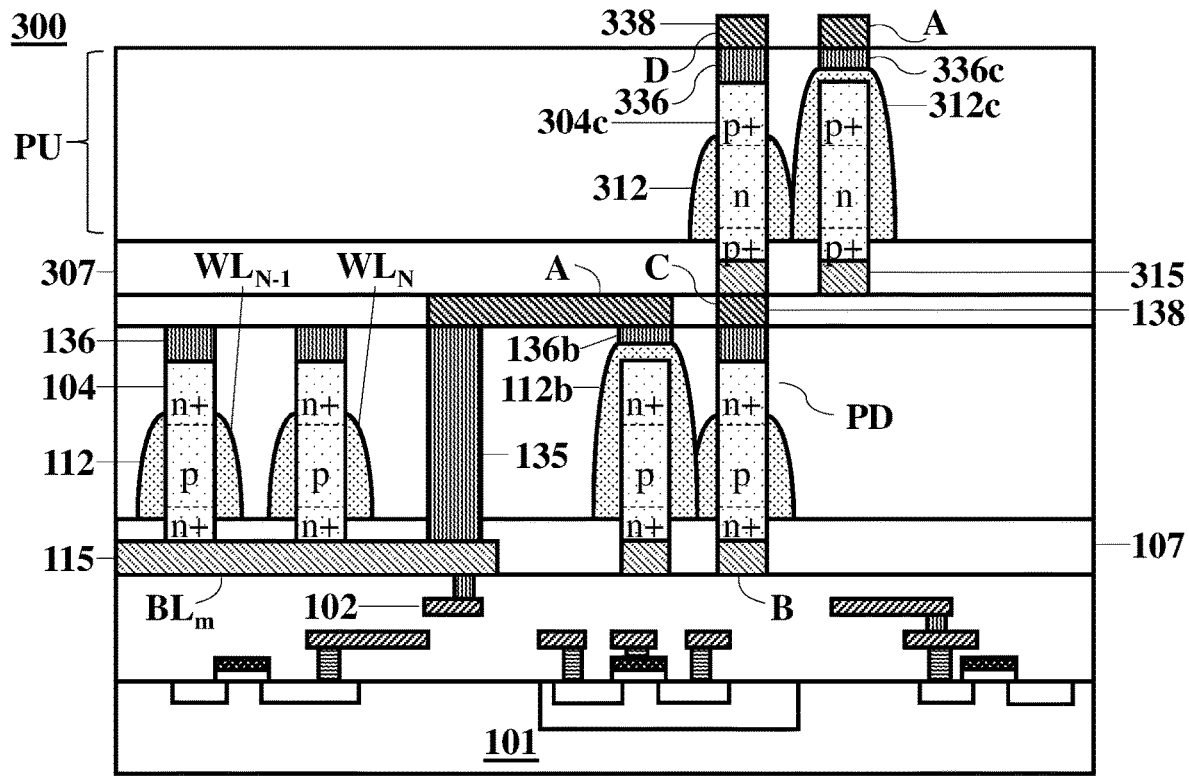
FIG. 3C is a cross-sectional view illustrating how the circuit of FIG. 3A may be constructed with a vertical n-MOSFET above a substrate and a vertical p-MOSFET at a level different from that of the vertical n-MOSFET.

A second option for implementing a 3D CMOS sense amplifier is to use vertical p-MOSFET's formed at a level different from that of vertical n-MOSFET's. Vertical p-MOSFET's may be formed above or below vertical n-MOSFET's. An example of placing vertical p-MOSFET's above vertical n-MOSFET's is shown in FIG. 3C, which illustrates a use of modified vertical MOSFET's for forming gate contacts 136b and 336c for n- and p-type vertical MOSFET's, respectively. However, one skilled in the art will readily recognize that either or both of n- and p-type vertical MOSFET's may use extended gate regions as in FIG. 1C or merged gates as in FIG. 1D as well as strapping contacts as illustrated in FIG. 1E or FIG. 1F. Different structures of gate contact formation may be used at different levels without involving additional process steps. The label "304c" in FIG. 3C, like the label "104", points to the tall pillar consisting of three doped regions rather than one doped region or its doping designation.

Vertical p-MOSFET's are formed with semiconductor pillars 304c standing on conductor lines 315. Metal lines 138 may comprise a barrier metal at the top to serve as an etch stop during the patterning of conductor lines 315 in addition to providing a direct coupling between metal lines 138 and conductor lines 315, e.g. for node C. In fact, the process steps of forming vertical p-MOSFET's may be identical or similar to those of forming vertical n-MOSFET's except for the doping types. Identical steps would typically be for semiconductor pillars 304c vs. 104, dielectric films 307 vs. 107, gate dielectrics (not shown), gates 312 vs. 112 and 312c vs. 112b, contacts 336 vs. 136 and 336c vs. 136b, and metal lines 338 vs. 138. Semiconductor pillars 304c of vertical p-MOSFET may be of polysilicon, regardless of the type of material used for semiconductor pillars 104 of vertical n-MOSFET. Even the doping of semiconductor pillars 304c and 104 may be accomplished with the same method except for doping types as indicated within each semiconductor pillar: "n" vs. "p" for channel regions and "p+" vs. "n+" for source/drain regions.

Although the modified vertical p-MOSFET stands on the right of the vertical p-MOSFET pull-up in FIG. 3C, the modified vertical p-MOSFET may be placed on the left of the pull-up. One might be concerned in such a situation that the piece of conductor lines 315 under the modified vertical p-MOSFET would most likely be shorted to the metal line 138 for node A. But such a short would not in any way interfere with the functioning of the circuit because the gate dielectric (not shown) of the modified vertical p-MOSFET would isolate node A of metal line 138 from gate 312c and from gate contact 336c. Even a short through the gate dielectric of the modified vertical p-MOSFET would be harmless because it would short out the nodes belonging to the same net, i.e. the inverter input (node A). A strapping via that shorts out gate 312c and node A of metal line 138 may even be beneficial in shortening a 3D path between the n- and p-type vertical transistors of FIG. 3C.

Depending on whether vertical p-MOSFET's are constructed above or below vertical n-MOSFET's, the best roles of top and bottom regions in semiconductor pillars may be different. As illustrated in FIG. 3C, which illustrate a best use of top and bottom regions, top regions of vertical n-MOSFET's and bottom regions of vertical p-MOSFET's are drains of the MOSFET's while bottom regions of vertical n-MOSFET's and top regions of vertical p-MOSFET's are sources of the MOSFET's. When vertical p-MOSFET's are formed below vertical n-MOSFET's (which is not illustrated in the present disclosure but considered within its scope), the best roles of top and bottom regions as sources and drains of the MOSFET's will reverse.

Figure 3D:
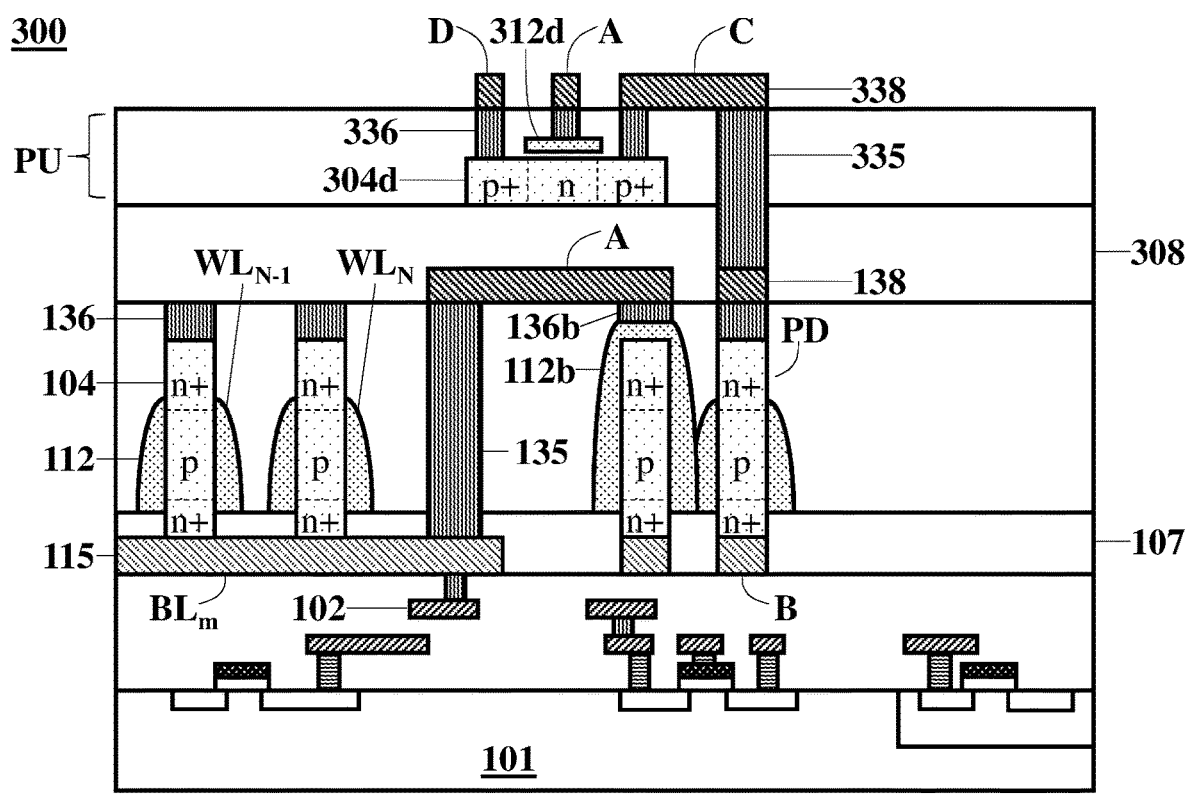
FIG. 3D is a cross-sectional view illustrating how the circuit of FIG. 3A may be constructed with a vertical n-MOSFET above a substrate and a planar p-MOSFET above the vertical n-MOSFET.

A third option for implementing a 3D CMOS sense amplifier is to build planar p-MOSFET's above vertical n-MOSFET's, as illustrated in FIG. 3D. The main body of such a planar p-MOSFET would typically be of a thin film such as polysilicon or amorphous silicon instead of single-crystalline silicon. In such a typical case, there is no need for wafer bonding and detaching which would transfer a layer of single-crystalline silicon. Simpler and less costly disposition of amorphous silicon or polysilicon would suffice, usually at a downside of somewhat higher leakage through the p-MOSFET's. A dielectric layer 308 disposed over metal lines 138 is required to build the planar p-MOSFET while isolating its main body 304d from metal lines 138. The label "304d" in FIG. 3D points to the thin film body consisting of three doped regions rather than one doped region or its doping designation.

The n-type channel region of the planar p-MOSET may be in-situ doped while disposing main body 304d, and the p-type source/drain regions may be doped by a high-dose implant with gate 312d serving as a mask to protect the channel region. Contacts 336 couple the pull-up source to the second common node (node D) and the pull-up drain through a routing by metal line 338 and via 335 to the top region of the pull-down transistor. Pull-up gate 312d is coupled to the inverter input (node A) through a different routing by metal line 338 and via 335, either behind or in front of the plane of cross section.

Figure 3E:
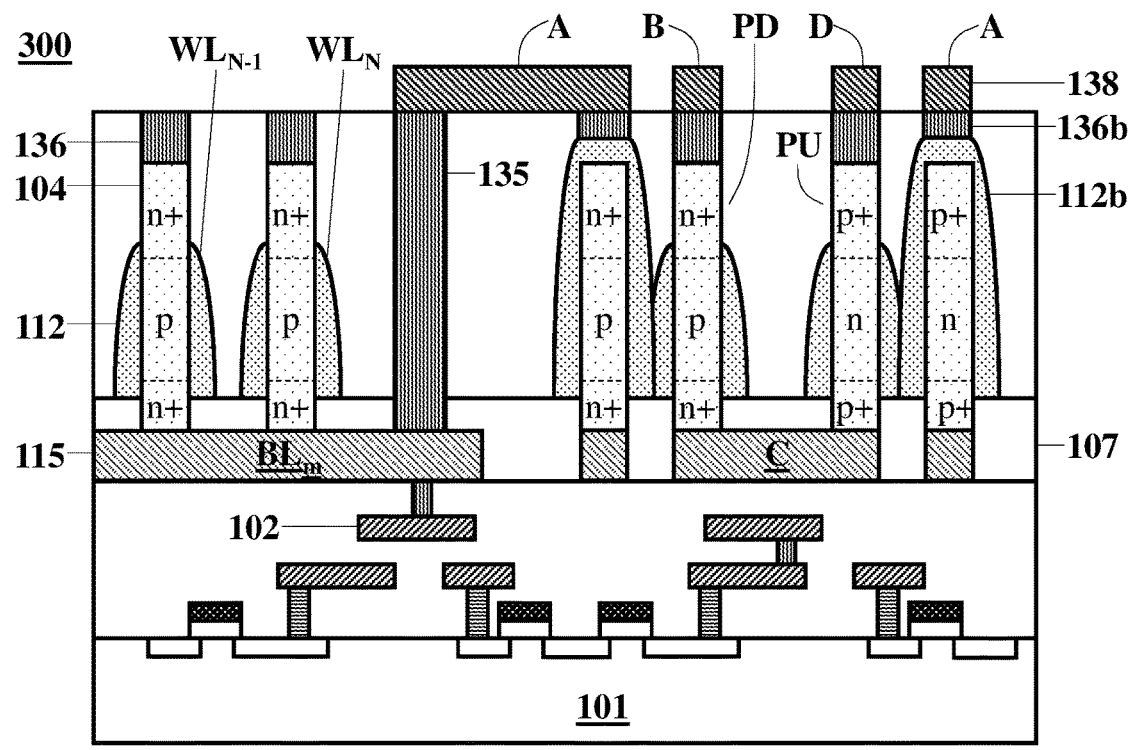
FIG. 3E is a cross-sectional view illustrating how the circuit of FIG. 3A may be constructed with both n- and p-type vertical transistors at the same level above a substrate.

The second and third options share the same drawback as the first, inherent in the formation of n-MOSFET's and p-MOSFET's on different levels. A fourth option for implementing a 3D sense amplifier addresses such a drawback by forming vertical p-MOSFET's along with vertical n-MOSFET's at the same level, as illustrated in FIG. 3E. Extra process steps would be necessary to separately dope p-MOSFET's and n-MOSFET's, including masking, implantation, and activation. Building both n- and p-type vertical MOSFET's simultaneously, albeit with a few additional steps, would be a very cost-effective option of implementing 3D CMOS circuitry without involving long metal routing between different levels.

The separate doping of n- and p-type vertical MOSFET's, unless performed on a donor wafer prior to bonding, may raise a concern as to the activation of implanted dopants. The activation may require a higher temperature than a layer of interconnects and contacts thereto underlying the vertical transistors are able to tolerate. For this reason, the second option as shown in FIG. 3C may be more practical, albeit with a higher cost to manufacture.

In FIG. 3E, pull-up and pull-down transistors have their own modified vertical transistors for forming separate gate contacts. However, they may share one modified vertical transistor placed between them, both closely spaced to the modified vertical transistor such that their gates 112 is merged with gate 112b of the shared modified vertical transistor. Alternatively, one modified vertical transistor may be placed on a side of either the pull-up or the pull-down and away from the other, as long as the three devices are spaced sufficiently close such that their gates merge between immediate neighbors. These types of sharing one modified vertical transistor by a pair of vertical transistors will be illustrated later in the present disclosure (see e.g. FIG. 3F and FIG. 3J).

Figure 3F:
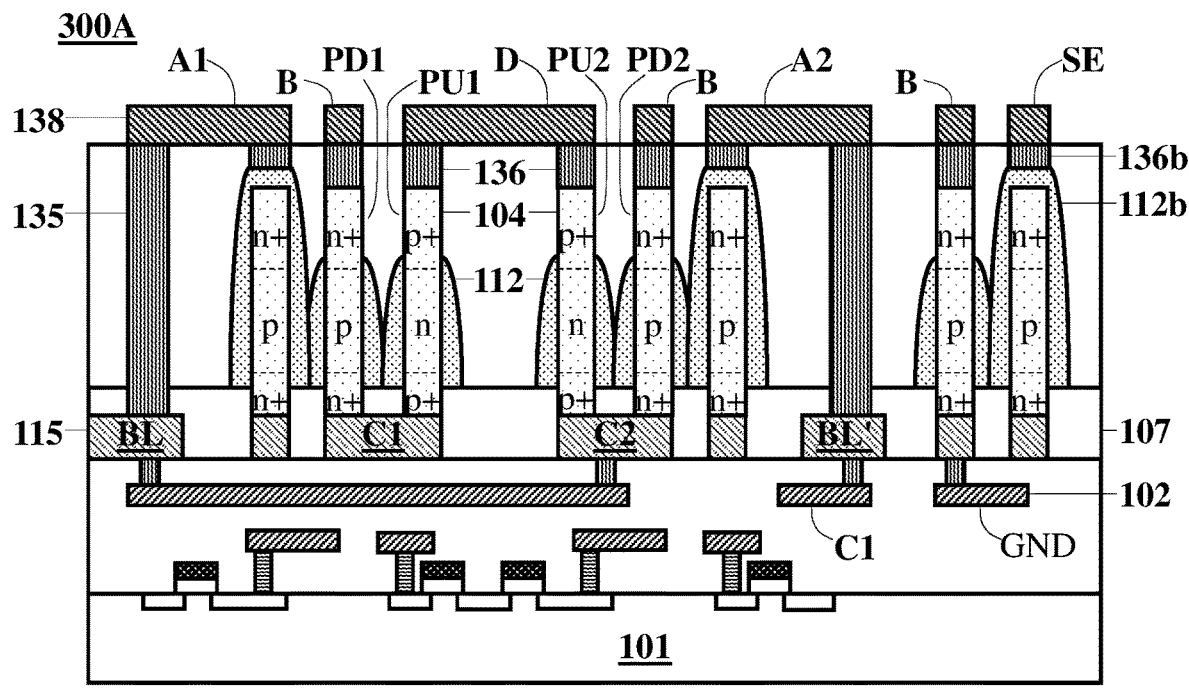
FIG. 3F is a cross-sectional view illustrating how a first 3D CMOS sense-amplifier (similar to that of FIG. 2A but with the pair of inverters replaced by that of FIG. 3A) may be constructed with both n- and p-type vertical transistors residing at the same level above a substrate, similar to the case of FIG. 3E.

The fourth option for the second embodiment will be illustrated for a 3D CMOS sense amplifier which is analogous to the 3D NMOS sense amplifier shown in FIG. 2B. Other options for the second embodiment such as those shown in FIGS. 3B-D are equally applicable although not explicitly illustrated with a 3D CMOS sense amplifier. FIG. 3F illustrates a first 3D CMOS sense amplifier 300A comprising a pair of cross-coupled 3D inverters. The first 3D CMOS sense amplifier is equivalent to the 3D NMOS sense amplifier shown in FIGS. 2A-B, in terms of the arrangement of inverters Like the differences between CMOS and NMOS inverters, the first 3D CMOS sense amplifier replaces p-MOSFET's, whether planar or vertical, for n-MOSFET pull-ups, with gates of p-MOSFET's coupled differently than those of n-MOSFET pull-ups.

Vertical transistors in FIG. 3F may be variously rearranged while preserving coupling between nodes and thus the functionality of the sense amplifier, as illustrated with the 3D NMOS sense amplifier in FIG. 2B and FIG. 2F. Such rearrangements, though not explicitly illustrated, would be obvious to one skilled in the art and are considered to be within the scope of the present disclosure.

FIG. 3F demonstrates a sharing of modified vertical transistors between pull-down and pull-up transistors. As stated in the description of FIG. 3E, the modified vertical transistors may not only be placed on a side of pull-down or pull-up transistors and away from the other but also between pull-down and pull-up transistors, to achieve the purpose of providing gate contacts common for both. With different positioning of modified vertical transistors relative to pull-down and pull-up transistors, routings by top metal 138 and underlying interconnect 102 would change for proper coupling between nodes. Further, the doping types for channel and top/bottom regions of the modified vertical transistors may be opposite of what are shown in FIG. 3F without affecting the functionality of, or top or underlying routings for, the 3D CMOS sense amplifier.

Figure 3G:
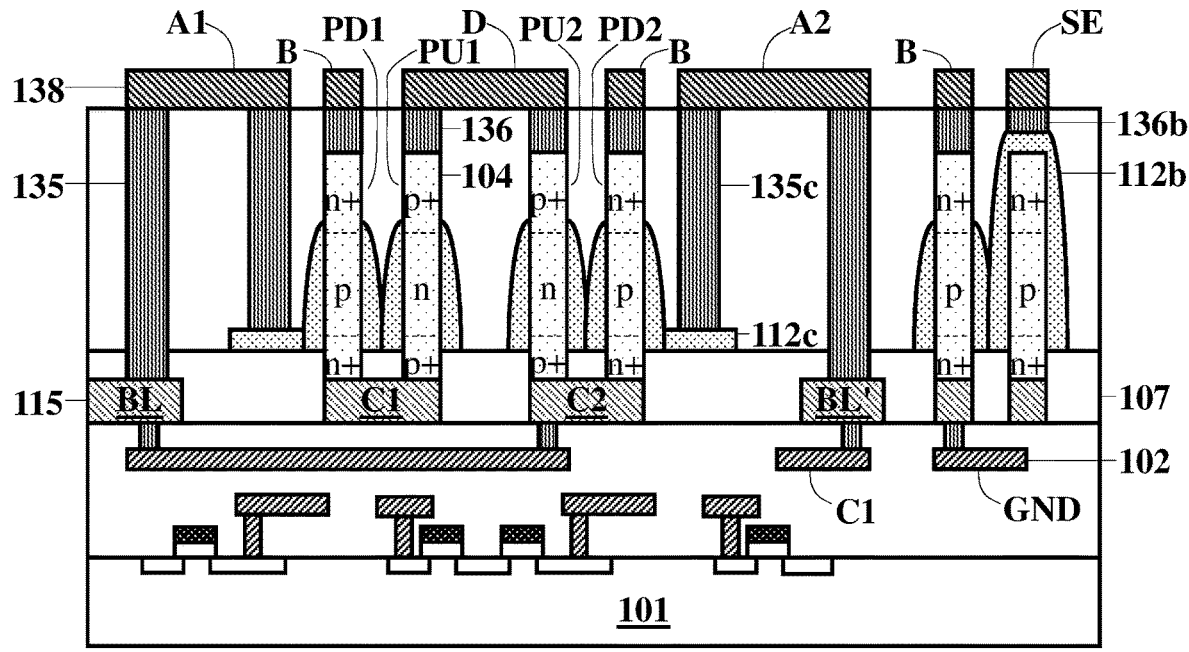
FIG. 3G illustrates a use of extended gate regions as landing pads for the formation of gate contacts in a 3D CMOS sense-amplifier. It also illustrates a mixed use of two options of gate contact formation.
Figure 3H:
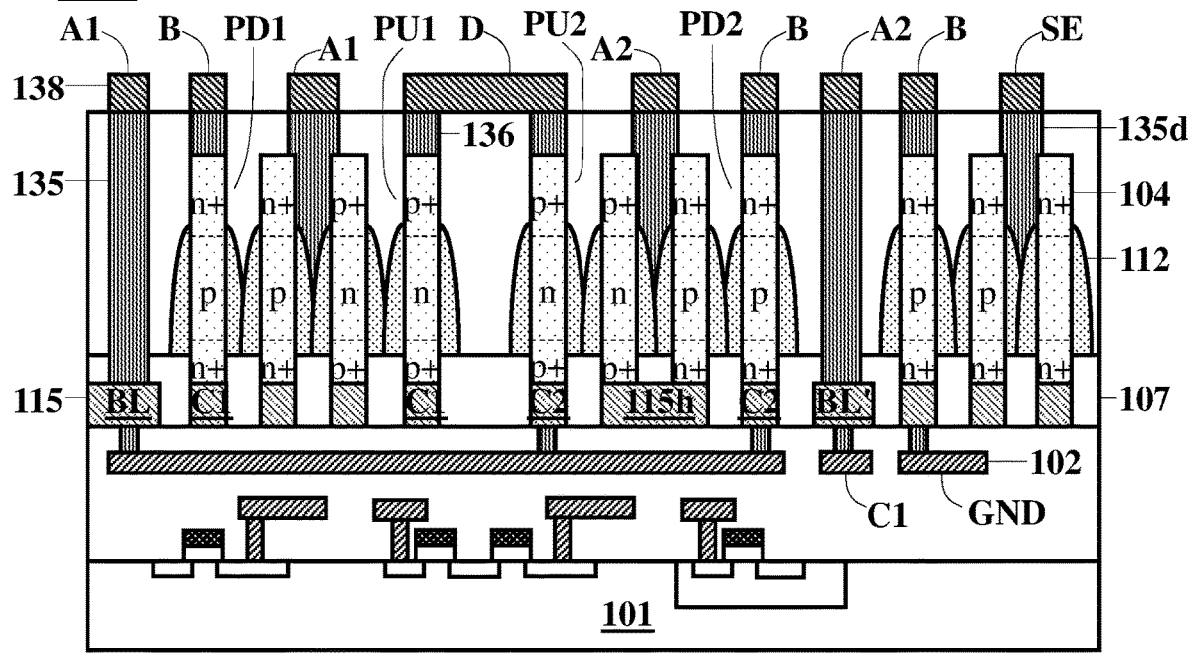
FIG. 3H illustrates a use of pairs of sacrificial vertical transistors to provide landing pads for the formation of gate contacts in a 3D CMOS sense-amplifier.

FIGS. 3G-H demonstrate alternative structures for forming gate contacts, as illustrated in FIGS. 1C-D. The strapping contacts illustrated in FIGS. 1E-F may also be applied to the structures of FIGS. 3G-H but are not illustrated. Such application would be obvious to one skilled in the art and is considered to lie within the scope of the present disclosure.

FIG. 3G demonstrates a mixed use of extended gate regions 112c and modified vertical transistors having gate 112b. One may use a modified vertical transistor for either of the two inverters, or for both inverters while using an extended gate region for the sense-enable circuit. Any of such mixed uses does not complicate design or manufacturing of a memory product containing such 3D sense amplifiers. There is little, if any, difference in the size of 3D sense amplifiers, whether using one type of gate contact formation for all vertical transistors or using both types for different vertical transistors. Particular placements of extended gate regions or modified vertical transistors relative to (i.e. on the left of, on the right of, or in-between) the vertical transistors in either inverters and sense-enable circuit are irrelevant, so long as top metal 138 and underlying interconnect 102 are properly routed for intended couplings and the spaces between the vertical transistors are properly maintained to ensure merger of gates between desired vertical transistors.

In FIG. 3H, use of sacrificial vertical transistors for gate contact formation is illustrated for the 3D CMOS sense amplifier. The modified vertical transistors in FIG. 3F and the extended gate regions in FIG. 3G are replaced with pairs of sacrificial vertical transistors. Routings by top metal 138 and underlying interconnect 102 are properly modified to place the sacrificial pairs between pull-up and pull-down transistors which would have been identical to the cases where extended gate regions and/or modified vertical transistors are placed between relevant pull-up and pull-down transistors. Although the sacrificial vertical transistors on the side of pull-up transistors are doped as p-MOSFET's and those on the side of pull-down transistors are doped as n-MOSFET's, any or all of them may be doped to the opposite types without affecting functionality of the 3D CMOS sense amplifier. A reversal of doping types for sacrificial vertical transistors would only modify implant masks with respect to shapes and sizes thereof on the masks.

Etch-stop layers (not shown) may be disposed on the top regions of semiconductor pillars to isolate the top regions from gate contacts. Then, conductor lines 115 for the four vertical transistors (including the sacrificial ones) of each inverter may be continuous across them, similar to those for nodes C1 and C2 in FIG. 2H. At a minimum, the conductor line under each pair of sacrificial vertical transistors including the pair for the sense-enable circuit may be continuous between them, like conductor line 115h associated with node A2 in FIG. 3H.

Figure 3I:
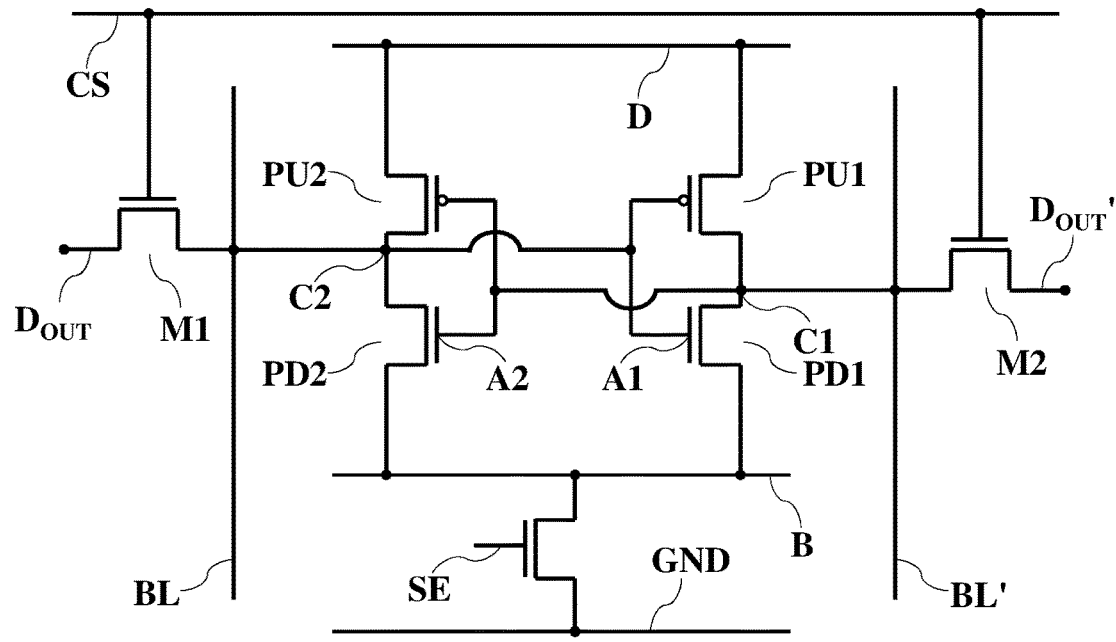
FIG. 3I illustrates a 3D CMOS sense-amplifier with optional column-select multiplexers coupling the bit line and bit-line bar to the data outputs of the memory module.

FIG. 3I shows a circuit diagram for a second 3D CMOS sense amplifier 300B. It is essentially the first 3D CMOS sense amplifier that has been described in reference to FIGS. 3F-H, with the exemplary additional multiplexers (or muxes) controlled by a column select "CS" and coupled to complementary data outputs "$D_{OUT}$" and "$D_{OUT}'$". This 3D CMOS sense amplifier is equivalent to the 3D NMOS sense amplifier shown in FIG. 2E, in terms of the arrangement of inverters. Although each mux in FIG. 3I consists of one vertical transistor ("M1" or "M2"), it may be variously designed such as a parallel connection of n- and p-MOSFET's with complementary column-select signals. Column select CS controlled by a column decoder (not shown) will turn the muxes on to relay signals on desired bit lines to the outputs of the 3D memory module. The column select will turn the muxes on after the bit-line signal is adequately amplified.

Figure 3J:
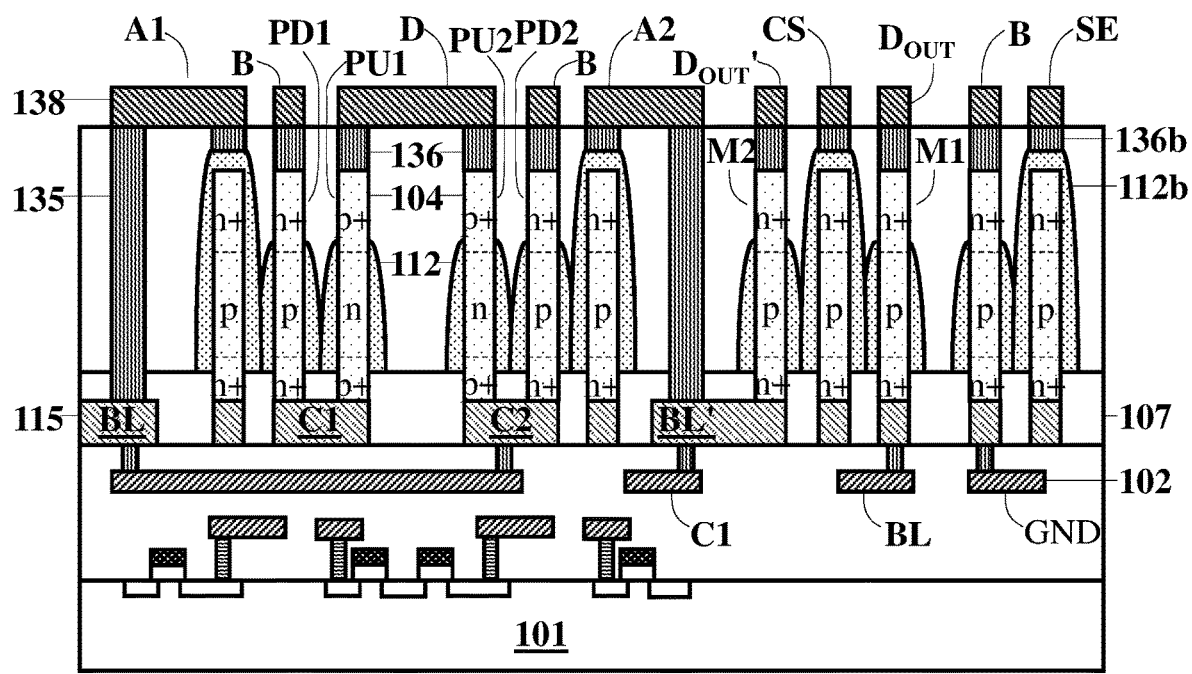
FIG. 3J illustrates a cross-sectional view of the 3D CMOS sense-amplifier shown in FIG. 3I.

A cross-sectional view for the 3D CMOS sense amplifier in FIG. 3I is shown in FIG. 3J, including the column-select multiplexers. This cross-sectional view is equivalent to that shown in FIG. 2B (rather than FIG. 2F) in terms of the arrangement of vertical transistors belonging to first or second inverters of the sense amplifiers. Although the top and bottom regions of M1 are coupled to $D_{OUT}$ and BL, respectively, their roles may be reversed; the top region may instead be coupled to BL (or node A1) with a piece of top metal 138 routed on a plane different from that of the cross section, and the bottom region may instead be coupled to $D_{OUT}$. With respect to M2, the roles of top and bottom regions as illustrated would be best because of its coupling to BL', but may be reversed when accompanied by a proper change in routings by top metal 138, conductor lines 115, and underlying interconnect 102.

Figure 4A:
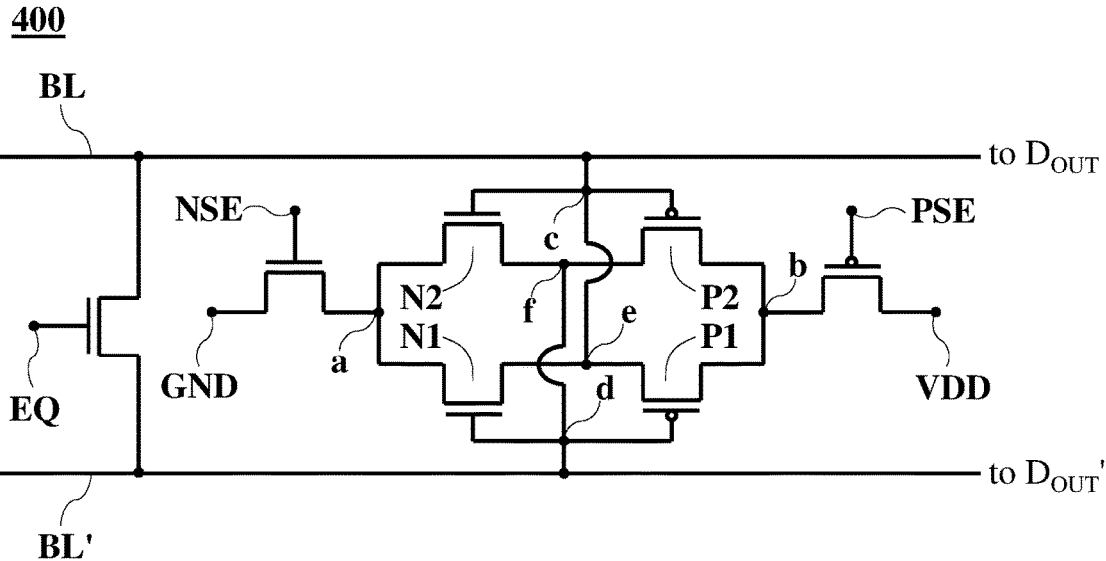
FIG. 4A is a circuit diagram of a second 3D CMOS sense amplifier that can be used in 3D DRAM products. It illustrates an optional equalizer and a pair of optional sense-enable circuits.

We now describe a third 3D CMOS sense amplifier for the second embodiment. FIG. 4A illustrates a circuit diagram for the third 3D CMOS sense amplifier 400. It comprises a pair of cross-coupled amplifiers, two sense-enable circuits, and an equalizer. Each of the cross-coupled amplifiers comprises one n-type vertical transistor and one p-type transistor whose gates are coupled to bit line BL or bit-line bar BL'. In this example, the sense-enable circuits and the equalizer consists of one vertical transistor each. The sense-enable circuit that couples a first common node (node "a") of the cross-coupled amplifiers to a local or system ground GND consists of one vertical n-MOSFET and is controlled by an NMOS sense-enable signal "NSE". The other sense-enable circuit which couples a second common node (node "b") of the cross-coupled amplifiers to a power supply or regulator output VDD consists of one vertical p-MOSFET and is controlled by a PMOS sense-enable signal "PSE". The two sense-enable signals are complementary to each other. The equalizer in this illustration consists of one vertical n-MOSFET controlled by an equalization signal EQ. Any of the sense-enable circuits or equalizer may be designed in various ways, which are considered to lie within the scope of the present disclosure.

Bit line BL and bit-line bar BL' are coupled to inputs of the third 3D CMOS sense amplifier at nodes c and d, respectively. The complementary outputs of the third 3D CMOS sense amplifier are at nodes e and f. When sense-enable circuits properly enable the sense amplifier, the differential signal on bit line and bit-line bar is amplified from an initially small bit-line swing to the full dynamic range (usually power supply voltage of the sense amplifier) and is subsequently coupled to data outputs $D_{OUT}$ and $D_{OUT}'$ through a pair of switches (not shown), both controlled by a column select as shown in FIG. 3I.

Figure 4B:
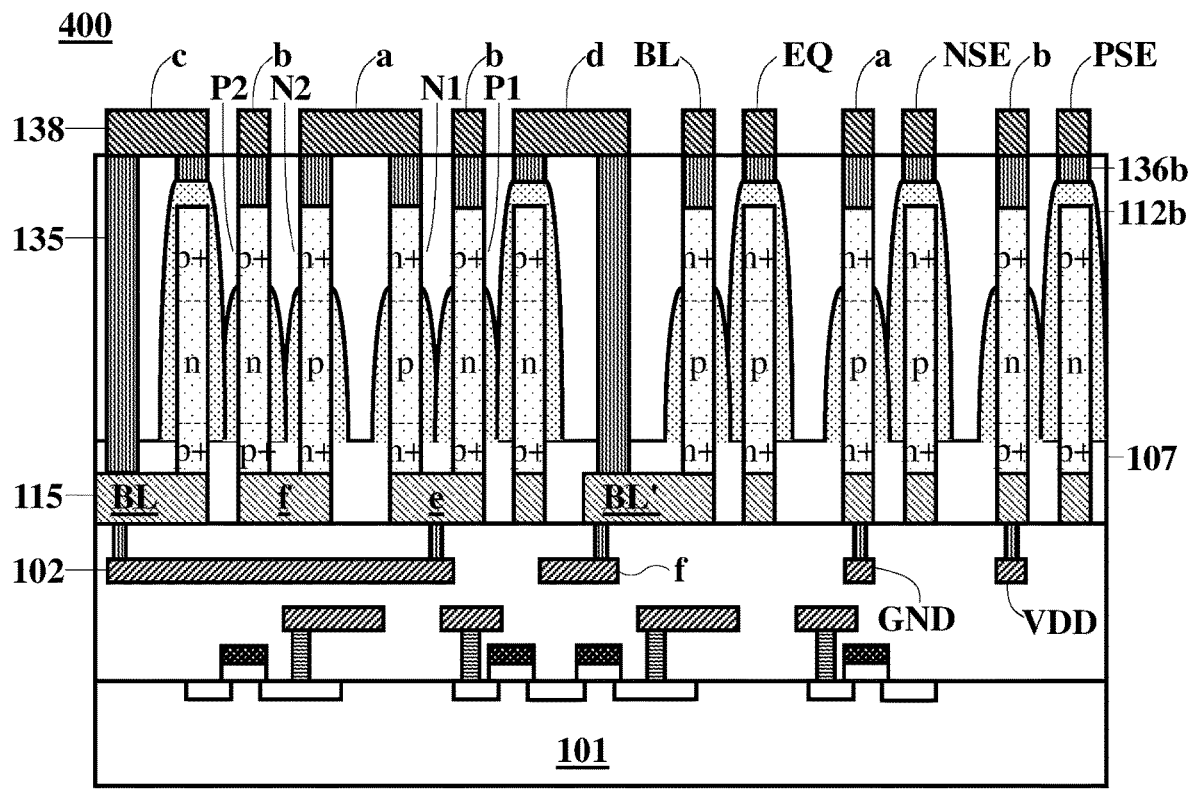
FIG. 4B is a cross-sectional view illustrating how the second 3D CMOS sense amplifier shown in FIG. 4A may be constructed with vertical transistors.
Figure 4C:
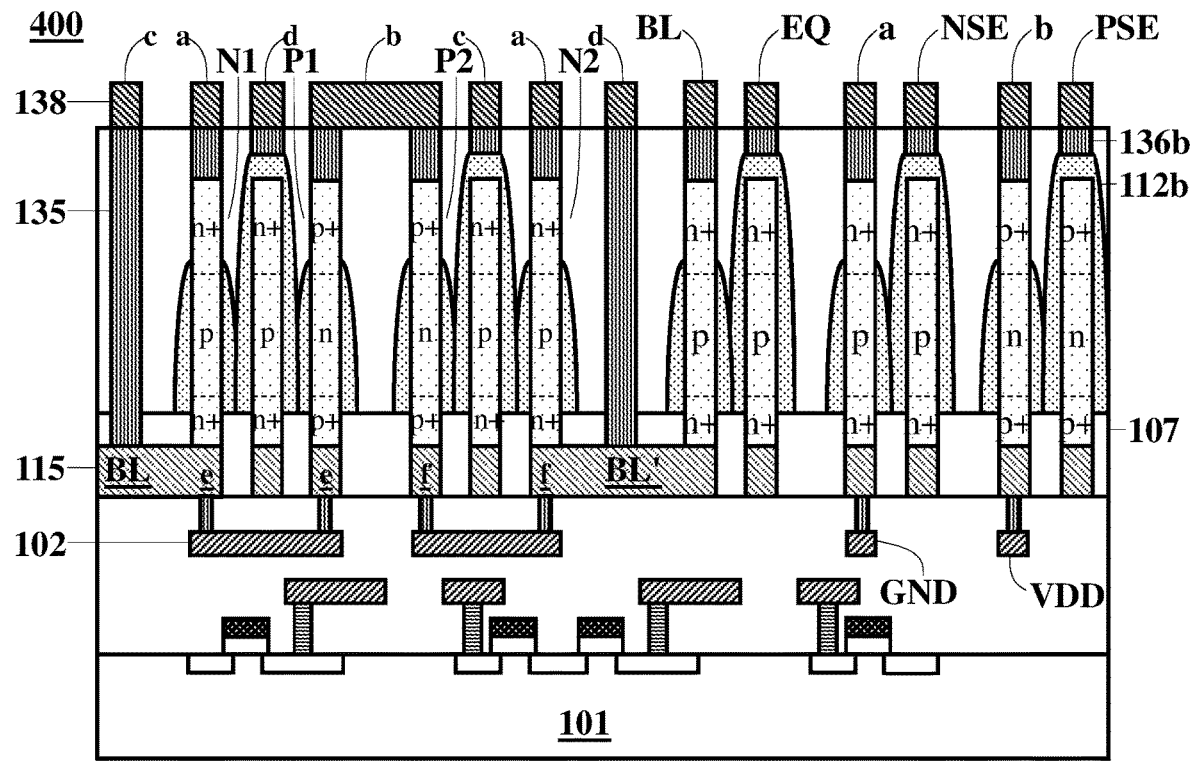
FIG. 4C illustrates an alternative arrangement of vertical transistors for the same 3D CMOS sense amplifier shown in FIG. 4A.
Figure 4D:
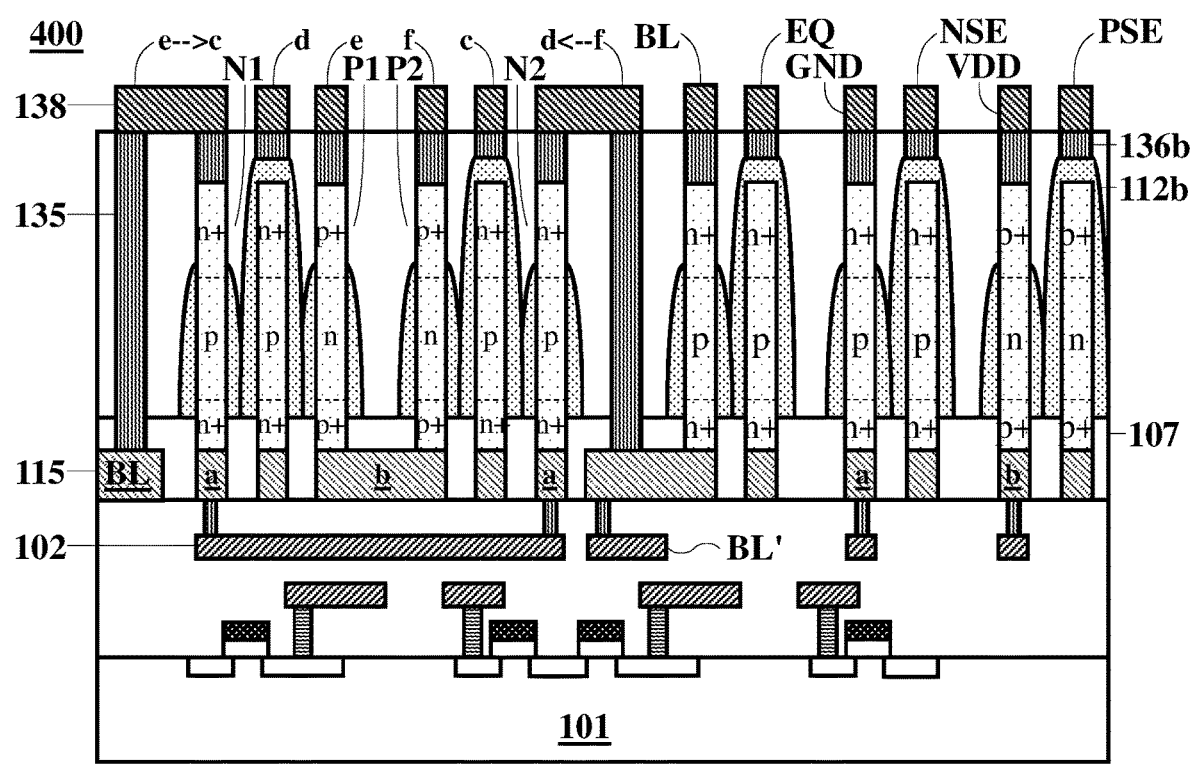
FIG. 4D illustrates reversal of roles of top and bottom regions of vertical transistors with the same alternate arrangement as in FIG. 4C.

A cross-sectional view of the third 3D CMOS sense amplifier is illustrated in FIG. 4B. The gate contacts are formed on modified vertical transistors but may utilize extended gate regions or pair of sacrificial transistors. As mentioned in reference to other cross-sectional views of the present disclosure, the vertical transistors of the third 3D CMOS sense amplifier may be arranged in various different ways without affecting its functionality by ensuring proper changes in routings by top metal 138, conductor lines 115, and underlying interconnect 102. An example is shown in FIG. 4C, which swaps one transistor pair consisting of N1 and P1 with the other pair consisting of N2 and P2. FIG. 4D illustrates the reversal of roles of top and bottom regions of semiconductor pillars accompanied by different routings by top metal 138, conductor lines 115, and underlying interconnect 102. Similar role reversals can be made for the 3D NMOS sense amplifier (whether FIG. 2B or FIG. 2F) of the first embodiment and the first and second 3D CMOS sense amplifier (FIG. 3F and FIG. 3J, respectively) of the second embodiment as well as their alternatives that use different structures for gate contact formation.

Figure 5A:
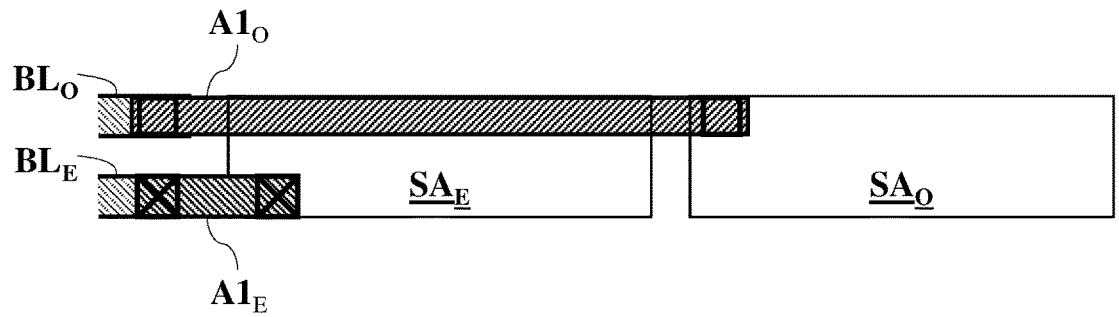
FIG. 5A illustrates a staggering placement of 3D sense amplifiers for a 3D DRAM when each 3D sense amplifier spans multiple bit lines.

In general, each bit line of a memory block, particularly for DRAM, is coupled to one dedicated sense amplifier. Identical sense amplifiers are copied over in word-line direction for all bit lines of the block. As illustrated in FIG. 2C, 3D sense amplifiers may be required to become wide enough to span a space that normally accommodates more than one bit line. In that case, it is impossible to align 3D sense amplifiers in one row (or column, depending on how the memory orientation is perceived). For a 3D sense amplifier that spans "X" number of consecutive bit lines, 3D sense amplifiers for each group of X bit lines are staggered in X rows. FIG. 5A illustrates the staggering for X=2. The 3D sense amplifiers $SA_E$ for even-numbered bit lines $BL_E$ are arranged in one row and the 3D sense amplifiers $SA_O$ for odd-numbered bit lines $BL_O$ are arranged in a next row. One group of 3D sense amplifiers is closer to an end of bit lines than the other. One group, e.g. $SA_E$, may be coupled to their respective bit lines through a piece of top metal (138 in cross-sectional views), e.g. $A1_E$, and the other, e.g. $SA_O$, through a piece of underlying interconnect (102 in cross-sectional views), e.g. $A1_O$. Some coupling may be through an extension of a bit line ("BL" or "BL'" in cross-sectional views), as in FIG. 1B or FIG. 2F, i.e. at least one of the vertical transistors of the 3D sense amplifier may stand on the extension of a bit line or a bit-line bar.

Figure 5B:
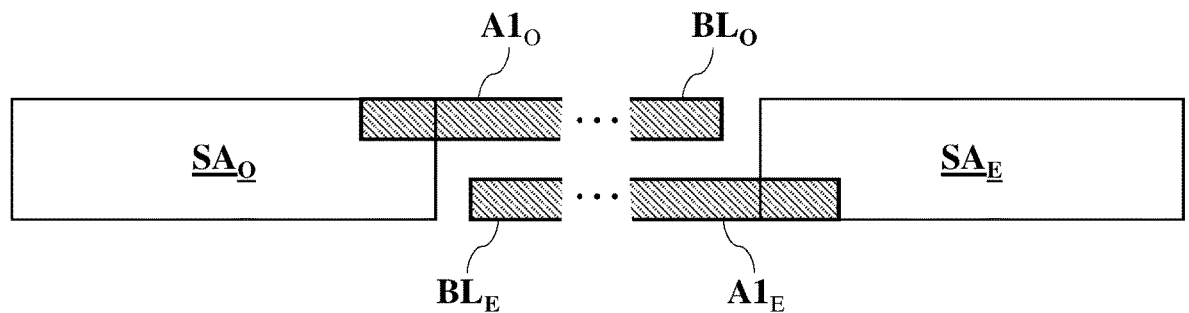
FIG. 5B illustrates an alternating placement of 3D sense amplifiers for a 3D DRAM when each 3D sense amplifier spans multiple bit lines.

FIG. 5B illustrates an alternating placement of groups of 3D sense amplifiers. 3D sense amplifiers $SA_E$ belonging to even-numbered bit lines $BL_E$ may be placed on one side of the array and those ($SA_O$) for odd-numbered bit lines $BL_O$ on the other side. This arrangement is normally cumbersome (if not impossible) for planar memory cells because of bit-line decoders (often also called column decoders) placed one side of the array. However, bit-line decoders for a 3D memory reside in a level (on a substrate) below the memory and does not interfere with the placement of sense amplifiers on both sides of the array.

Figure 5C:
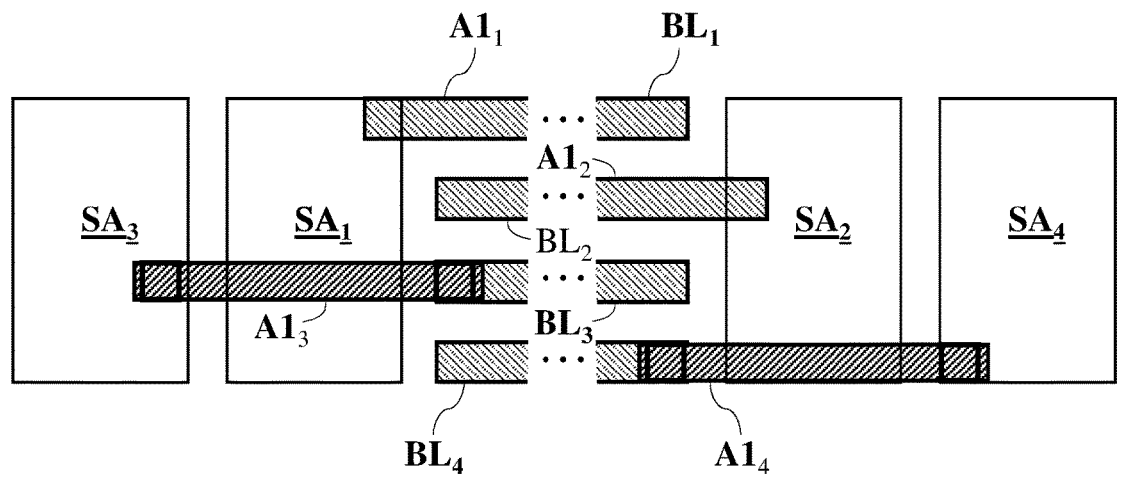
FIG. 5C illustrates a placement of 3D sense amplifiers for a 3D DRAM when each 3D sense amplifier spans multiple bit lines, combining the features shown in FIGS. 5A-B.

For 3D sense amplifiers, each of which spans more than two bit lines, half of them, e.g. even ones, may be staggered one side of the array and the other half, e.g. odd ones, on the opposite side. FIG. 5C illustrates such a staggering on both sides when one 3D sense amplifier spans four consecutive bit lines (i.e. when X=4). Although all even-numbered sense amplifiers $SA_2$ and $SA_4$ are placed on one side and all odd-numbered sense amplifiers $SA_1$ and $SA_3$ on the other side, the first and the second may be on one side while the third and the fourth on the opposite side. One may consider placing only one of the four sense amplifiers on one side and the remaining on the other side. One skilled in the art would readily apply similar schemes to cases when one 3D sense amplifier spans more number of bit lines, including the situation that the number of bit lines spanned by one 3D sense amplifier is not divisible by 2. In FIG. 5C, underlying interconnect, e.g. for $A1_3$ and $A1_4$, are used for the coupling between the last two bit lines of the group and their respective sense amplifiers while extension of bit lines, e.g. for $A1_1$ and $A1_2$, are used for the coupling between the first two bit lines and their respective sense amplifiers, because of the placement of the sense amplifiers relative to the ends of the array. However, pieces of top metal may be used in place of bit-line extension or underlying interconnect for any of the couplings as long as such use does not interfere with the use of that layer within each sense amplifier.

Figure 5D:
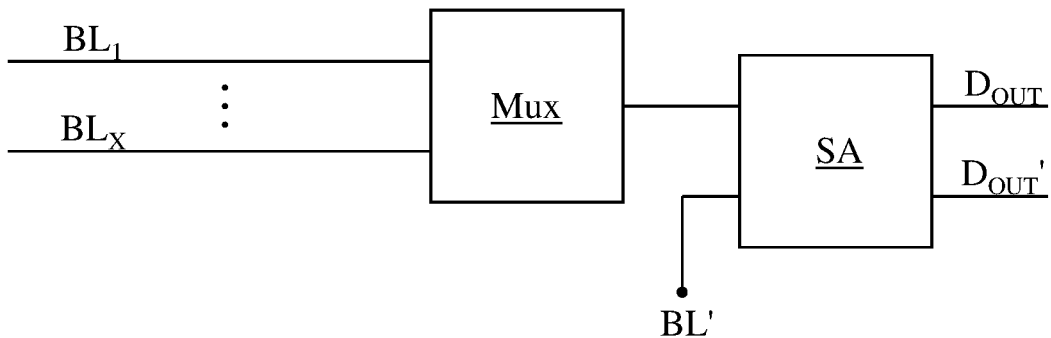
FIG. 5D illustrates a sharing through a 3D mux of one 3D sense amplifier among a group of consecutive bit lines whose memory cells have one output each.
Figure 5E:
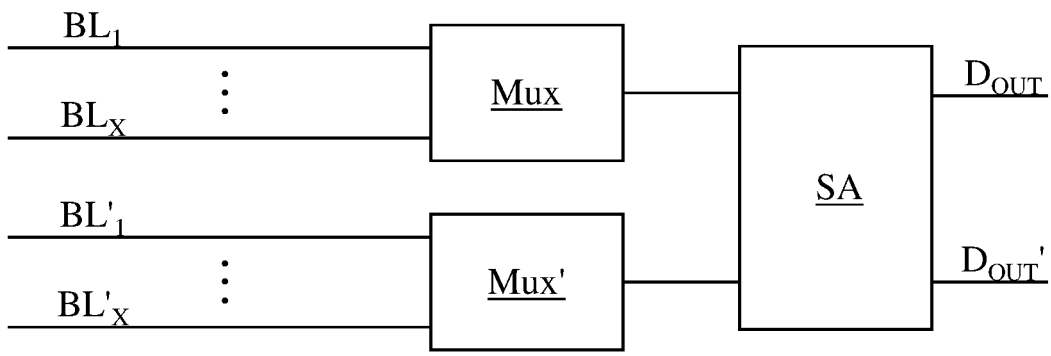
FIG. 5E illustrates a sharing through a 3D mux pair of one 3D sense amplifier for a group of consecutive bit lines whose memory cells have complementary outputs each.
Figure 5F:
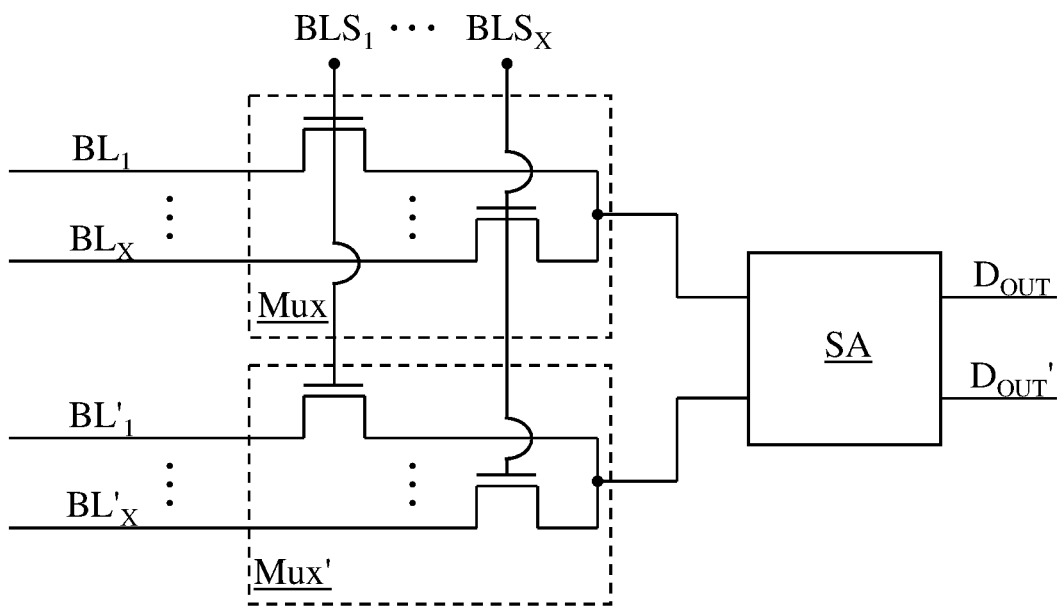
FIG. 5F illustrates an implementation of the 3D mux shown in FIG. 5E.

An alternative to the staggering, whether placed on one or both sides of the array, of sense amplifiers belonging to a group of consecutive bit lines is to share one sense amplifier among the consecutive bit lines in the group. Bit-line multiplexers may be used to select one bit line (or one pair of bit line and bit-line bar) as an input (or inputs) to the shared sense amplifier. This alternative is not suitable for a memory such as DRAM which requires refresh on read because the cells on bit lines that are not selected by bit-line multiplexers cannot be refreshed on read. Sharing of a sense amplifier among a number of bit lines may enable a degree of optimization of sense amplifiers that would not otherwise be achievable. FIG. 5D illustrates the sharing of one sense amplifier SA among X number of bit lines ($BL_1$ through $BL_X$) for single-ended memory cells. The complementary outputs $D_{OUT}$ and $D_{OUT}'$ of the sense amplifier will correspond to the signal on the bit line selected by bit-line multiplexer Mux. FIG. 5E illustrates the sharing of one sense amplifier among X number of bit line pairs ($BL_1/BL_1'$ through $BL_X/BL_X'$) for double-ended memory cells. The complementary outputs $D_{OUT}$ and $D_{OUT}'$ of the sense amplifier will correspond to the complementary data on the bit line and bit-line bar, respectively, selected by bit-line multiplexers Mux and Mux'. FIG. 5F illustrates an implementation of the bit-line multiplexers for double-ended memory cells with one transistor per bit line and another per bit-line bar, both transistors being controlled by bit-line selects ($BLS_1$ through $BLS_X$).

As used throughout the present disclosure, the word "may" is used in a permissive sense (i.e., meaning "having the potential to"), rather than a mandatory sense (i.e., meaning "must" or "required to"). Similarly, the words "include," "including," and "includes" mean "including, but not limited to" the listed item(s).

The foregoing descriptions of specific embodiments of the present disclosure have been presented for purposes of illustration and description. The embodiments were chosen and described in order to explain the principles of the invention and its practical application in the best way, and thereby enable others skilled in the art to best utilize the invention and various embodiments with various modifications as are suited to the particular use contemplated. They are not intended to be exhaustive or to limit the invention to the precise forms disclosed. Many modifications, variations, and rearrangements are possible in light of the above teaching without departing from the broader spirit and scope of the various embodiments. For example, they can be in different sequences than the exemplary ones described herein, e.g., in a different order. One or more additional new elements or steps may be inserted within the existing structures or methods or one or more elements or steps may be abbreviated or eliminated, according to a given application, so long as substantially equivalent results are obtained. Accordingly, structures and methods construed in accordance with the principle, spirit, and scope of the present invention may well be embraced as exemplarily described herein. It is intended that the scope of the invention be defined by the Claims appended hereto and their equivalents.

I claim:

1. A 3D inverter, comprising:
   a first vertical MOSFET;
   a second vertical MOSFET;
   an interconnect line disposed below said 3D inverter;
   a metal line disposed above said 3D inverter;
   and wherein:
   each of said first vertical MOSFET and said second vertical MOSFET comprises a gate, a source region, and a drain region;
   said drain region of said first vertical MOSFET is coupled to said source region of said second vertical MOSFET and to an output of said 3D inverter;
   said source region of said first vertical MOSFET is coupled to a first common node;
   said drain region of said second vertical MOSFET is coupled to a second common node;
   said gate of said first vertical MOSFET is coupled to an input of said 3D inverter; and
   said gate of said second vertical MOSFET is coupled to a third common node.

2. The 3D inverter of claim 1, wherein:
   said drain region and said source region of said first vertical MOSFET are a bottom region and a top region, respectively, of said first vertical MOSFET; and said drain region and said source region of said second vertical MOSFET are a top region and a bottom region, respectively, of said second vertical MOSFET.

3. The 3D inverter of claim 2, wherein
said interconnect line couples said bottom region of said first vertical MOSFET to said bottom region of said second vertical MOSFET;
said metal line couples said top region of said first vertical MOSFET to said first common node;
said metal line couples said top region of said second vertical MOSFET to said second common node; and
said metal line couples said gate of said second vertical MOSFET to said third common node.

4. The 3D inverter of claim 1, wherein:
said second common node and said third common node are identical.

5. The 3D inverter of claim 1, wherein:
said third common node is coupled to a higher voltage than said second common node.

6. The 3D inverter of claim 1, further comprising:
a first modified vertical MOSFET with a gate and a top region;
a first contact; and wherein:
said gate of said first modified vertical MOSFET extends upward to fully cover said top region of said first modified vertical MOSFET and such that said top region of said first modified vertical MOSFET is rendered inaccessible;
said first modified vertical MOSFET is spaced sufficiently close to said first vertical MOSFET such that said gate of said first modified vertical MOSFET and said gate of said first vertical MOSFET are merged between said first modified vertical MOSFET and said first vertical MOSFET;
said first contact is disposed on said gate of said first modified vertical MOSFET; and
said input of said 3D inverter is coupled to said first contact.

7. The 3D inverter of claim 1, further comprising:
a second modified vertical MOSFET with a gate and a top region;
a second contact; and wherein:
said gate of said second modified vertical MOSFET extends upward to fully cover said top region of said second modified vertical MOSFET and such that said top region of said second modified vertical MOSFET is rendered inaccessible;
said second modified vertical MOSFET is spaced sufficiently close to said second vertical MOSFET such that said gate of said second modified vertical MOSFET and said gate of said second vertical MOSFET are merged between said second modified vertical MOSFET and said second vertical MOSFET;
said second contact is disposed on said gate of said second modified vertical MOSFET; and
said third common node is coupled to said second contact.

8. The 3D inverter of claim 1, further comprising:
a first extended gate region;
a first contact; and wherein:
said first extended gate region extends horizontally from a bottom edge of said gate of said first vertical MOSFET;
said first contact is disposed on said first extended gate region; and
said input of said 3D inverter is coupled to said first contact.

9. The 3D inverter of claim 1, further comprising:
a second extended gate region;
a second contact; and wherein:
said second extended gate region extends horizontally from a bottom edge of said gate of said second vertical MOSFET;
said second contact is disposed on said second extended gate region; and
said third common node is coupled to said second contact.

10. The 3D inverter of claim 1, further comprising:
a fourth vertical MOSFET and a fifth vertical MOSFET forming a pair;
a first contact; and wherein:
each of said fourth vertical MOSFET and said fifth vertical MOSFET comprises a gate and a top region;
said fourth vertical MOSFET is disposed between said first vertical MOSFET and said fifth vertical MOSFET;
said fourth vertical MOSFET is spaced sufficiently close to said first vertical MOSFET such that said gate of said fourth vertical MOSFET and said gate of said first vertical MOSFET are merged between said fourth vertical MOSFET and said first vertical MOSFET;
said fifth vertical MOSFET is spaced sufficiently close to said fourth vertical MOSFET such that said gate of said fifth vertical MOSFET and said gate of said fourth vertical MOSFET are merged between said fifth vertical MOSFET and said fourth vertical MOSFET;
said first contact is disposed on a top surface of said gate merged between said fifth vertical MOSFET and said fourth vertical MOSFET; and
said input of said 3D inverter is coupled to said first contact.

11. The 3D inverter of claim 10, further comprising:
an etch-stop layer disposed on said top region of each of said fourth vertical MOSFET and said fifth vertical MOSFET; wherein:
said first contact is electrically coupled to said top surface of said merged gate but is electrically isolated from said top region of each of said fourth vertical MOSFET and said fifth vertical MOSFET.

12. The 3D inverter of claim 1, further comprising:
a third vertical MOSFET;
a second contact; and wherein:
said third vertical MOSFET comprises a gate and a top region;
said third vertical MOSFET is spaced sufficiently close to said second vertical MOSFET such that said gate of said third vertical MOSFET and said gate of said second vertical MOSFET are merged between said third vertical MOSFET and said second vertical MOSFET;
said second contact is disposed on a top surface of said gate merged between said third vertical MOSFET and said second vertical MOSFET; and
said third common node is coupled to said second contact.

13. The 3D inverter of claim 1, further comprising:
a third vertical MOSFET;
a fourth vertical MOSFET;
a second contact; and wherein:
said third vertical MOSFET comprises a gate and a top region;

said fourth vertical MOSFET comprises a gate and a top region;
said third vertical MOSFET is spaced sufficiently close to said second vertical MOSFET such that said gate of said third vertical MOSFET and said gate of said second vertical MOSFET are merged between said third vertical MOSFET and said second vertical MOSFET;
said fourth vertical MOSFET is spaced sufficiently close to said third vertical MOSFET such that said gate of said third vertical MOSFET and said gate of said fourth vertical MOSFET are merged between said third vertical MOSFET and said fourth vertical MOSFET;
said second contact is disposed on a top surface of said gate merged between said third vertical MOSFET and said fourth vertical MOSFET; and
said third common node is coupled to said second contact.

14. A 3D inverter, comprising:
a vertical n-MOSFET with a gate, a source region, and a drain region;
a p-MOSFET with a gate, a source region, and a drain region;
an interconnect line disposed below said 3D inverter;
a metal line disposed above said 3D inverter;
and wherein:
said drain region of said p-MOSFET and said drain region of said vertical n-MOSFET are coupled to an output of said 3D inverter;
said source region of said vertical n-MOSFET is coupled to a first common node;
said source region of said p-MOSFET is coupled to a second common node; and
said gate of said vertical n-MOSFET and said gate of said p-MOSFET are coupled to an input of said 3D inverter.

15. The 3D inverter of claim 14, wherein:
said source region and said drain region of said vertical n-MOSFET are a top region and a bottom region, respectively, of said vertical n-MOSFET.

16. The 3D inverter of claim 15, wherein
said interconnect line couples said bottom region of said vertical n-MOSFET to said bottom region of said vertical p-MOSFET; and
said metal line couples said top region of said vertical n-MOSFET to said first common node.

17. The 3D inverter of claim 14, wherein:
said source region and said drain region of said vertical n-MOSFET are a bottom region and a top region, respectively, of said vertical n-MOSFET.

18. The 3D inverter of claim 14, wherein:
said p-MOSFET is constructed as a planar MOSFET below said vertical n-MOSFET.

19. The 3D inverter of claim 14, wherein:
said p-MOSFET is constructed as a planar MOSFET above said vertical n-MOSFET.

20. The 3D inverter of claim 19, wherein:
said p-MOSFET is constructed as a thin-film transistor.

21. The 3D inverter of claim 14, wherein:
said p-MOSFET is constructed as a vertical p-MOSFET at a different level than said vertical n-MOSFET.

22. The 3D inverter of claim 14, wherein:
said p-MOSFET is constructed as a vertical p-MOSFET at a same level as said vertical n-MOSFET; and
said vertical p-MOSFET comprises a gate, a bottom region, and a top region.

23. The 3D inverter of claim 22, wherein:
said source region, said drain region, and said gate of said p-MOSFET are said top region, said bottom region, and said gate, respectively, of said vertical p-MOSFET.

24. The 3D inverter of claim 22, wherein:
said source region, said drain region, and said gate of said p-MOSFET are said bottom region, said top region, and said gate, respectively, of said vertical p-MOSFET.

25. The 3D inverter of claim 22, further comprising:
a modified vertical MOSFET with a gate and a top region;
a contact; and wherein:
said gate of said modified vertical MOSFET extends upward to fully cover said top region of said modified vertical MOSFET such that said top region of said modified vertical MOSFET is rendered inaccessible;
said modified vertical MOSFET is disposed sufficiently close to said vertical n-MOSFET such that said gate of said modified vertical MOSFET and said gate of said vertical n-MOSFET are merged between said modified vertical MOSFET and said vertical n-MOSFET;
said contact is disposed on said gate of said modified vertical MOSFET; and
said input of said 3D inverter is coupled to said contact.

26. The 3D inverter of claim 22, further comprising:
a modified vertical MOSFET with a gate and a top region;
a contact; and wherein:
said gate of said modified vertical MOSFET extends upward to fully cover said top region of said modified vertical MOSFET such that said top region of said modified vertical MOSFET is rendered inaccessible;
said modified vertical MOSFET is disposed sufficiently close to said vertical p-MOSFET such that said gate of said modified vertical MOSFET and said gate of said vertical p-MOSFET are merged between said modified vertical MOSFET and said vertical p-MOSFET;
said contact is disposed on said gate of said modified vertical MOSFET; and
said input of said 3D inverter is coupled to said contact.

27. The 3D inverter of claim 22, further comprising:
a modified vertical MOSFET with a gate and a top region;
a contact; and wherein:
said gate of said modified vertical MOSFET extends upward to fully cover said top region of said modified vertical MOSFET such that said top region of said modified vertical MOSFET is rendered inaccessible;
said modified vertical MOSFET is disposed between said vertical n-MOSFET and said vertical p-MOSFET, and is sufficiently close to said vertical n-MOSFET and to said vertical p-MOSFET such that said gate of said modified vertical MOSFET and said gate of said vertical n-MOSFET are merged between said modified vertical MOSFET and said vertical n-MOSFET, and such that said gate of said modified vertical MOSFET and said gate of said vertical p-MOSFET are merged between said modified vertical MOSFET and said vertical p-MOSFET;
said contact is disposed on said gate of said modified vertical MOSFET; and
said input of said 3D inverter is coupled to said contact.

28. The 3D inverter of claim 22, further comprising:
an extended gate region;
a contact; and wherein:
  said extended gate region is disposed between said vertical n-MOSFET and said vertical p-MOSFET and extends horizontally from a bottom edge of said gate of said vertical n-MOSFET and from a bottom edge of said gate of said vertical p-MOSFET;
  said contact is disposed on said extended gate region; and
  said input of said 3D inverter is coupled to said contact.

29. The 3D inverter of claim 22, further comprising:
an extended gate region;
a contact; and wherein:
  said extended gate region extends horizontally from a bottom edge of said gate of said vertical n-MOSFET;
  said vertical n-MOSFET is sufficiently close to said vertical p-MOSFET such that said gate of said vertical n-MOSFET and said gate of said vertical p-MOSFET are merged between said vertical n-MOSFET and said vertical p-MOSFET;
  said contact is disposed on said extended gate region; and
  said input of said 3D inverter is coupled to said contact.

30. The 3D inverter of claim 22, further comprising:
an extended gate region;
a contact; and wherein:
  said extended gate region extends horizontally from a bottom edge of said gate of said vertical p-MOSFET;
  said vertical n-MOSFET is sufficiently close to said vertical p-MOSFET such that said gate of said vertical n-MOSFET and said gate of said vertical p-MOSFET are merged between said vertical n-MOSFET and said vertical p-MOSFET;
  said contact is disposed on said extended gate region; and
  said input of said 3D inverter is coupled to said contact.

31. The 3D inverter of claim 22, further comprising:
a pair of vertical MOSFET's, each with a gate;
a contact; and wherein:
  said pair of vertical MOSFET's are disposed between said vertical n-MOSFET and said vertical p-MOSFET;
  said vertical n-MOSFET, said pair of vertical MOSFET's, and said vertical p-MOSFET are formed with a sufficiently narrow spacing such that said gate is merged between immediate neighbors;
  said contact is disposed on said gate merged between said pair of vertical MOSFET's; and
  said input of said 3D inverter is coupled to said contact.

32. The 3D inverter of claim 22, further comprising:
a pair of vertical MOSFET's, each with a gate;
a contact; and wherein:
  said pair of vertical MOSFET's are disposed next to said vertical n-MOSFET but away from said vertical p-MOSFET;
  said pair of vertical MOSFET's, said vertical n-MOSFET, and said vertical p-MOSFET are formed with a sufficiently narrow spacing such that said gate is merged between immediate neighbors;
  said contact is disposed on said gate merged between said pair of vertical MOSFET's; and
  said input of said 3D inverter is coupled to said contact.

33. The 3D inverter of claim 22, further comprising:
a pair of vertical MOSFET's, each with a gate;
a contact; and wherein:
  said pair of vertical MOSFET's are disposed next to said vertical p-MOSFET but away from said vertical n-MOSFET;
  said pair of vertical MOSFET's, said vertical p-MOSFET, and said vertical n-MOSFET are formed with a sufficiently narrow spacing such that said gate is merged between immediate neighbors;
  said contact is disposed on said gate merged between said pair of vertical MOSFET's; and
  said input of said 3D inverter is coupled to said contact.

34. The 3D inverter of claim 22, wherein:
said vertical n-MOSFET and said vertical p-MOSFET are constructed with semiconductor pillars that are formed simultaneously but doped separately.

35. A 3D sense amplifier for a 3D memory, comprising:
a first 3D inverter with an input and an output;
a second 3D inverter with an input and an output;
a first bit line carrying a first signal;
a second bit line carrying a second signal; and wherein:
  each of said first 3D inverter and said second 3D inverter comprises:
    a first vertical MOSFET with a gate, a source region, and a drain region; and
    a second vertical MOSFET with a gate, a source region, and a drain region;
  said first bit line is coupled to said input of said first 3D inverter and to said output of said second 3D inverter;
  said second bit line is coupled to said input of said second 3D inverter and to said output of said first 3D inverter;
  said input of said first 3D inverter is coupled to said gate of first vertical MOSFET of said first 3D inverter;
  said input of said second 3D inverter is coupled to said gate of first vertical MOSFET of said second 3D inverter;
  said source region of said first vertical MOSFET of said first 3D inverter and said source region of said first vertical MOSFET of said second 3D inverter are coupled to a first common node;
  said drain region of said second vertical MOSFET of said first 3D inverter and said drain region of said second vertical MOSFET of said second 3D inverter are coupled to a second common node;
  said gate of said second vertical MOSFET of said first 3D inverter and said gate of said second vertical MOSFET of said second 3D inverter are coupled to a third common node;
  said drain region of said first vertical MOSFET of said first 3D inverter and said source region of said second vertical MOSFET of said first 3D inverter are coupled to said output of said first 3D inverter;
  said drain region of said first vertical MOSFET of said second 3D inverter and said source region of said second vertical MOSFET of said second 3D inverter are coupled to said output of said second 3D inverter; and
  said first signal is configured to respond to charges stored in a cell of said 3D memory during a second phase of a memory operation of said 3D memory.

36. The 3D sense amplifier of claim 35, wherein:
said source region and said drain region of said first vertical MOSFET of said first 3D inverter are a top region and a bottom region, respectively, of said first vertical MOSFET of said first 3D inverter; and said source region and said drain region of said second vertical MOSFET of said first 3D inverter are a bottom region and a top region, respectively, of said second vertical MOSFET of said first 3D inverter.

37. The 3D sense amplifier of claim 36, further comprising:
   an interconnect line disposed below said 3D sense amplifier;
   a metal line disposed above said 3D sense amplifier; and wherein:
      said interconnect line couples said bottom region of said first vertical MOSFET of said first 3D inverter to said bottom region of said second MOSFET of said first 3D inverter;
      a first piece of said metal line couples said top region of said first vertical MOSFET of said first 3D inverter to said first common node; and
      a second piece of said metal line couples said top region of said second vertical MOSFET of said first 3D inverter to said second common node.

38. The 3D sense amplifier of claim 35, wherein:
   said source region and said drain region of said first vertical MOSFET of said first 3D inverter are a bottom region and a top region, respectively, of said first vertical MOSFET of said first 3D inverter; and
   said source region and said drain region of said second vertical MOSFET of said first 3D inverter are a top region and a bottom region, respectively, of said second vertical MOSFET of said first 3D inverter.

39. The 3D sense amplifier of claim 38, further comprising:
   an interconnect line disposed below said 3D sense amplifier;
   a metal line disposed above said 3D sense amplifier; and wherein:
      said metal line couples said top region of said first vertical MOSFET of said first 3D inverter to said top region of said second MOSFET of said first 3D inverter;
      a first piece of said interconnect line couples said bottom region of said first vertical MOSFET of said first 3D inverter to said first common node; and
      a second piece of said interconnect line couples said bottom region of said second vertical MOSFET of said first 3D inverter to said second common node.

40. The 3D sense amplifier of claim 35, wherein:
   said source region and said drain region of said first vertical MOSFET of said second 3D inverter are a top region and a bottom region, respectively, of said vertical first vertical MOSFET of said second 3D inverter; and
   said source region and said drain region of said second vertical MOSFET of said second 3D inverter are a bottom region and a top region, respectively, of said vertical second vertical MOSFET of said second 3D inverter.

41. The 3D sense amplifier of claim 40, further comprising:
   an interconnect line disposed below said 3D sense amplifier;
   a metal line disposed above said 3D sense amplifier; and wherein:
      said interconnect line couples said bottom region of said first vertical MOSFET of said second 3D inverter to said bottom region of said second MOSFET of said second 3D inverter;
      a first piece of said metal line couples said top region of said first vertical MOSFET of said second 3D inverter to said first common node; and
      a second piece of said metal line couples said top region of said second vertical MOSFET of said second 3D inverter to said second common node.

42. The 3D sense amplifier of claim 35, wherein:
   said source region and said drain region of said first vertical MOSFET of said second 3D inverter are a bottom region and a top region, respectively, of said vertical first vertical MOSFET of said second 3D inverter; and
   said source region and said drain region of said second vertical MOSFET of said second 3D inverter are a top region and a bottom region, respectively, of said vertical second vertical MOSFET of said second 3D inverter.

43. The 3D sense amplifier of claim 42, further comprising:
   an interconnect line disposed below said 3D sense amplifier;
   a metal line disposed above said 3D sense amplifier; and wherein:
      said metal line couples said top region of said first vertical MOSFET of said second 3D inverter to said top region of said second MOSFET of said second 3D inverter;
      a first piece of said interconnect line couples said bottom region of said first vertical MOSFET of said second 3D inverter to said first common node; and
      a second piece of said interconnect line couples said bottom region of said second vertical MOSFET of said second 3D inverter to said second common node.

44. The 3D sense amplifier of claim 35, wherein:
   said first signal and said second signal are configured to be pre-charged to a bit-line pre-charge voltage during a first phase of said memory operation.

45. The 3D sense amplifier of claim 35, wherein:
   said second signal is configured to be fixed at a bit-line pre-charge voltage while said first signal responds to said stored charges.

46. The 3D sense amplifier of claim 35, wherein:
   said second signal is configured to respond to said stored charges so as to be complementary to said first signal during said second phase of said memory operation.

47. The 3D sense amplifier of claim 35, wherein:
   said second common node and said third common node are identical.

48. The 3D sense amplifier of claim 35, wherein:
   said third common node is coupled to a higher voltage than said second common node during said memory operation.

49. The 3D sense amplifier of claim 35, further comprising:
   a sense-enable circuit with an input and an output; wherein:
      said output of said sense-enable circuit is coupled to said first common node;
      said sense-enable circuit is configured to drive said output of said sense-enable circuit to a first level when said input of said sense-enable circuit is driven to a sense-enable level; and said sense-enable circuit is configured to drive said output of said sense-enable circuit to a second level when said input of said sense-enable circuit is driven to a sense-disable level.

50. The 3D sense amplifier of claim 49, wherein:
said first level is equal to or substantially close to a low reference voltage; and
said second level is equal to or substantially close to a high reference voltage.

51. The 3D sense amplifier of claim 49, wherein:
said sense-enable level corresponds to logic 1; and
said sense-disable level corresponds to logic 0.

52. The 3D sense amplifier of claim 49, wherein:
said sense-enable circuit comprises a MOSFET with a gate, source region, and a drain region;
said gate of said MOSFET of said sense-enable circuit is coupled to said input of said sense-enable circuit;
said drain region of said MOSFET of said sense-enable circuit is coupled to said output of said sense-enable circuit; and
said source region of said MOSFET of said sense-enable circuit is coupled to a low reference voltage.

53. The 3D sense amplifier of claim 35, further comprising:
a sense-enable circuit with an input and an output; wherein:
said output of said sense-enable circuit is coupled to said second common node;
said sense-enable circuit is configured to drive said output of said sense-enable circuit to a first level when said input of said sense-enable circuit is driven to a sense-enable level; and
said sense-enable circuit is configured to drive said output of said sense-enable circuit to a second level when said input of said sense-enable circuit is driven to a sense-disable level.

54. The 3D sense amplifier of claim 53, wherein:
said first level is equal to or substantially close to a high reference voltage; and
said second level is equal to or substantially close to a low reference voltage.

55. The 3D sense amplifier of claim 53, wherein:
said sense-enable circuit comprises a MOSFET with a gate, source region, and a drain region;
said gate of said MOSFET of said sense-enable circuit is coupled to said input of said sense-enable circuit;
said source region of said MOSFET of said sense-enable circuit is coupled to said output of said sense-enable circuit; and
said drain region of said MOSFET of said sense-enable circuit is coupled to a high reference voltage.

56. The 3D sense amplifier of claim 35, further comprising:
a sense-enable circuit with an input and an output; wherein:
said output of said sense-enable circuit is coupled to said third common node;
said sense-enable circuit is configured to drive said output of said sense-enable circuit to a first level when said input of said sense-enable circuit is driven to a sense-enable level; and
said sense-enable circuit is configured to drive said output of said sense-enable circuit to a second level when said input of said sense-enable circuit is driven to a sense-disable level.

57. The 3D sense amplifier of claim 35, further comprising:
a first multiplexer with an input, a first output, and a second output;
a second multiplexer with an input, a first output, and a second output; and wherein:
said input of said first multiplexer and said input of said second multiplexer are coupled to a column select;
said first output of said first multiplexer is coupled to said first bit line;
said first output of said second multiplexer is coupled to said second bit line; and
said column select, when driven to a first level, is configured to relay said first output of said first multiplexer and said first output of said second multiplexer to said second output of said first multiplexer and said second output of said second multiplexer, respectively.

58. The 3D sense amplifier of claim 57, wherein:
each of said first multiplexer and said second multiplexer comprises an n-MOSFET with a gate, a first region, and a second region;
said gate of said first multiplexer is coupled to said input of said first multiplexer;
said gate of said second multiplexer is coupled to said input of said second multiplexer;
said first region of said first multiplexer is coupled to said first output of said first multiplexer;
said first region of said second multiplexer is coupled to said first output of said second multiplexer;
said second region of said first multiplexer is coupled to said second output of said first multiplexer; and
said second region of said second multiplexer is coupled to said second output of said second multiplexer.

59. The 3D sense amplifier of claim 35, further comprising:
an equalizer with an input, a first output, and a second output; wherein:
said input of said equalizer is coupled to a equalization signal;
said first output of said equalizer is coupled to said first bit line;
said second output of said equalizer is coupled to said second bit line; and
said equalization signal is configured to turn on said equalizer so as to put said first bit line and said second bit line to a same voltage, before said first bit line and said second bit line are pre-charged during said memory operation.

60. The 3D sense amplifier of claim 59, wherein:
said equalizer comprises a MOSFET with a gate, a first doping region, and a second doping region;
said gate of said MOSFET of said equalizer is coupled to said input of said equalizer;
said first doping region of said MOSFET of said equalizer is coupled to said first bit line; and
said second doping region of said MOSFET of said equalizer is coupled to said second bit line.

61. The 3D sense amplifier of claim 35, further comprising:
a first modified vertical MOSFET with a gate and a top region;
a second modified vertical MOSFET with a gate and a top region;
a third modified vertical MOSFET with a gate and a top region;

a first contact;
a second contact;
a third contact; and wherein:
said gate of said first modified vertical MOSFET extends upward to fully cover said top region of said first modified vertical MOSFET such that said top region of said first modified vertical MOSFET is rendered inaccessible;
said gate of said second modified vertical MOSFET extends upward to fully cover said top region of said second modified vertical MOSFET such that said top region of said second modified vertical MOSFET is rendered inaccessible;
said gate of said third modified vertical MOSFET extends upward to fully cover said top region of said third modified vertical MOSFET such that said top region of said third modified vertical MOSFET is rendered inaccessible;
said first modified vertical MOSFET is sufficiently close to said first vertical MOSFET of said first 3D inverter such that said gate of said first modified vertical MOSFET and said gate of said first vertical MOSFET of said first 3D inverter are merged between said first modified vertical MOSFET and said first vertical MOSFET of said first 3D inverter;
said second modified vertical MOSFET is sufficiently close to said first vertical MOSFET of said second 3D inverter such that said gate of said second modified vertical MOSFET and said gate of said first vertical MOSFET of said second 3D inverter are merged between said second modified vertical MOSFET and said first vertical MOSFET of said second 3D inverter;
said first bit line is coupled to said first contact;
said first contact is disposed on said gate of said first modified vertical MOSFET;
said second bit line is coupled to said second contact;
said second contact is disposed on said gate of said second modified vertical MOSFET;
said third common node is coupled to said third contact; and
said third contact is disposed on said gate of said third modified vertical MOSFET.

62. The 3D sense amplifier of claim 61, wherein:
said third modified vertical MOSFET is disposed between said second vertical MOSFET of said first 3D inverter and said second vertical MOSFET of said second 3D inverter;
said third modified vertical MOSFET is sufficiently close to said second vertical MOSFET of said first 3D inverter such that said gate of said third modified vertical MOSFET and said gate of said second vertical MOSFET of said first 3D inverter are merged between said third modified vertical MOSFET and said second vertical MOSFET of said first 3D inverter; and
said third modified vertical MOSFET is sufficiently close to said second vertical MOSFET of said second 3D inverter such that said gate of said third modified vertical MOSFET and said gate of said second vertical MOSFET of said second 3D inverter are merged between said third modified vertical MOSFET and said second vertical MOSFET of said second 3D inverter.

63. The 3D sense amplifier of claim 61, wherein:
said third modified vertical MOSFET is disposed on a side of said second vertical MOSFET of said first 3D inverter and away from said second vertical MOSFET of said second 3D inverter;
said third modified vertical MOSFET is sufficiently close to said second vertical MOSFET of said first 3D inverter such that said gate of said third modified vertical MOSFET and said gate of said second vertical MOSFET of said first 3D inverter are merged between said third modified vertical MOSFET and said second vertical MOSFET of said first 3D inverter; and
said second vertical MOSFET of said first 3D inverter is sufficiently close to said second vertical MOSFET of said second 3D inverter such that said gate of said second vertical MOSFET of said first 3D inverter and said gate of said second vertical MOSFET of said second 3D inverter are merged between said second vertical MOSFET of said first 3D inverter and said second vertical MOSFET of said second 3D inverter.

64. The 3D sense amplifier of claim 61, wherein:
said third modified vertical MOSFET is disposed on a side of said second vertical MOSFET of said second 3D inverter and away from said second vertical MOSFET of said first 3D inverter;
said third modified vertical MOSFET is sufficiently close to said second vertical MOSFET of said second 3D inverter such that said gate of said third modified vertical MOSFET and said gate of said second vertical MOSFET of said second 3D inverter are merged between said third modified vertical MOSFET and said second vertical MOSFET of said second 3D inverter; and
said second vertical MOSFET of said first 3D inverter is sufficiently close to said second vertical MOSFET of said second 3D inverter such that said gate of said second vertical MOSFET of said first 3D inverter and said gate of said second vertical MOSFET of said second 3D inverter are merged between said second vertical MOSFET of said first 3D inverter and said second vertical MOSFET of said second 3D inverter.

65. The 3D sense amplifier of claim 35, further comprising:
a first extended gate region;
a second extended gate region;
a third extended gate region;
a first contact;
a second contact;
a third contact; and wherein:
said first extended gate region extends horizontally from a bottom edge of said gate of said first vertical MOSFET of said first 3D inverter;
said second extended gate region extends horizontally from a bottom edge of said gate of said first vertical MOSFET of said second 3D inverter;
said first bit line is coupled to said first contact;
said first contact is disposed on said first extended gate region;
said second bit line is coupled to said second contact;
said second contact is disposed on said second extended gate region;
said third common node is coupled to said third contact; and
said third contact is disposed on said third extended gate region.

66. The 3D sense amplifier of claim 65, wherein:
said third extended gate region is disposed between said second vertical MOSFET of said first 3D inverter and said second vertical MOSFET of said second 3D inverter, and extends horizontally from a bottom edge of said gate of said second vertical MOSFET of said first 3D inverter and from a bottom edge of said gate of said second vertical MOSFET of said second 3D inverter.

67. The 3D sense amplifier of claim 65, wherein:
said third extended gate region is disposed on a side of said second vertical MOSFET of said first 3D inverter and away from said second vertical MOSFET of said second 3D inverter, and extends horizontally from a bottom edge of said gate of said second vertical MOSFET of said first 3D inverter; and
said second vertical MOSFET of said first 3D inverter is sufficiently close to said second vertical MOSFET of said second 3D inverter such that said gate of said second vertical MOSFET of said first 3D inverter and said gate of said second vertical MOSFET of said second 3D inverter are merged between said second vertical MOSFET of said first 3D inverter and said second vertical MOSFET of said second 3D inverter.

68. The 3D sense amplifier of claim 65, wherein:
said third extended gate region is disposed on a side of said second vertical MOSFET of said second 3D inverter and away from said second vertical MOSFET of said first 3D inverter, and extends horizontally from a bottom edge of said gate of said second vertical MOSFET of said second 3D inverter; and
said second vertical MOSFET of said first 3D inverter is sufficiently close to said second vertical MOSFET of said second 3D inverter such that said gate of said second vertical MOSFET of said first 3D inverter and said gate of said second vertical MOSFET of said second 3D inverter are merged between said second vertical MOSFET of said first 3D inverter and said second vertical MOSFET of said second 3D inverter.

69. The 3D sense amplifier of claim 35, further comprising:
a first pair of vertical MOSFET's, each with a gate;
a second pair of vertical MOSFET's, each with a gate;
a third pair of vertical MOSFET's, each with a gate;
a first contact;
a second contact;
a third contact; and wherein:
said first pair of vertical MOSFET's are disposed sufficiently close to said first vertical MOSFET of said first 3D inverter such that said gate is merged between immediate neighbors;
said second pair of vertical MOSFET's are disposed sufficiently close to said first vertical MOSFET of said second 3D inverter such that said gate is merged between immediate neighbors;
said third pair of vertical MOSFET's are spaced sufficiently close such that said gate is merged between said third pair of vertical MOSFET's;
said first bit line is coupled to said first contact;
said first contact is disposed on said gate merged between said first pair of vertical MOSFET's;
said second bit line is coupled to said second contact;
said second contact is disposed on said gate merged between said second pair of vertical MOSFET's;
said third common node is coupled to said third contact; and
said third contact is disposed on said gate merged between said third pair of vertical MOSFET's.

70. The 3D sense amplifier of claim 69, wherein:
said third pair of vertical MOSFET's are disposed between said second vertical MOSFET of said first 3D inverter and said second vertical MOSFET of said second 3D inverter; and
said second vertical MOSFET of said first 3D inverter, said third pair of vertical MOSFET's, and said second vertical MOSFET of said second 3D inverter are formed along a line and are spaced sufficiently close such that said gate is merged between immediate neighbors.

71. The 3D sense amplifier of claim 69, wherein:
said third pair of vertical MOSFET's are disposed on a side of said second vertical MOSFET of said first 3D inverter and away from said second vertical MOSFET of said second 3D inverter; and
said third pair of vertical MOSFET's, said second vertical MOSFET of said first 3D inverter, and said second vertical MOSFET of said second 3D inverter are formed along a line and are spaced sufficiently close such that said gate is merged between immediate neighbors.

72. The 3D sense amplifier of claim 69, wherein:
said third pair of vertical MOSFET's are disposed on a side of said second vertical MOSFET of said second 3D inverter and away from said second vertical MOSFET of said first 3D inverter; and
said third pair of vertical MOSFET's, said second vertical MOSFET of said second 3D inverter, and said second vertical MOSFET of said first 3D inverter are formed along a line and are spaced sufficiently close such that said gate is merged between immediate neighbors.

73. A 3D sense amplifier for a 3D memory, comprising:
a first 3D inverter with an input and an output;
a second 3D inverter with an input and an output;
a first bit line carrying a first signal;
a second bit line carrying a second signal; and wherein:
each of said first 3D inverter and said second 3D inverter comprises:
a vertical n-MOSFET with a gate, a source region, and a drain region; and
a p-MOSFET with a gate, a source region, and a drain region;
said first bit line is coupled to said input of said first 3D inverter and to said output of said second 3D inverter;
said second bit line is coupled to said input of said second 3D inverter and to said output of said first 3D inverter;
said gate of said vertical n-MOSFET of said first 3D inverter and said gate of said p-MOSFET of said first 3D inverter are coupled to said input of said first 3D inverter;
said gate of said vertical n-MOSFET of said second 3D inverter and said gate of said p-MOSFET of said second 3D inverter are coupled to said input of said second 3D inverter;
said drain region of said vertical n-MOSFET of said first 3D inverter and said drain region of said p-MOSFET of said first 3D inverter are coupled to said output of said first 3D inverter;
said drain region of said vertical n-MOSFET of said second 3D inverter and said drain region of said p-MOSFET of said second 3D inverter are coupled to said output of said second 3D inverter;
said source region of said vertical n-MOSFET of said first 3D inverter and said source region of said vertical n-MOSFET of said second 3D inverter are coupled to a first common node;

said source region of said p-MOSFET of said first 3D inverter and said source region of said p-MOSFET of said second 3D inverter are coupled to a second common node; and said first signal is configured to respond to charges stored in a cell of said 3D memory during a second phase of a memory operation of said 3D memory.

74. The 3D sense amplifier of claim 73, wherein:
said source region and said drain region of said vertical n-MOSFET of said first 3D inverter are a top region and a bottom region, respectively, of said vertical n-MOSFET of said first 3D inverter.

75. The 3D sense amplifier of claim 74, further comprising:
an interconnect line disposed below said 3D sense amplifier;
a metal line disposed above said 3D sense amplifier; and wherein:
said metal line couples said top region of said vertical n-MOSFET of said first 3D inverter to said first common node; and
said interconnect line couples said bottom region of said vertical n-MOSFET of said first 3D inverter to said output of said first 3D inverter.

76. The 3D sense amplifier of claim 73, wherein:
said source region and said drain region of said vertical n-MOSFET of said first 3D inverter are a bottom region and a top region, respectively, of said vertical n-MOSFET of said first 3D inverter.

77. The 3D sense amplifier of claim 76, further comprising:
an interconnect line disposed below said 3D sense amplifier;
a metal line disposed above said 3D sense amplifier; and wherein:
said metal line couples said top region of said vertical n-MOSFET of said first 3D inverter to said output of said first 3D inverter; and
said interconnect line couples said bottom region of said vertical n-MOSFET of said first 3D inverter to said first common node.

78. The 3D sense amplifier of claim 73, wherein:
said source region and said drain region of said vertical n-MOSFET of said second 3D inverter are a top region and a bottom region, respectively, of said vertical n-MOSFET of said second 3D inverter.

79. The 3D sense amplifier of claim 78, further comprising:
an interconnect line disposed below said 3D sense amplifier;
a metal line disposed above said 3D sense amplifier; and wherein:
said metal line couples said top region of said vertical n-MOSFET of said second 3D inverter to said first common node; and
said interconnect line couples said bottom region of said vertical n-MOSFET of said second 3D inverter to said output of said second 3D inverter.

80. The 3D sense amplifier of claim 73, wherein:
said source region and said drain region of said vertical n-MOSFET of said second 3D inverter are a bottom region and a top region, respectively, of said vertical n-MOSFET of said second 3D inverter.

81. The 3D sense amplifier of claim 80, further comprising:
an interconnect line disposed below said 3D sense amplifier;
a metal line disposed above said 3D sense amplifier; and wherein:
said metal line couples said top region of said vertical n-MOSFET of said second 3D inverter to said output of said second 3D inverter; and
said interconnect line couples said bottom region of said vertical n-MOSFET of said second 3D inverter to said first common node.

82. The 3D sense amplifier of claim 73, wherein:
said first signal and said second signal are configured to be pre-charged at a bit-line pre-charge voltage during a first phase of said memory operation.

83. The 3D sense amplifier of claim 73, wherein:
said second signal is configured to be fixed at a bit-line pre-charge voltage while said first signal responds to said stored charges.

84. The 3D sense amplifier of claim 73, wherein:
said second signal is configured to respond to said stored charges so as to be complementary to said first signal during said second phase of said memory operation.

85. The 3D sense amplifier of claim 73, further comprising:
a sense-enable circuit with an input and an output; wherein:
said output of said sense-enable circuit is coupled to said first common node;
said sense-enable circuit is configured to drive said output of said sense-enable circuit to a first level when said input of said sense-enable circuit is driven to a sense-enable level; and
said sense-enable circuit is configured to drive said output of said sense-enable circuit to a second level when said input of said sense-enable circuit is driven to a sense-disable level.

86. The 3D sense amplifier of claim 85, wherein:
said first level is equal to or substantially close to a low reference voltage,
said second level is equal to or substantially close to a high reference voltage.

87. The 3D sense amplifier of claim 85, wherein:
said sense-enable level corresponds to logic 1; and
said sense-disable level corresponds to logic 0.

88. The 3D sense amplifier of claim 85, wherein:
said sense-enable circuit comprises an n-MOSFET with a gate, a source region, and a drain region;
said gate of said n-MOSFET of said sense-enable circuit is coupled to said input of said sense-enable circuit;
said source region of said n-MOSFET of said sense-enable circuit is coupled to a low reference voltage; and
said drain region of said n-MOSFT of said sense-enable circuit is coupled to said output of said sense-enable circuit.

89. The 3D sense amplifier of claim 88, wherein:
said n-MOSFET of said sense-enable circuit is constructed as a vertical n-MOSFET with a gate, a bottom region, and a top region.

90. The 3D sense amplifier of claim 73, further comprising:
a sense-enable circuit with an input and an output; wherein:
said output of said sense-enable circuit is coupled to said second common node;

said sense-enable circuit is configured to drive said output of said sense-enable circuit to a first level when said input of said sense-enable circuit is driven to a sense-enable level; and said sense-enable circuit is configured to drive said output of said sense-enable circuit to a second level when said input of said sense-enable circuit is driven to a sense-disable level.

91. The 3D sense amplifier of claim 90, wherein:
said first level is equal to or substantially close to a high reference voltage,
said second level is equal to or substantially close to a low reference voltage.

92. The 3D sense amplifier of claim 90, wherein:
said sense-enable level corresponds to logic 0; and
said sense-disable level corresponds to logic 1.

93. The 3D sense amplifier of claim 90, wherein:
said sense-enable circuit comprises a p-MOSFET with a gate, a source region, and a drain region;
said gate of said p-MOSFET of said sense-enable circuit is coupled to said input of said sense-enable circuit;
said source region of said p-MOSFET of said sense-enable circuit is coupled to a high reference voltage; and
said drain region of said p-MOSFT of said sense-enable circuit is coupled to said output of said sense-enable circuit.

94. The 3D sense amplifier of claim 93, wherein:
said p-MOSFET of said sense-enable circuit is constructed as a vertical p-MOSFET with a gate, a bottom region, and a top region; and
said gate, said bottom region, and said top region of said vertical p-MOSFET of said sense-enable circuit is said gate, said drain region, and said source region, respectively, of said p-MOSFET of said sense-enable circuit.

95. The 3D sense amplifier of claim 73, further comprising:
a first multiplexer with an input, a first output, and a second output;
a second multiplexer with an input, a first output, and a second output; and wherein:
said input of said first multiplexer and said input of said second multiplexer are coupled to a column select;
said first output of said first multiplexer is coupled to said first bit line; and
said first output of said second multiplexer is coupled to said second bit line.

96. The 3D sense amplifier of claim 95, wherein:
each of said first multiplexer and said second multiplexer comprises an n-MOSFET with a gate, a first region, and a second region;
said gate of said first multiplexer is coupled to said input of said first multiplexer;
said gate of said second multiplexer is coupled to said input of said second multiplexer;
said first region of said first multiplexer is coupled to said first output of said first multiplexer;
said first region of said second multiplexer is coupled to said first output of said second multiplexer;
said second region of said first multiplexer is coupled to said second output of said first multiplexer; and
said second region of said second multiplexer is coupled to said second output of said second multiplexer.

97. The 3D sense amplifier of claim 73, further comprising:
an equalizer with an input, a first output, and a second output; wherein:
said input of said equalizer is coupled to an equalization signal;
said first output of said equalizer is coupled to said first bit line;
said second output of said equalizer is coupled to said second bit line; and
said equalization signal, when said first bit line and said second bit lines are selected, is configured to turn on said equalizer so that said first bit line and said second bit line are driven to a same voltage before said first bit line and said second bit line are pre-charged.

98. The 3D sense amplifier of claim 97, wherein:
said equalizer comprises an n-MOSFET with a gate, a first doping region, and a second doping region; wherein:
said gate of said n-MOSFET of said equalizer is coupled to said input of said equalizer;
said first doping region of said n-MOSFET of said equalizer is coupled to said first output of said equalizer; and
said second doping region of said n-MOSFET of said equalizer is coupled to said second output of said equalizer.

99. The 3D sense amplifier of claim 98, wherein:
said equalizer further comprises:
an internal input; and
a p-MOSFET with a gate, a first doping region, and a second doping region; wherein:
said gate of said p-MOSFET of said equalizer is coupled to said second input of said equalizer;
said first doping region of said n-MOSFET of said equalizer is coupled to said first output of said equalizer;
said second doping region of said n-MOSFET of said equalizer is coupled to said second output of said equalizer; and
said internal input of said equalizer is coupled to an internal signal complementary to said equalization signal.

100. The 3D sense amplifier of claim 73, wherein:
said p-MOSFET of each of said first 3D inverter and said second 3D inverter is constructed as a planar MOSFET below said vertical n-MOSFET.

101. The 3D sense amplifier of claim 73, wherein:
said p-MOSFET of each of said first 3D inverter and said second 3D inverters is constructed as a planar MOSFET above said vertical n-MOSFET.

102. The 3D sense amplifier of claim 101, wherein:
said p-MOSFET of each of said first 3D inverter and said second 3D inverters is constructed as a thin-film transistor.

103. The 3D sense amplifier of claim 73, wherein:
said p-MOSFET of each of said first 3D inverter and said second 3D inverters is constructed as a vertical p-MOSFET at a different level than said vertical n-MOSFET.

104. The 3D sense amplifier of claim 73, wherein:
said p-MOSFET of each of said first 3D inverter and said second 3D inverter is constructed as a vertical p-MOSFET at a same level as said vertical n-MOSFET.

105. The 3D sense amplifier of claim 104, wherein:
said vertical p-MOSFET of said first 3D inverter has a bottom region and a top region corresponding to said drain region and said source region, respectively, of said p-MOSFET of said first 3D inverter.

106. The 3D sense amplifier of claim 105, further comprising:
an interconnect line disposed below said 3D sense amplifier;
a metal line disposed above said 3D sense amplifier; and wherein:
said interconnect line couples said bottom region of said vertical p-MOSFET of said first 3D inverter to said output of said second 3D inverter; and
said metal line couples said top region of said vertical p-MOSFET of said first 3D inverter to said second common node.

107. The 3D sense amplifier of claim 104, wherein:
said vertical p-MOSFET of said first 3D inverter has a bottom region and a top region corresponding to said source region and said drain region, respectively, of said p-MOSFET of said first 3D inverter.

108. The 3D sense amplifier of claim 107, further comprising:
an interconnect line disposed below said 3D sense amplifier;
a metal line disposed above said 3D sense amplifier; and wherein:
said metal line couples said top region of said vertical p-MOSFET of said first 3D inverter to said output of said second 3D inverter; and
said interconnect line couples said bottom region of said vertical p-MOSFET of said first 3D inverter to said second common node.

109. The 3D sense amplifier of claim 104, further comprising:
a first modified vertical MOSFET with a gate;
a second modified vertical MOSFET with a gate;
a first contact;
a second contact; and wherein:
said gate of said first modified vertical MOSFET extends upward to fully cover a top region of said first modified vertical MOSFET such that said top region of said first modified vertical MOSFET is rendered inaccessible;
said gate of said second modified vertical MOSFET extends upward to fully cover a top region of said second modified vertical MOSFET such that said top region of said second modified vertical MOSFET is rendered inaccessible;
said first modified vertical MOSFET is spaced sufficiently close to said vertical n-MOSFET of said first 3D inverter such that said gate of said first modified vertical MOSFET and said gate of said vertical n-MOSFET of said first 3D inverter are merged between said first modified vertical MOSFET and said vertical n-MOSFET of said first 3D inverter;
said second modified vertical MOSFET is spaced sufficiently close to said vertical n-MOSFET of said second 3D inverter such that said gate of said second modified vertical MOSFET and said gate of said vertical n-MOSFET of said second 3D inverter are merged between said second modified vertical MOSFET and said vertical n-MOSFET of said second 3D inverter;
said first contact is disposed on said gate of said first modified vertical MOSFET;
said input of said first 3D inverter is coupled to said first contact;
said second contact is disposed on said gate of said second modified vertical MOSFET; and
said input of said second 3D inverter is coupled to said second contact.

110. The 3D sense amplifier of claim 104, further comprising:
a first extended gate region;
a second extended gate region;
a first contact;
a second contact; and wherein:
said first extended gate region is disposed between said vertical n-MOSFET of said first 3D inverter and said vertical p-MOSFET of said first 3D inverter, and extends horizontally from a bottom edge of said gate of said vertical n-MOSFET of said first 3D inverter and from a bottom edge of said gate of said vertical p-MOSFET of said first 3D inverter;
said first contact is disposed on said first extended gate region;
said input of said first 3D inverter is coupled to said first contact;
said second extended gate region is disposed between said vertical n-MOSFET of said second 3D inverter and said vertical p-MOSFET of said second 3D inverter, and extends horizontally from a bottom edge of said gate of said vertical n-MOSFET of said second 3D inverter and from a bottom edge of said gate of said vertical p-MOSFET of said second 3D inverter;
said second contact is disposed on said second extended gate region; and
said input of said second 3D inverter is coupled to said second contact.

111. The 3D sense amplifier of claim 104, further comprising:
a first pair of vertical MOSFET's, each with a gate;
a second pair of vertical MOSFET's, each with a gate;
a first contact;
a second contact; and wherein:
said first pair of vertical MOSFET's are disposed between said vertical n-MOSFET of said first 3D inverter and said vertical p-MOSFET of said first 3D inverter;
said vertical n-MOSFET of said first 3D inverter, said first pair of vertical MOSFET's, and said vertical p-MOSFET of said first 3D inverter are spaced sufficiently close such that said gate is merged between immediate neighbors;
said first contact is disposed on said gate merged between said first pair of vertical MOSFET's;
said input of said first 3D inverter is coupled to said first contact;
said second pair of vertical MOSFET's are disposed between said vertical n-MOSFET of said second 3D inverter and said vertical p-MOSFET of said second 3D inverter;
said vertical n-MOSFET of said second 3D inverter, said second pair of vertical MOSFET's, and said vertical p-MOSFET of said second 3D inverter are spaced sufficiently close such that said gate is merged between immediate neighbors;
said second contact is disposed on said gate merged between said second pair of vertical MOSFET's; and
said input of said second 3D inverter is coupled to said second contact.

112. A 3D sense amplifier for a 3D memory, comprising:
a first input;
a second input;
a first vertical n-MOSFET with a gate, a source region, and a drain region;
a second vertical n-MOSFET with a gate, a source region, and a drain region;
a first vertical p-MOSFET with a gate, a source region, and a drain region;
a second vertical p-MOSFET with a gate, a source region, and a drain region;
a first bit line carrying a first bit-line signal from said 3D memory;
a second bit line carrying a second bit-line signal from said 3D memory; and wherein:
  said first bit line is coupled to said first input of said 3D sense amplifier;
  said second bit line is coupled to said second input of said 3D sense amplifier;
  said first input of said 3D sense amplifier is coupled to said drain region of said first vertical n-MOSFET, said drain region of said first vertical p-MOSFET, said gate of said second vertical n-MOSFET, and said gate of said second vertical p-MOSFET;
  said second input of said 3D sense amplifier is coupled to said drain region of said second vertical n-MOSFET, said drain region of said second vertical p-MOSFET, said gate of said first vertical n-MOSFET, and said gate of said first vertical p-MOSFET;
  said source region of said first vertical n-MOSFET and said source region of said second vertical n-MOSFET are coupled to a first common node;
  said source region of said first vertical p-MOSFET and said source region of said second vertical p-MOSFET are coupled to a second common node; and
  said first bit-line signal is configured to respond to charges stored in a cell of said 3D memory along said first bit line during a second phase of a memory operation of said 3D memory.

113. The 3D sense amplifier of claim 112, wherein:
said source region and said drain region of said first vertical n-MOSFET are a top region and a bottom region, respectively, of said first vertical n-MOSFET.

114. The 3D sense amplifier of claim 113, further comprising:
an interconnect line disposed below said 3D sense amplifier;
a metal line disposed above said 3D sense amplifier; and wherein:
  said interconnect line couples said bottom region of said first vertical n-MOSFET to said first input of said 3D sense amplifier; and
  said metal line couples said top region of said first vertical n-MOSFET to said first common node.

115. The 3D sense amplifier of claim 112, wherein:
said source region and said drain region of said first vertical n-MOSFET are a bottom region and a top region, respectively, of said first vertical n-MOSFET.

116. The 3D sense amplifier of claim 115, further comprising:
an interconnect line disposed below said 3D sense amplifier;
a metal line disposed above said 3D sense amplifier; and wherein:
  said metal line couples said top region of said first vertical n-MOSFET to said first input of said 3D sense amplifier; and
  said interconnect line couples said bottom region of said first vertical n-MOSFET to said first common node.

117. The 3D sense amplifier of claim 112, wherein:
said first bit-line signal and said second bit-line signal are configured to be pre-charged at a bit-line pre-charge voltage during a first phase of a read operation of said 3D memory during a first phase of said memory operation.

118. The 3D sense amplifier of claim 112, wherein:
said second bit-line signal is configured to be fixed at a bit-line pre-charge voltage while said first bit-line signal responds to said stored charges.

119. The 3D sense amplifier of claim 112, wherein:
said second bit-line signal is configured to respond to said stored charges so as to be complementary to said first bit-line signal during said second phase of said memory operation.

120. The 3D sense amplifier of claim 112, further comprising:
a first sense-enable circuit with an input and an output;
a second sense-enable circuit with an input and an output; and wherein:
  said output of said first sense-enable circuit is coupled to said first common node;
  said output of said second sense-enable circuit is coupled to said second common node;
  said first sense-enable circuit is configured to drive said output of said first sense-enable circuit toward or substantially close to a first voltage when said input of said first sense-enable circuit is driven to a first sense-enable level;
  said first sense-enable circuit is configured to drive said output of said first sense-enable circuit toward or substantially close to a second voltage when said input of said first sense-enable circuit is driven to a second sense-enable level;
  said second sense-enable circuit is configured to drive said output of said second sense-enable circuit toward or substantially close to said first voltage when said input of said second sense-enable circuit is driven to said second sense-enable level; and
  said second sense-enable circuit is configured to drive said output of said second sense-enable circuit toward or substantially close to said second voltage when said input of said second sense-enable circuit is driven to said first sense-enable level.

121. The 3D sense amplifier of claim 120, wherein:
said first voltage is a low reference voltage,
said second voltage is a high reference voltage.

122. The 3D sense amplifier of claim 120, wherein:
said first sense-enable level corresponds to logic 1; and
said second sense-enable level corresponds to logic 0.

123. The 3D sense amplifier of claim 120, wherein:
said first sense-enable circuit comprises an n-MOSFET with a gate, a source region, and a drain region;
said second sense-enable circuit comprises an p-MOSFET with a gate, a source region, and a drain region;
said gate of said n-MOSFET of said first sense-enable circuit is coupled to said input of said first sense-enable circuit;
said gate of said p-MOSFET of said second sense-enable circuit is coupled to said input of said second sense-enable circuit;
said source region of said n-MOSFET of said first sense-enable circuit is coupled to a low reference voltage;

said source region of said p-MOSFET of said second sense-enable circuit is coupled to a high reference voltage;

said drain region of said n-MOSFT of said first sense-enable circuit is coupled to said output of said first sense-enable circuit; and said drain region of said p-MOSFT of said second sense-enable circuit is coupled to said output of said second sense-enable circuit.

124. The 3D sense amplifier of claim 112, further comprising:

a first multiplexer with an input, a first output, and a second output;

a second multiplexer with an input, a first output, and a second output; and wherein:

said input of said first multiplexer and said input of said second multiplexer are coupled to a column select;

said first output of said first multiplexer is coupled to said first bit line;

said first output of said second multiplexer is coupled to said second bit line; and said column select is configured to relay said first output of said first multiplexer and said first output of said second multiplexer to said second output of said first multiplexer and said second output of said second multiplexer, respectively.

125. The 3D sense amplifier of claim 124, wherein:

each of said first multiplexer and said second multiplexer comprises an n-MOSFET with a gate, a first doping region, and a second doping region;

said gate of said n-MOSFET of said first multiplexer is coupled to said input of said first multiplexer;

said gate of said n-MOSFET of said second multiplexer is coupled to said input of said second multiplexer;

said first doping region of said n-MOSFET of said first multiplexer is coupled to said first output of said first multiplexer;

said first doping region of said n-MOSFET of said second multiplexer is coupled to said first output of said second multiplexer;

said second doping region of said n-MOSFET of said first multiplexer is coupled to said second output of said first multiplexer; and said second doping region of said n-MOSFET of said second multiplexer is coupled to said second output of said second multiplexer.

126. The 3D sense amplifier of claim 112, further comprising:

an equalizer with an input, a first output, and a second output; wherein:

said input of said equalizer is coupled to a equalization signal;

said first output of said equalizer is coupled to said first bit line;

said second output of said equalizer is coupled to said second bit line; and said equalization signal is configured to turn on said equalizer so that said first bit line and said second bit line are driven to a same voltage before said first bit line and said second bit line are pre-charged.

127. The 3D sense amplifier of claim 126, wherein:

said equalizer comprises an n-MOSFET with a gate, a first doping region, and a second doping region; wherein:

said gate of said n-MOSFET of said equalizer is coupled to said input of said equalizer;

said first doping region of said n-MOSFET of said equalizer is coupled to said first output of said equalizer; and said second doping region of said n-MOSFET of said equalizer is coupled to said second output of said equalizer.

128. The 3D sense amplifier of claim 127, wherein:

said equalizer further comprises:

an internal input; and a p-MOSFET with a gate, a first doping region, and a second doping region; wherein:

said gate of said p-MOSFET of said equalizer is coupled to said second input of said equalizer;

said first doping region of said n-MOSFET of said equalizer is coupled to said first output of said equalizer;

said second doping region of said n-MOSFET of said equalizer is coupled to said second output of said equalizer; and said internal input of said equalizer is coupled to an internal signal complementary to said equalization signal.

129. The 3D sense amplifier of claim 112, further comprising:

a first modified vertical MOSFET with a gate and a top region;

a second modified vertical MOSFET with a gate and a top region;

a first contact;

a second contact; and wherein:

said gate of said first modified vertical MOSFET extends upward to fully cover said top region of said first modified vertical MOSFET such that said top region of said first modified vertical MOSFET is rendered inaccessible;

said gate of said second modified vertical MOSFET extends upward to fully cover said top region of said second modified vertical MOSFET such that said top region of said second modified vertical MOSFET is rendered inaccessible;

said first modified vertical MOSFET is spaced sufficiently close to said first vertical n-MOSFET such that said gate of said first modified vertical MOSFET and said gate of said first vertical n-MOSFET are merged between said first modified vertical MOSFET and said first vertical n-MOSFET;

said second modified vertical MOSFET is spaced sufficiently close to said second vertical n-MOSFET such that said gate of said second modified vertical MOSFET and said gate of said second vertical n-MOSFET are merged between said second modified vertical MOSFET and said second vertical n-MOSFET;

said first contact is disposed on said gate of said first modified vertical MOSFET;

said second bit line is coupled to said first contact;

said second contact is disposed on said gate of said second modified vertical MOSFET; and said first bit line is coupled to said second contact.

130. The 3D sense amplifier of claim 112, further comprising:

a first extended gate region;

a second extended gate region;

a first contact;

a second contact; and wherein:

said first extended gate region is disposed between said first vertical n-MOSFET and said first vertical p-MOSFET, and extends horizontally from a bottom edge of said gate of said first vertical n-MOSFET and from a bottom edge of said gate of said first vertical p-MOSFET;
said first contact is disposed on said first extended gate region;
said second bit line is coupled to said first contact;
said second extended gate region is disposed between said second vertical n-MOSFET and said second vertical p-MOSFET, and extends horizontally from a bottom edge of said gate of said second vertical n-MOSFET and from a bottom edge of said gate of said second vertical p-MOSFET;
said second contact is disposed on said second extended gate region; and
said first bit line is coupled to said second contact.

131. The 3D sense amplifier of claim 112, further comprising:
a first pair of vertical MOSFET's, each with a gate;
a second pair of vertical MOSFET's, each with a gate;
a first contact;
a second contact; and wherein:
said first pair of vertical MOSFET's are disposed between said first vertical n-MOSFET and said first vertical p-MOSFET;
said first vertical n-MOSFET, said first pair of vertical MOSFET's, and said first vertical p-MOSFET are formed along a line and are spaced sufficiently close such that said gate is merged between immediate neighbors;
said first contact is disposed on said gate merged between said first pair of vertical MOSFET's;
said second bit line is coupled to said first contact;
said second pair of vertical MOSFET's are disposed between said second vertical n-MOSFET and said second vertical p-MOSFET;
said second vertical n-MOSFET, said second pair of vertical MOSFET's, and said second vertical p-MOSFET are formed along a line and are spaced sufficiently close such that said gate is merged between immediate neighbors;
said second contact is disposed on said gate merged between said second pair of vertical MOSFET's; and
said first bit line is coupled to said second contact.

132. A 3D memory module, comprising:
3D memory cells;
3D sense amplifiers, each with a first input and a second input;
first bit lines;
second bit lines; and wherein:
said 3D memory cells are arranged regularly in an array;
said array has columns stretching along a bit-line direction and has rows stretching along a word-line direction;
said first bit lines stretch across said 3D memory cells along said bit-line direction;
each of said first bit lines is coupled to said first input of one of said 3D sense amplifiers;
each of said second bit lines is coupled to said second input of one of said 3D sense amplifiers;
said 3D memory cells are coupled to said first bit lines on one-column-per-bit-line basis;
said 3D memory cells on one of said rows are selected, on a one-cell-per-bit-line basis, during a certain phase of a memory operation; and
said first bit lines are configured to respond to charges stored in said selected 3D memory cells during a second phase of said memory operation.

133. The 3D memory module of claim 132, wherein:
said first bit lines form bit-line pairs with said second bit lines on a one-on-one basis; and
said 3D memory module is configured to complementarily develop bit-line signals in each of said bit-line pairs in response to stored charges in said selected 3D memory cells during said second phase of said memory operation.

134. The 3D memory module of claim 133, wherein:
said 3D memory module is configured to complementarily amplify said bit-line signals during a third phase of said memory operation.

135. The 3D memory module of claim 132, wherein:
said first bit lines and said second bit lines are configured to be pre-charged to a bit-line pre-charge voltage during a first phase of said memory operation.

136. The 3D memory module of claim 135, wherein:
said second bit lines are configured to remain or substantially remain at said bit-line pre-charge voltage while said first bit lines respond to said stored charges in said selected 3D memory cells during said second phase of said memory operation.

137. The 3D memory module of claim 136, wherein:
said second bit lines are coupled to none of said 3D memory cells; or
none of said selected 3D memory cells are coupled to said second bit lines.

138. The 3D memory module of claim 132, wherein:
said first bit lines each have a same number of said 3D memory cells coupled respectively to said first bit lines.

139. The 3D memory module of claim 132, wherein:
said 3D memory cells in said columns stand on said first bit lines to which they are coupled.

140. The 3D memory module of claim 132, further comprising:
bit-line multiplexers, each with first inputs, a first output, and a second output; wherein:
said first bit lines are grouped into groups of consecutive bit lines;
said groups of consecutive bit lines are coupled to said bit-line multiplexers on a one-group-per-multiplexer basis;
said first output and said second output of each of said bit-line multiplexers is coupled to said first input and said second input, respectively, of a one of said 3D sense amplifiers on a one-multiplexer-per-amplifier basis;
within each of said bit-line multiplexers, said first bit lines are coupled to said first inputs on a one-bit-line-per-input basis; and
each of said bit-line multiplexers selects one of said first inputs during said memory operation, drives said first output equal to or substantially equal to a first voltage on said selected first input, and drives said second output equal to or substantially equal to a second voltage complementary to said first voltage.

141. The 3D memory module of claim 140, wherein:
each of said bit-line multiplexers comprises first vertical transistors; wherein:
each of said first vertical transistors in each of said bit-line multiplexers comprises a gate, a first region, and a second region;

within each of said bit-line multiplexers, said gate of each of said first vertical transistors is coupled to a bit-line select;

within each of said bit-line multiplexers, said first region of each of said vertical transistors is coupled to one of said first inputs on a one-region-per-input basis; and within each of said bit-line multiplexers, said second region of each of said vertical transistors is coupled to said first output on an all-to-one basis.

142. The 3D memory module of claim 132, further comprises:

bit-line multiplexers, each with first inputs, second inputs, a first output, and a second output; wherein:

said first bit lines and said second bit lines are alternately disposed and form bit-line pairs;

said bit-line pairs are grouped into groups of consecutive bit-line pairs;

said groups of consecutive bit-line pairs are coupled to said bit-line multiplexers on a one-group-per-multiplexer basis;

said first output and said second output of each of said bit-line multiplexers is coupled to said first input and said second input, respectively, of a one of said 3D sense amplifiers on a one-multiplexer-per-amplifier basis;

within each of said bit-line multiplexers, said first bit lines are coupled to said first inputs on a one-bit-line-per-input basis;

within each of said bit-line multiplexers, said second bit lines are coupled to said second inputs on said one-bit-line-per-input basis; and each of said bit-line multiplexers selects one of said bit-line pairs during said memory operation, drives said first output equal to or substantially equal to a first voltage on said first input coupled to said selected bit-line pair, and drives said second output equal to or substantially equal to a second voltage on said second input coupled to said selected bit-line pair.

143. The 3D memory module of claim 142, wherein:

each of said bit-line multiplexers further comprises first vertical transistors and second vertical transistors; wherein:

within each of said bit-line multiplexers, each of said first vertical transistors and said second vertical transistors comprises a gate, a first region, and a second region;

within each of said bit-line multiplexers, said gate of each of said first vertical transistors and said gate of each of said second vertical transistors are coupled as a pair to one of bit-line select signals, on a one-pair-per-signal basis;

within each of said bit-line multiplexers, said first region of each of said first vertical transistors is coupled to one of said first inputs on a one-region-per-input basis;

within each of said bit-line multiplexers, said second region of each of said first vertical transistors is coupled to said first output on an all-to-one basis;

within each of said bit-line multiplexers, said first region of each of said second vertical transistors is coupled to one of said second inputs on said one-region-per-input basis; and within each of said bit-line multiplexers, said second region of each of said second vertical transistors is coupled to said second output on said all-to-one basis.

144. The 3D memory module of claim 132, wherein:

each of said first bit lines are coupled to one of said 3D sense amplifiers on a one-bit-line-per-amplifier basis;

said 3D sense amplifiers are divided into sets of consecutive sense amplifiers, each set consisting of a same number of said 3D sense amplifiers;

said same number is at least two; and each of said 3D sense amplifiers is sufficiently wide so as to span a space for said same number of consecutive bit lines.

145. The 3D memory module of claim 144, further comprising:

an interconnect line disposed at a level below said 3D memory cells; wherein:

for each of said sets of consecutive sense amplifiers, at least one of said first bit lines is coupled to said one of said 3D sense amplifiers by said interconnect line.

146. The 3D memory module of claim 144, further comprising:

a metal line disposed at a level above said 3D memory cells; wherein:

for each of said sets of consecutive sense amplifiers, at least one of said first bit lines is coupled to said one of said 3D sense amplifiers by said metal line.

147. The 3D memory module of claim 144, wherein:

for each of said sets of consecutive sense amplifiers, at least one of said first bit lines extends to said one of said 3D sense amplifiers.

148. The 3D memory module of claim 144, wherein:

said 3D sense amplifiers in each of said sets of consecutive sense amplifiers are staggered on one side of said array in said bit-line direction.

149. The 3D memory module of claim 144, wherein:

said same number of sense amplifiers in each of said sets of sense amplifiers are placed at both sides of said array in said bit-line direction.

150. The 3D memory module of claim 132, wherein:

each of said 3D sense amplifiers further comprises a sense-enable circuit with an input and an output;

said sense-enable circuit in each of said 3D sense amplifiers comprises a vertical n-MOSFET with a gate, a source region, and a drain region;

within each of said 3D sense amplifiers, said gate of said vertical n-MOSFET of said sense-enable circuit is coupled to said input of said sense-enable circuit;

within each of said 3D sense amplifiers, said source region of said vertical n-MOSFET of said sense-enable circuit is coupled to a first reference voltage;

within each of said 3D sense amplifiers, said drain region of said vertical n-MOSFET of said sense-enable circuit is coupled to said output of said sense-enable circuit;

within each of said 3D sense amplifiers, said sense-enable circuit is configured to drive said output of said sense-enable circuit to a first level when said input of said sense-enable circuit is driven to a sense-enable level; and within each of said 3D sense amplifiers, said sense-enable circuit is configured to drive said output of said sense-enable circuit to a second level when said input of said sense-enable circuit is driven to a sense-disable level.

151. The 3D memory module of claim 150, wherein:

said first level is equal to or substantially equal to a low reference voltage; and said second level is equal to or substantially equal to a high reference voltage.

152. The 3D memory module of claim 150, further comprising:
a bit-line decoder; wherein:
within each of said 3D sense amplifiers, said input of said sense-enable circuit is configured to be driven to said sense-enable level only when a corresponding bit line is selected by said bit-line decoder; and
within each of said 3D sense amplifiers, said input of said sense-enable circuit is configured to be driven to said sense-disable level unless said corresponding bit line is selected by said bit-line decoder.

153. The 3D memory module of claim 132, wherein:
said 3D memory cells are DRAM cells.

154. The 3D memory module of claim 132, wherein:
said 3D memory cells are flash cells.

\* \* \* \* \*